(12) United States Patent
Kim et al.

(10) Patent No.: US 8,859,363 B2
(45) Date of Patent: Oct. 14, 2014

(54) SEMICONDUCTOR DEVICES INCLUDING VERTICAL CHANNEL TRANSISTORS AND METHODS OF FABRICATING THE SAME

(75) Inventors: Daeik Kim, Hwaseong-si (KR);
HyeongSun Hong, Seongnam-si (KR);
Yongchul Oh, Suwon-si (KR); Yoosang Hwang, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 85 days.

(21) Appl. No.: 13/291,457

(22) Filed: Nov. 8, 2011

(65) Prior Publication Data

US 2012/0156844 A1    Jun. 21, 2012

(30) Foreign Application Priority Data

Dec. 20, 2010  (KR) .................. 10-2010-0130810

(51) Int. Cl.
*H01L 21/336* (2006.01)
*H01L 27/108* (2006.01)

(52) U.S. Cl.
CPC .... *H01L 27/10876* (2013.01); *H01L 27/10823* (2013.01); *H01L 27/10891* (2013.01)
USPC ............ 438/248; 438/270; 438/284; 438/596

(58) Field of Classification Search
CPC ................ H01L 29/78; H01L 21/8242; H01L 27/10823; H01L 27/10876; H01L 27/10891
USPC .................. 438/197, 244, 268, 270, 283, 290
See application file for complete search history.

(56) References Cited

U.S. PATENT DOCUMENTS

| | | | |
|---|---|---|---|
| 8,399,920 B2* | 3/2013 | Juengling .................... | 257/330 |
| 2007/0051994 A1* | 3/2007 | Song et al. .................... | 257/296 |
| 2008/0150012 A1* | 6/2008 | Thies et al. .................... | 257/329 |
| 2010/0237405 A1* | 9/2010 | Shin .............................. | 257/329 |
| 2012/0040505 A1* | 2/2012 | Krumrey et al. .............. | 438/270 |

FOREIGN PATENT DOCUMENTS

| KR | 10-0675285 B1 | 1/2007 |
|---|---|---|
| KR | 2009-0074530 A | 7/2009 |
| KR | 2009-0121107 A | 11/2009 |

* cited by examiner

*Primary Examiner* — Khiem D Nguyen
*Assistant Examiner* — Wilner Jean Baptiste
(74) *Attorney, Agent, or Firm* — Harness, Dickey & Pierce, P.L.C.

(57) ABSTRACT

Methods of fabricating semiconductor devices may include forming first trenches in a substrate to define fin patterns and forming buried dielectric patterns filling lower regions of the first trenches. The first trenches extend in parallel. A gate dielectric layer is formed on upper inner sidewalls of the first trenches, and a gate conductive layer filling the first trenches is formed on the substrate including the gate dielectric layer. The gate conductive layer, the gate dielectric layer and the fin patterns are patterned to form second trenches crossing the first trenches and defining active pillars. Semiconductor devices may also be provided.

18 Claims, 47 Drawing Sheets

SEMICONDUCTOR DEVICES INCLUDING VERTICAL CHANNEL TRANSISTORS AND METHODS OF FABRICATING THE SAME

CROSS-REFERENCE TO RELATED APPLICATION

This U.S. non-provisional patent application claims priority under 35 U.S.C. §119 to Korean Patent Application No. 10-2010-0130810, filed on Dec. 20, 2010, in the Korean Intellectual Property Office (KIPO), the entire contents of which is incorporated herein by reference.

BACKGROUND

1. Field

Example embodiments relate to semiconductor devices and methods of fabricating the same and, more particularly, to semiconductor devices including vertical transistors and methods of fabricating the same.

2. Description of Related Art

Semiconductor devices are very attractive in the electronic industry because of the relatively small size, multi-functional characteristics and/or low fabrication cost thereof. As the electronic industry becomes highly integrated, semiconductor devices have been more and more highly integrated. The line widths of the semiconductor devices have been gradually reduced to increase the integration density of the semiconductor devices. However, there may be some limitations in increasing the integration density of the semiconductor devices because new exposure techniques and/or high cost for the new exposure techniques are required in reduction of the line widths.

Transistors with a vertical channel have been proposed to increase the integration density of semiconductor devices. In the event that the transistors have a vertical channel, the source and drain of the respective transistors may be vertically stacked. Thus, planar areas that the transistors occupy may be reduced.

SUMMARY

Example embodiments of the inventive concepts include semiconductor devices with vertical transistors and methods of fabricating the same.

According to example embodiments, a method of fabricating a semiconductor device includes forming first trenches in a substrate to define fin patterns and forming buried dielectric patterns filling lower regions of the first trenches. The first trenches in parallel extend in a direction. A gate dielectric layer is formed on upper inner sidewalls of the first trenches. A gate conductive layer filling the first trenches is formed on the substrate having the gate dielectric layer. The gate conductive layer, the gate dielectric layer and the fin patterns are patterned to form second trenches crossing the first trenches and defining active pillars.

According to some example embodiments, the buried dielectric patterns may be formed using an oxidation process. Formation of the first trenches and the buried dielectric patterns may include forming upper trenches in the substrate, forming sacrificial spacers on inner sidewalls of the upper trenches, etching the substrate under the upper trenches using the sacrificial spacers as etching masks to form lower trenches, and applying an oxidation process to the substrate having the lower trenches to form the buried dielectric patterns. The sacrificial spacers may be removed after formation of the buried dielectric patterns, and the gate dielectric layer may be formed after removal of the sacrificial spacers. Alternatively, the sacrificial spacers may be removed prior to formation of the buried dielectric patterns, and the gate dielectric layer and the buried dielectric patterns may be simultaneously formed.

According to other example embodiments, formation of the first trenches and the buried dielectric patterns may include forming the first trenches in the substrate, depositing a dielectric layer filling the first trenches on the substrate including the first trenches, and etching the dielectric layer to form the buried dielectric patterns.

According to yet other example embodiments, the method may further include forming plug dielectric patterns in portions of the substrate under the second trenches, etching the substrate, the buried dielectric patterns and the plug dielectric patterns located under the second trenches to form interconnection trenches, forming lower dopant regions in lower portions of the active pillars, and forming buried interconnections in the interconnection trenches. Each of the lower dopant regions may be electrically connected to one of the pair of buried interconnections disposed at both sides of the lower dopant region. The method may further include forming separation dopant regions in the substrate located under the interconnection trenches.

The separation dopant regions may be simultaneously formed with the lower dopant regions, and each of the separation dopant regions may be connected to the pair of lower dopant regions located at both sides of each of the separation dopant regions. During formation of the second trenches, preliminary gate patterns filing the first trenches may be formed between the second trenches. In this case, the method may further include removing the preliminary gate patterns in ones selected from the first trenches to form gate patterns separated from each other, and forming word lines extending in the predetermined direction.

The gate patterns may fill non-selected ones of the first trenches, respectively. Each of the word lines may be electrically connected to the gate patterns which are arrayed in one row parallel to the predetermined direction. The method may further include forming upper dopant regions in upper portions of the active pillars, respectively, and forming data storage elements electrically connected to the upper dopant regions. The upper dopant regions may be upwardly spaced apart from the lower dopant regions.

According to still other example embodiments, a semiconductor device includes an active pillar upwardly protruding from a substrate, a lower dopant region and an upper dopant region disposed in the pillar, a gate electrode disposed on one sidewall of the active pillar, and a gate dielectric layer between the one sidewall of the active pillar and the gate electrode. The lower dopant region and the upper dopant region are vertically separated from each other. The lower dopant region is spaced apart from another sidewall of the active pillar.

According to some example embodiments, the semiconductor device may further include a buried interconnection electrically connected to the lower dopant region. A top surface of the buried interconnection may be located at a lower level than a top surface of the lower dopant region. The semiconductor device may further include a separation dopant region formed in the substrate under the buried interconnection. The separation dopant region may be doped with dopants having the same conductivity type as the lower dopant region. The separation dopant region may be connected to the lower dopant region.

According to other example embodiments, the semiconductor device may further include a void disposed in the gate electrode and a void-filling dielectric pattern filling at least a portion of the void. According to yet other example embodiments, the semiconductor device may further include a buried dielectric pattern disposed under the gate electrode. The buried dielectric pattern may include an oxide material formed by an oxidation process.

According to at least one embodiment, a method of fabricating a semiconductor device includes forming at least one fin pattern by forming a plurality of first trenches extending in parallel in a substrate, forming a plurality of buried dielectric patterns filling lower regions of the first trenches, forming a gate dielectric layer on upper sidewalls inside the first trenches, forming a gate conductive layer filling the first trenches on the substrate after the forming a gate dielectric layer, and forming a plurality of active pillars by patterning the gate conductive layer, the gate dielectric layer and the fin pattern to form second trenches crossing the first trenches.

According to at least one example embodiment, a semiconductor device includes an active pillar protruding from a substrate, a lower dopant region and an upper dopant region in the pillar, the lower dopant region vertically separated from the upper dopant region and separated from a first sidewall of the active pillar, a gate electrode on a second sidewall of the active pillar, and a gate dielectric layer between the second sidewall and the gate electrode.

According to at least one embodiment, a method of fabricating a semiconductor device includes forming a semiconductor fin in a substrate layer, forming a gate dielectric layer on the semiconductor fin, forming a gate conductive layer on the gate dielectric layer, forming a plurality of active pillars by removing a portion of the semiconductor fin, the gate dielectric layer and the gate conductive layer, and forming source and drain regions in the active pillars.

BRIEF DESCRIPTION OF THE DRAWINGS

Example embodiments will be more clearly understood from the following brief description taken in conjunction with the accompanying drawings. FIGS. 1-25 represent non-limiting, example embodiments as described herein.

FIG. 1 is a schematic circuit diagram illustrating vertical transistors of semiconductor devices according to example embodiments of the inventive concepts;

FIGS. 2A-14B include perspective diagrams and cross-sectional views illustrating methods of fabricating semiconductor devices according to example embodiments of the inventive concepts;

FIGS. 16A-18B include perspective diagrams and cross-sectional views illustrating methods of fabricating semiconductor devices according to other example embodiments of the inventive concepts;

FIGS. 20A-22B include perspective diagrams and cross-sectional views illustrating methods of fabricating semiconductor devices according to yet still other example embodiments of the inventive concepts;

FIG. 24 is a schematic block diagram illustrating electronic products including semiconductor devices according to example embodiments of the inventive concepts; and FIG. 25 is a schematic block diagram illustrating memory systems including semiconductor devices according to example embodiments of the inventive concepts.

Figure 1:
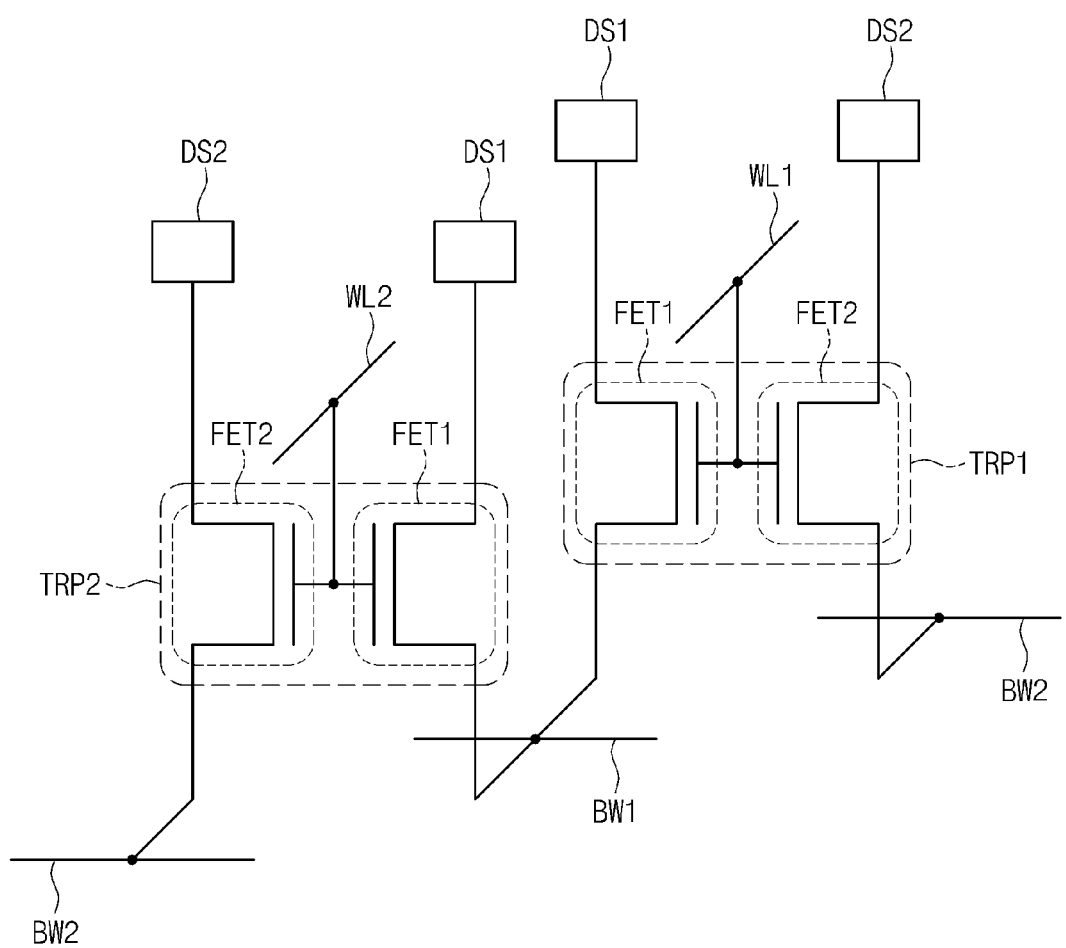

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic circuit diagram illustrating vertical transistors of semiconductor devices according to example embodiments of the inventive concepts. Referring to FIG. 1, semiconductor devices according to example embodiments may include a plurality of transistor-pairs. For example, the respective semiconductor devices may include a first transistor-pair TRP1 and a second transistor-pair TRP2. Each of the first and second transistor-pairs TRP1 and TRP2 may include a first vertical channel transistor FET1 and a second vertical channel transistor FET2. Gate electrodes of the first and second vertical channel transistors FET1 and FET2 of the first transistor-pair TRP1 may be electrically connected to a first word line WL1. The first and second vertical channel transistors FET1 and FET2 of the first transistor-pair TRP1 may share the first word line WL1. Gate electrodes of the first and second vertical channel transistors FET1 and FET2 of the second transistor-pair TRP2 may share a second word line WL2. The first and second word lines WL1 and WL2 may be independently controlled.

First source/drain terminals of the first vertical channel transistors FET1 may be electrically connected to a first buried wiring BW1, and first source/drain terminals of the second vertical channel transistors FET2 may be electrically connected to a second buried wiring BW2. The first and second buried wirings BW1 and BW2 may be independently controlled. The word lines WL1 and WL2 may cross the buried wirings BW1 and BW2. The first source/drain terminal of the first vertical channel transistor FET1 in the first transistor-pair TRP1 may share the first buried wiring BW1 with the first source/drain terminal of the first vertical channel transistor FET1 in the second transistor-pair TRP2 adjacent to the first transistor-pair TRP1.

The first source/drain terminal of the second vertical channel transistor FET2 in the first transistor-pair TRP1 may share the second buried wiring BW2 with a first source/drain terminal of a second vertical channel transistor FET2 in a third transistor-pair (not shown) adjacent to the first transistor-pair TRP1. According to at least one example embodiment, the first and second buried wirings BW1 and BW2 may correspond to bit lines. The first and second vertical channel transistors FET1 and FET2 in each of the transistor-pairs TRP1 and TRP2 may share a single word line WL1 or WL2 and may be electrically connected to a pair of buried wirings BW1 and BW2, respectively. The adjacent two transistor-pairs TRP1 and TRP2 may share one of the buried wirings BW1 and BW2.

According to at least one example embodiment, first data storage elements DS1 may be electrically connected to second source/drain terminals of the first vertical channel transistors FET1, respectively. Second data storage elements DS2 may be electrically connected to second source/drain terminals of the second vertical channel transistors FET2, respectively. One of the first vertical channel transistors FET1 and the first data storage element DS1 connected thereto may constitute a unit memory cell. One of the second vertical channel transistors FET2 and the second data storage element DS2 connected thereto may constitute another unit memory cell.

Each of the first and second vertical channel transistors FET1 and FET2 may be used as a switching device of the respective unit memory cells. Each of the first and second transistor-pairs TRP1 and TRP2 and the first and second data storage elements DS1 and DS2 connected thereto may constitute a pair of unit memory cells. The data storage elements DS1 and DS2 may be realized in various forms. For example, each of the data storage elements DS1 and DS2 may include a capacitor, a magnetic tunnel junction (MTJ) pattern and/or a variable resistor.

The semiconductor devices according to example embodiments may include a volatile memory device and/or a non-volatile memory device. The semiconductor devices according to example embodiments may include a dynamic random access memory (DRAM) device, a static random access memory (SRAM) device, a magnetic random access memory (MRAM) device, a phase changeable random access memory (PRAM) device and/or a resistive random access memory (RRAM) device. However, the data storage elements DS1 and DS2 are not limited to the above memory devices. The data storage elements DS1 and DS2 may be realized in many different forms.

Figure 2A:
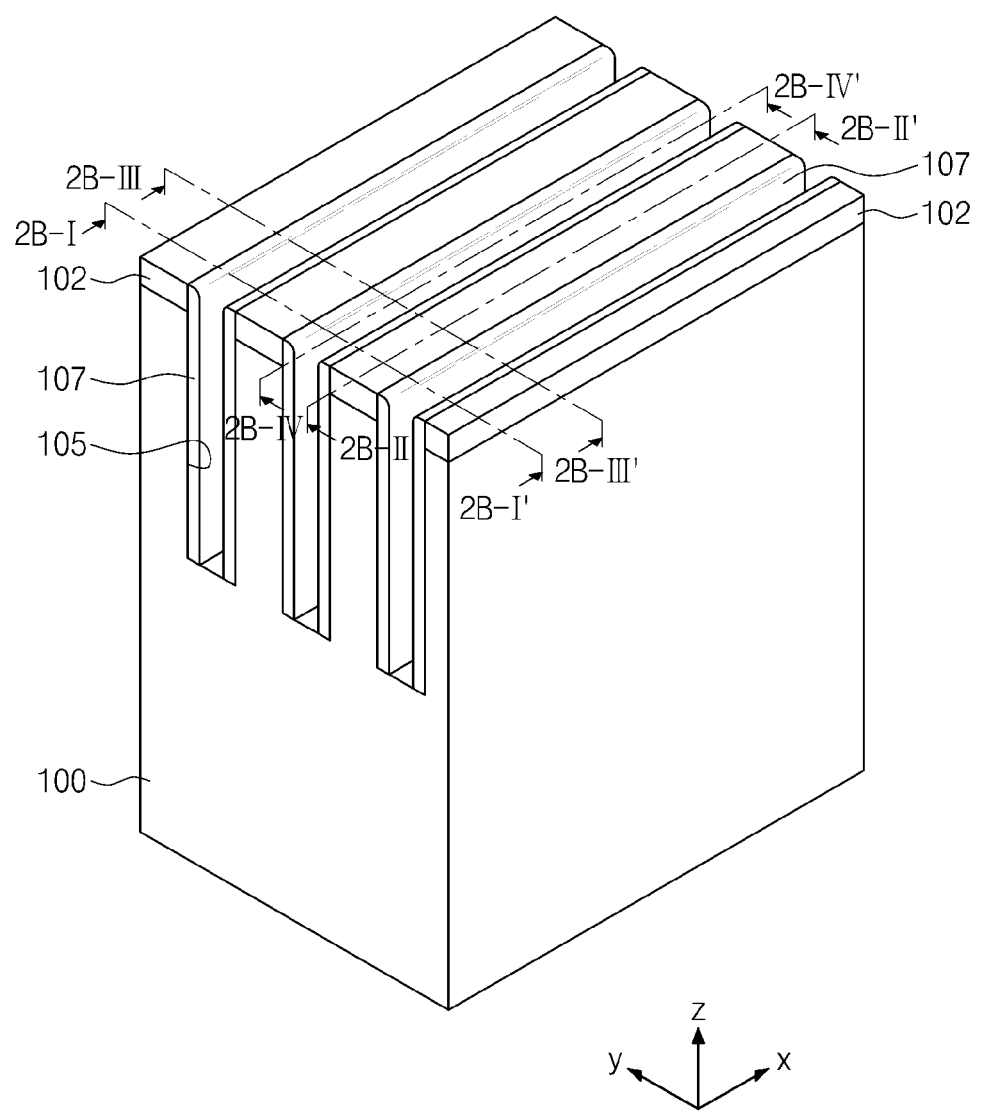
Figure 2B:
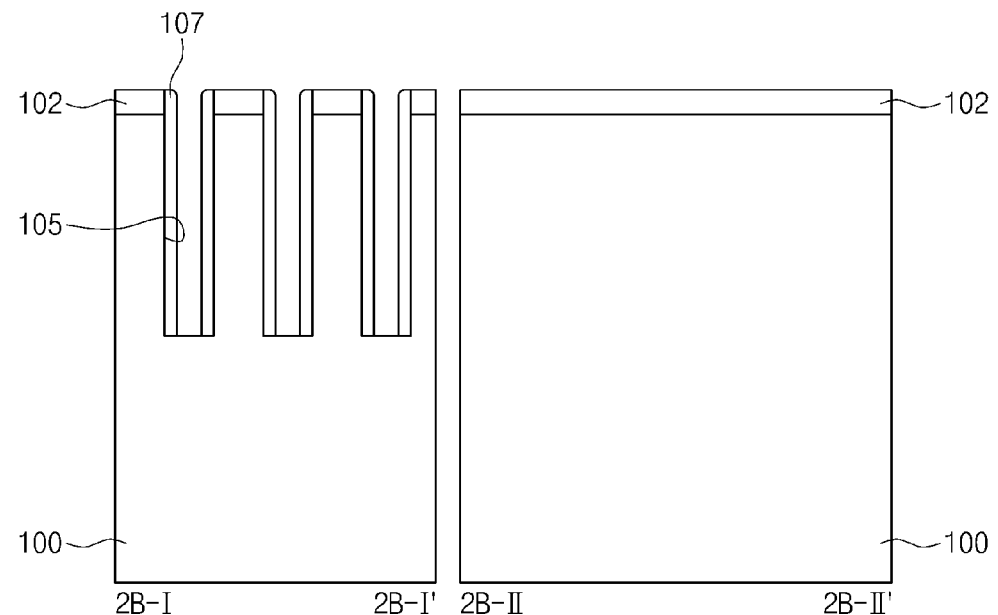
Figure 2B:
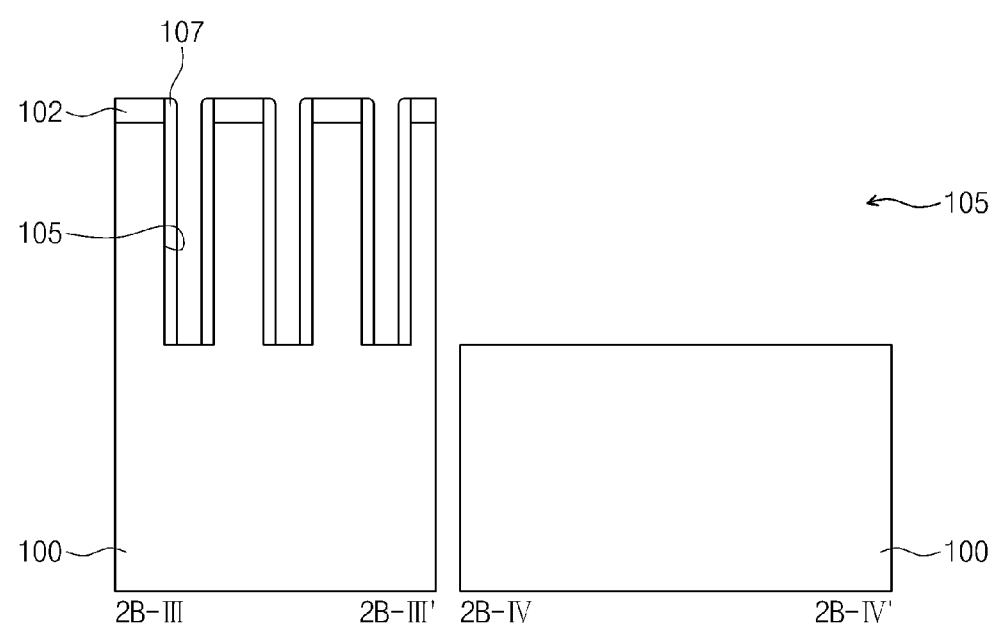

FIGS. 2A, 3A, 4A, 5A, 6A, 7A, 8A, 9A, 10A, 11A, 12A, 13A and 14A are perspective diagrams illustrating methods of fabricating semiconductor devices according to example embodiments of the inventive concepts. FIGS. 2B, 3B, 4B, 5B, 6B, 7B, 8B, 9B, 10B, 11B, 12B, 13B and 14B include cross-sectional views of FIGS. 2A, 3A, 4A, 5A, 6A, 7A, 8A, 9A, 10A, 11A, 12A, 13A and 14A, respectively. Referring to FIGS. 2A and 2B, hard mask patterns 102 may be formed on a substrate 100 (e.g., a semiconductor substrate). The hard mask patterns 102 may be in parallel and extend in a first direction. The hard mask patterns 102 may be separated from each other in a second direction perpendicular to the first direction. The first and second directions may be parallel with a top surface of the substrate 100. For example, the first direction may correspond to an x-axis direction (e.g., a direction parallel to an x-axis) in FIG. 2A, and the second direction may correspond to a y-axis direction (e.g., a direction parallel to a y-axis) in FIG. 2A. Each of the hard mask patterns 102 may include, for example, an oxide material, a nitride material and/or an oxynitride material. Each of the hard mask patterns 102 may be formed of a single-layered material or a multi-layered material. According to at least one example embodiment, the hard mask patterns 102 may include an oxide material.

The substrate 100 may be etched using the hard mask patterns 102 as etch masks. Upper trenches 105 may be formed in the substrate 100. The upper trenches 105 may extend in the first direction. A sacrificial spacer layer (not shown) may be conformally formed on the substrate with the upper trenches 105. The sacrificial spacer layer may be etched back until bottom surfaces of the upper trenches 105 are exposed, and may form sacrificial spacers 107 on both inner sidewalls of the upper trenches 105. The sacrificial spacer layer may be formed of a single-layered material or a multi-layered material. For example, the sacrificial spacer layer may include an oxide material, a nitride material and/or an oxynitride material. According to at least one example embodiment, the sacrificial spacer layer may include an oxide layer and a nitride layer which are sequentially stacked. Each of the sacrificial spacers 107 may be formed of a double-layered material layer.

Figure 3A:
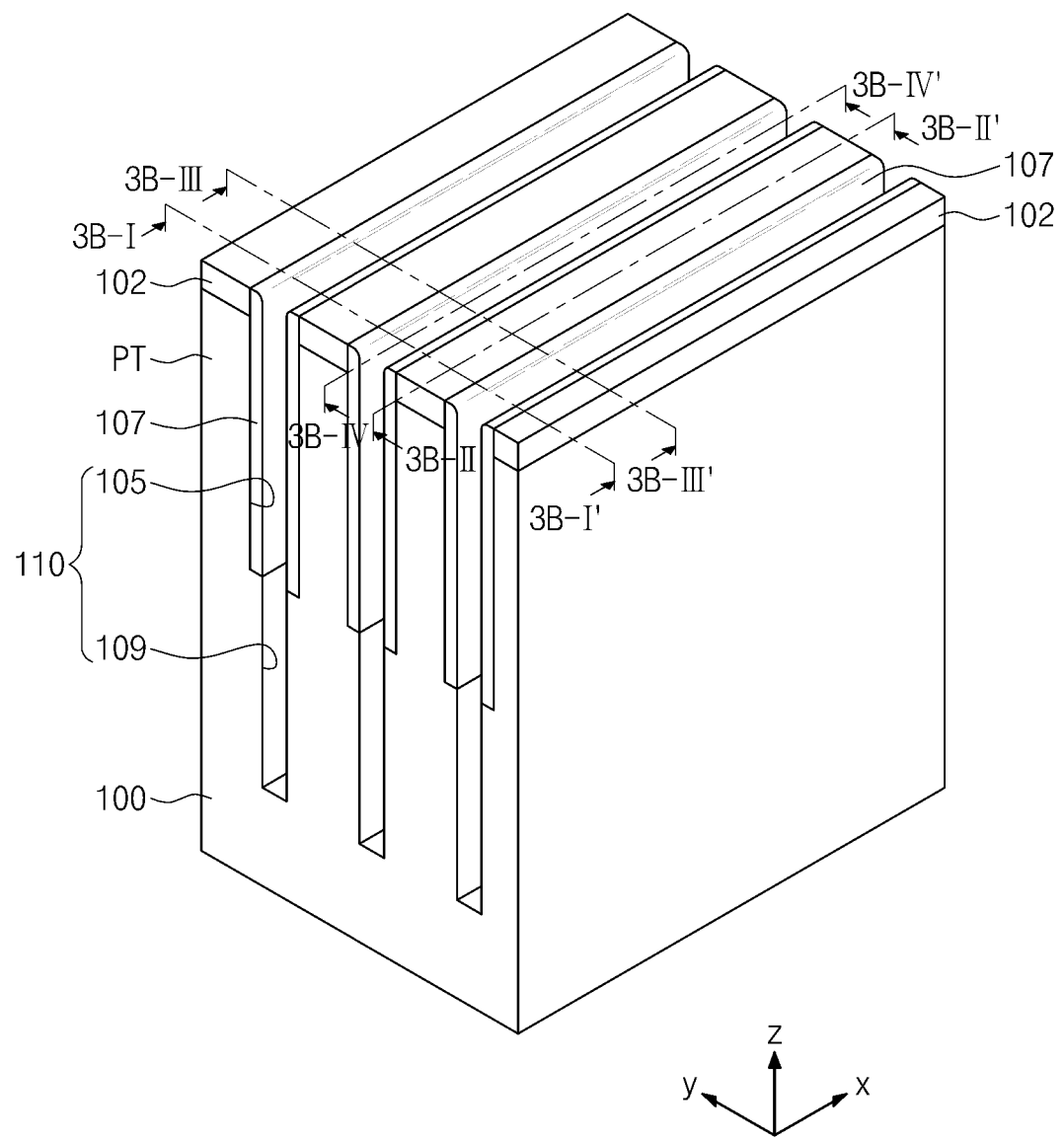
Figure 3B:
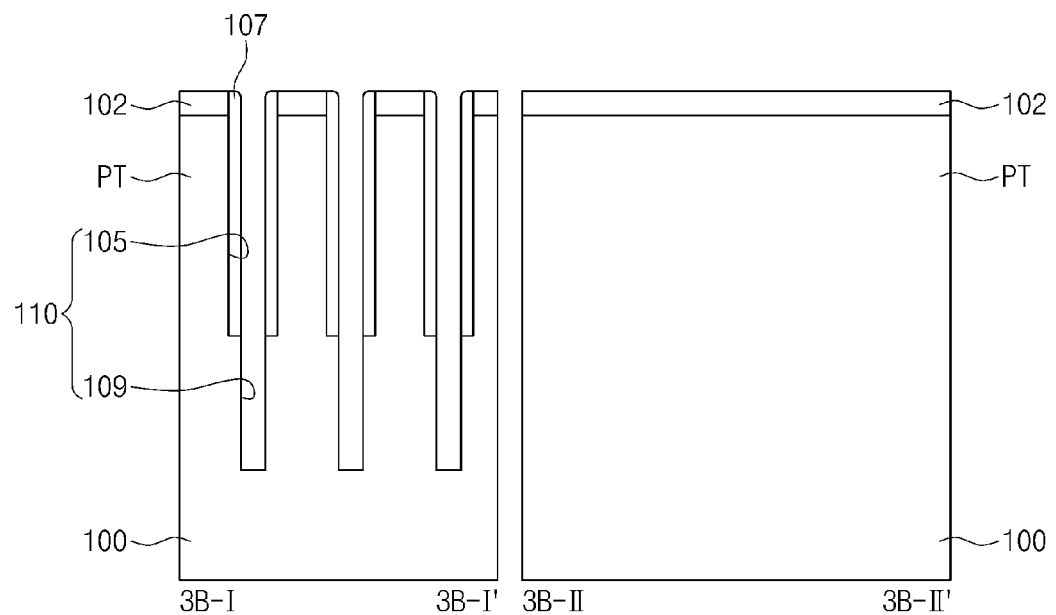
Figure 3B:
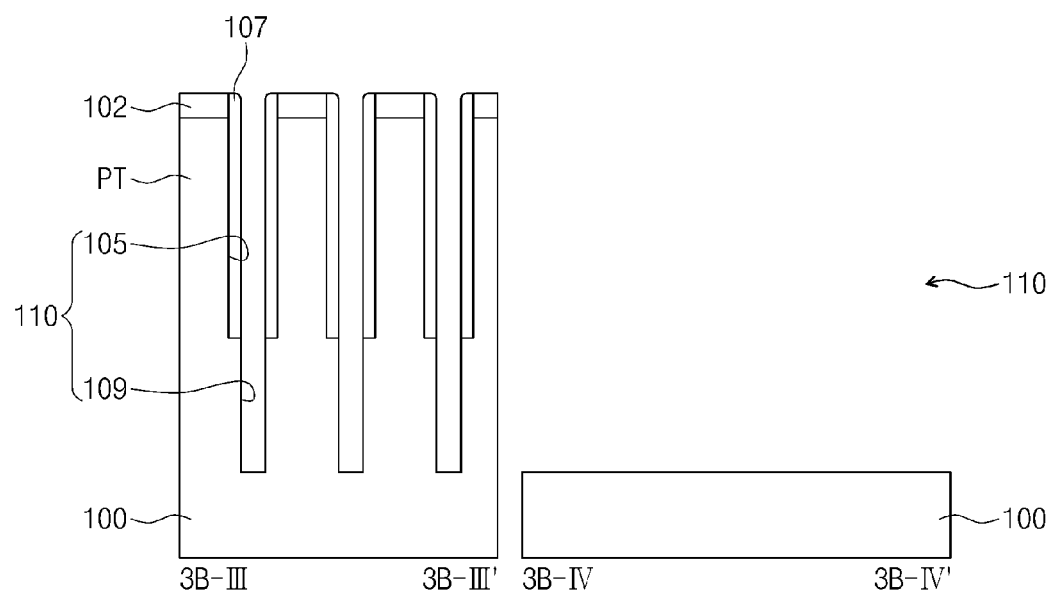

Referring to FIGS. 3A and 3B, the substrate 100 under the upper trenches 105 may be etched using the hard mask patterns 102 and the sacrificial spacers 107 as etch masks, forming lower trenches 109 under the upper trenches 105. One of the lower trenches 109 and the upper trench 105 thereon may constitute a first trench 110. The first trenches 110 may define fin patterns PT. Each of the fin patterns PT may correspond to a portion of the substrate 100, which is located between adjacent two first trenches 110. The fin patterns PT may also extend in the first direction. The fin patterns PT may be separated from each other in the second direction.

Figure 4A:
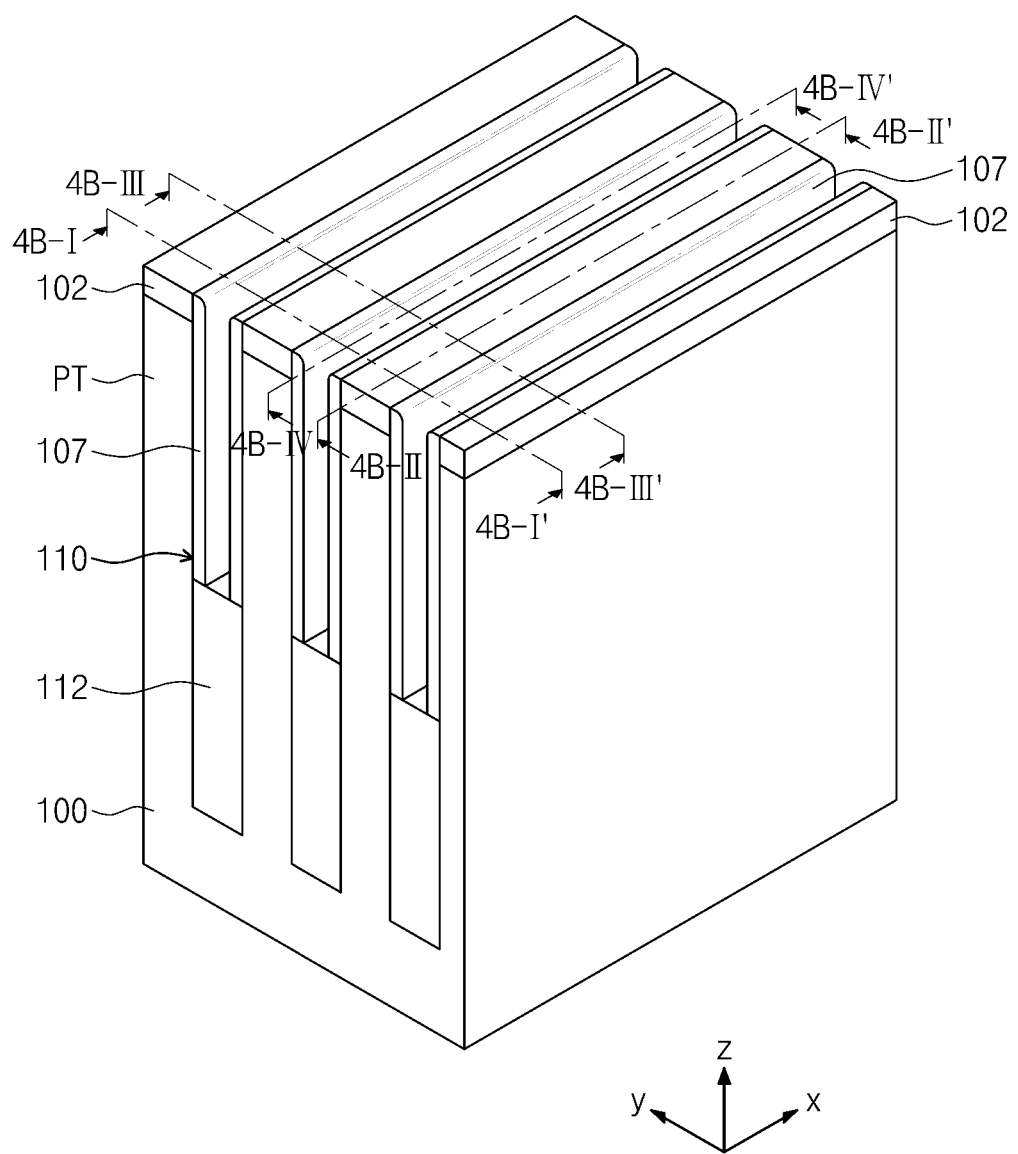
Figure 4B:
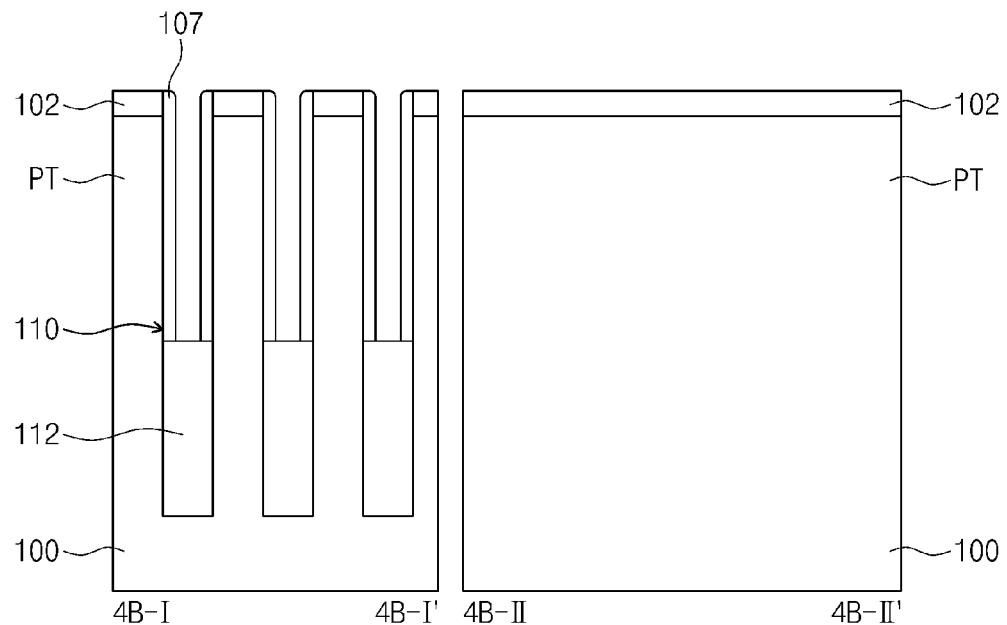
Figure 4B:
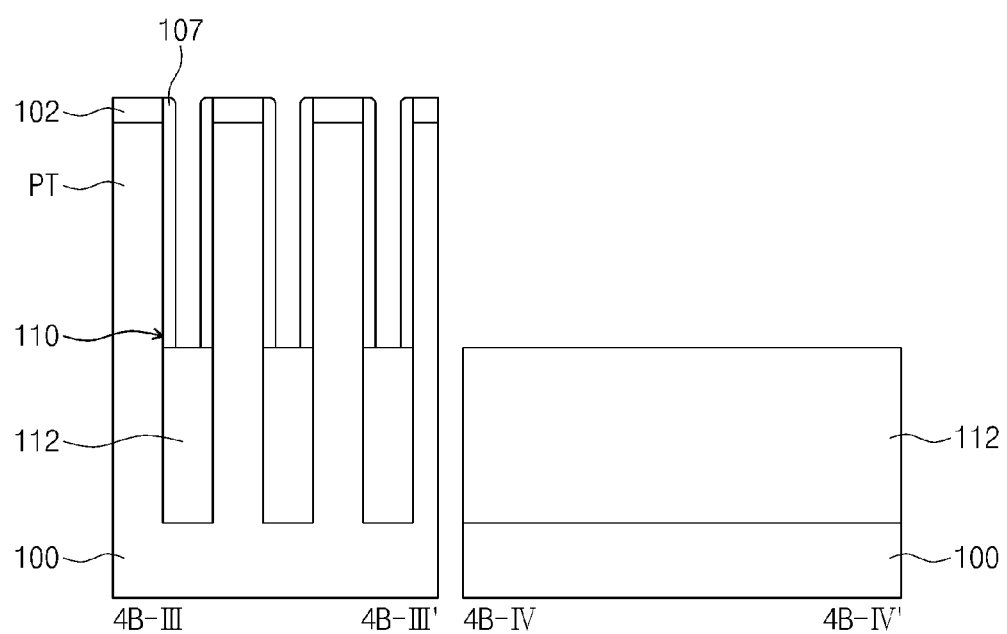

Referring to FIGS. 4A and 4B, a plurality of buried dielectric patterns 112 may be formed in lower regions of the first trenches 110, respectively. For example, a first oxidation process may be applied to the substrate inside the first trenches 110, thereby forming the buried dielectric patterns 112. According to at least one example embodiment, the first oxidation process may be applied to the substrate including the sacrificial spacers 107. Upper inner sidewalls of the first trenches 110 (e.g., sidewalls defining the first trenches 110) may not be further oxidized, as illustrated in FIGS. 4A and 4B. This may be because the upper inner sidewalls of the first trenches 110 may be covered with the sacrificial spacers 107. The buried dielectric patterns 112 may be formed to with a confined shape in the lower regions of the first trenches 110. The first oxidation process may include a thermal oxidation process, a plasma oxidation process, a thermal/plasma oxidation process and/or a radical oxidation process.

Figure 5A:
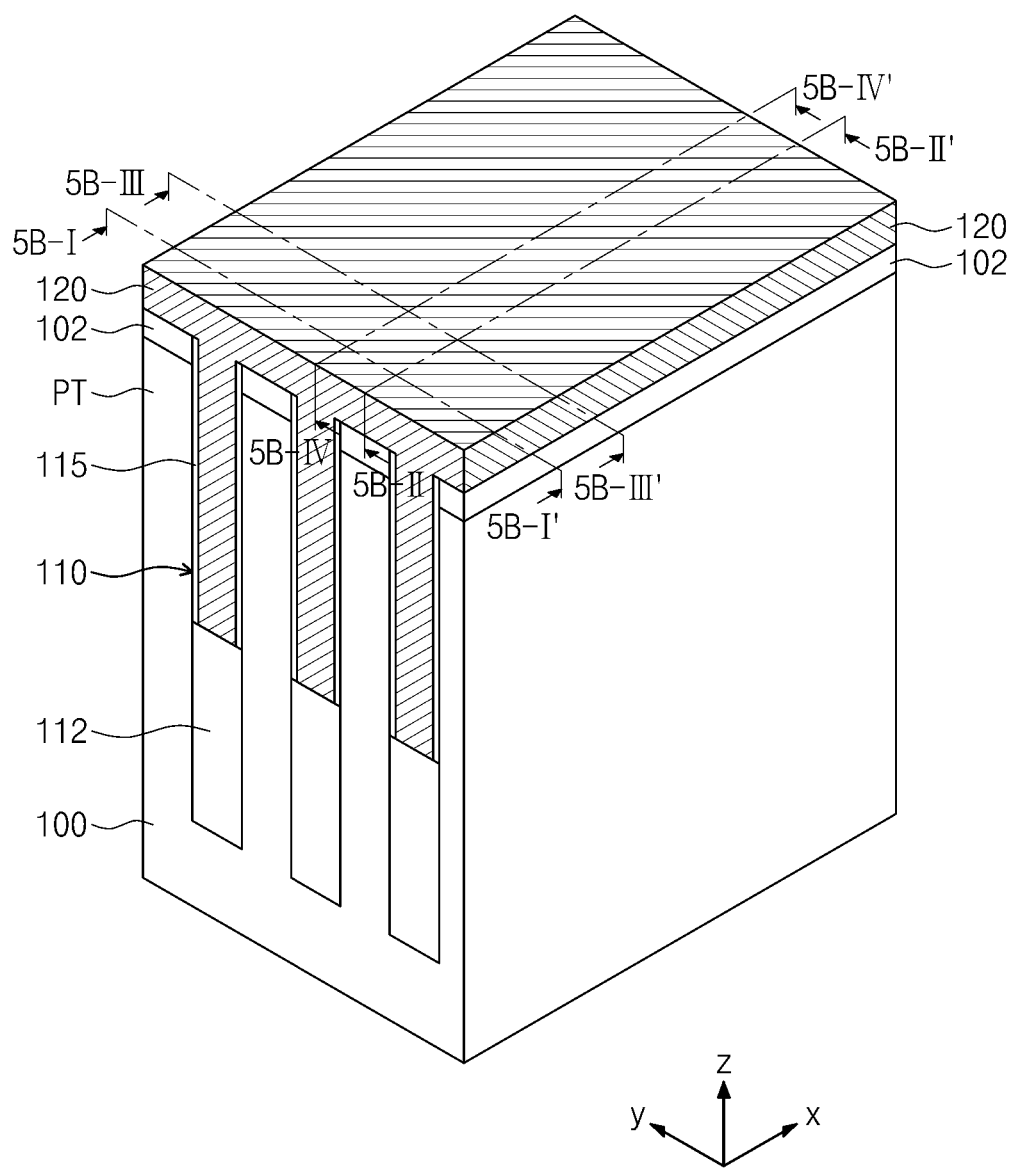
Figure 5B:
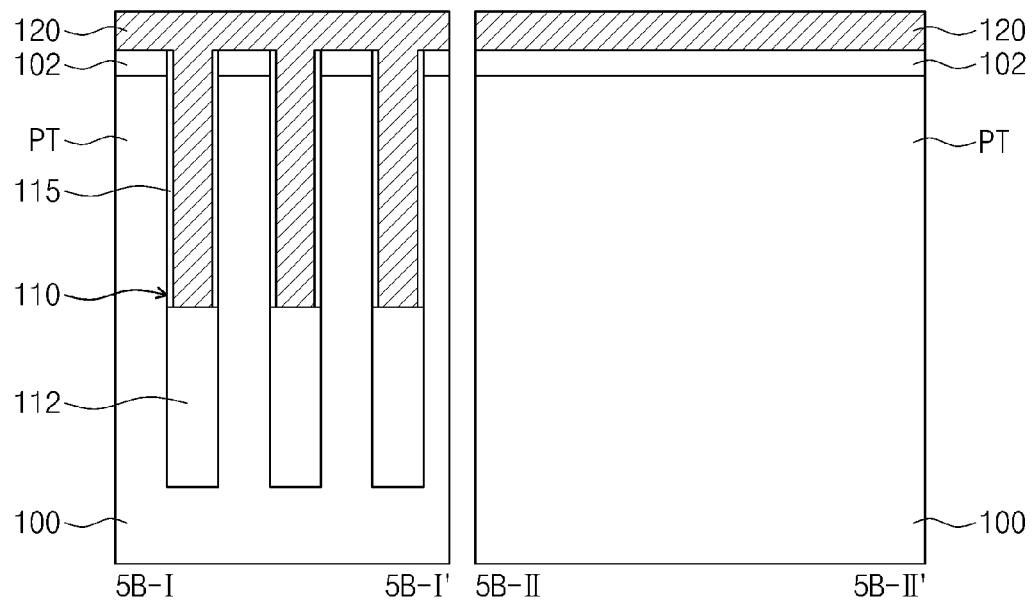
Figure 5B:
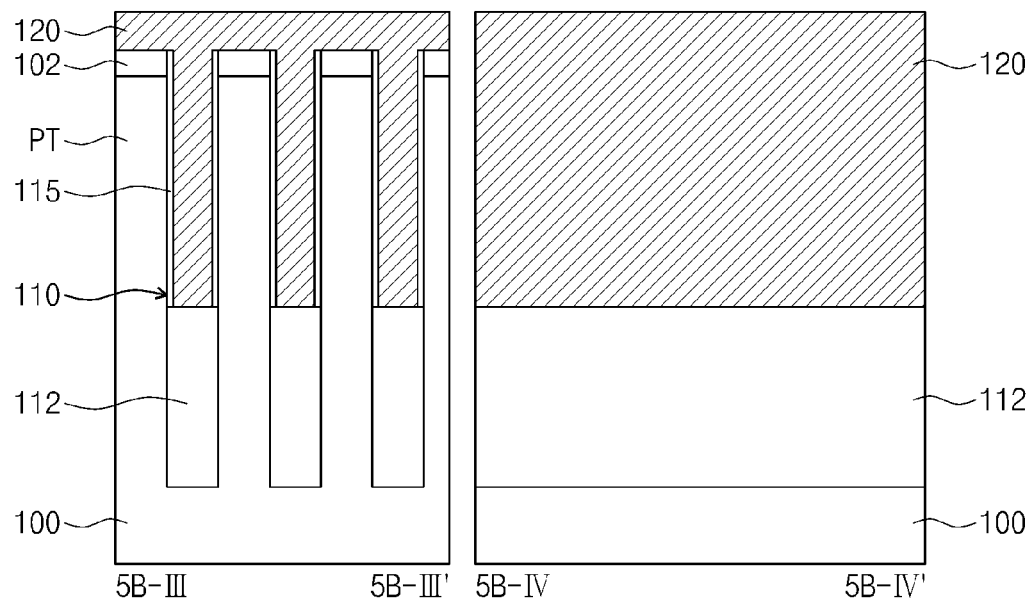

Referring to FIGS. 5A and 5B, the sacrificial spacers 107 may be removed after formation of the buried dielectric patterns 112. The upper inner sidewalls of the first trenches 110 may be exposed. A gate dielectric layer 115 may be formed on the upper inner sidewalls of the first trenches 110. The gate dielectric layer 115 may be formed using a thermal oxidation technique. However, a method of forming the gate dielectric layer 115 is not limited to the thermal oxidation technique. The gate dielectric layer 115 may be formed using, for example, a chemical vapor deposition (CVD) technique and/or an atomic layer deposition (ALD) technique. The gate dielectric layer 115 may be formed of a single-layered material or a multi-layered material.

A gate conductive layer 120 may be formed on the substrate including the gate dielectric layer 115. The gate conductive layer 120 may fill the first trenches 110 on the buried dielectric patterns 112. According to at least one example embodiment, the gate conductive layer 120 may include a doped semiconductor layer. For example, the gate conductive layer 120 may be a doped silicon layer, a doped germanium layer and/or a doped silicon-germanium layer. However, the gate conductive layer 120 is not limited to the above doped semiconductor layers. For example, the gate conductive layer 120 may include at least one of a conductive metal nitride layer (e.g., a titanium nitride layer, a tantalum nitride layer and/or the like), a transition metal layer (e.g., a titanium layer, a tantalum layer and/or the like) and a metal layer (e.g., a tungsten layer and/or the like).

Figure 6A:
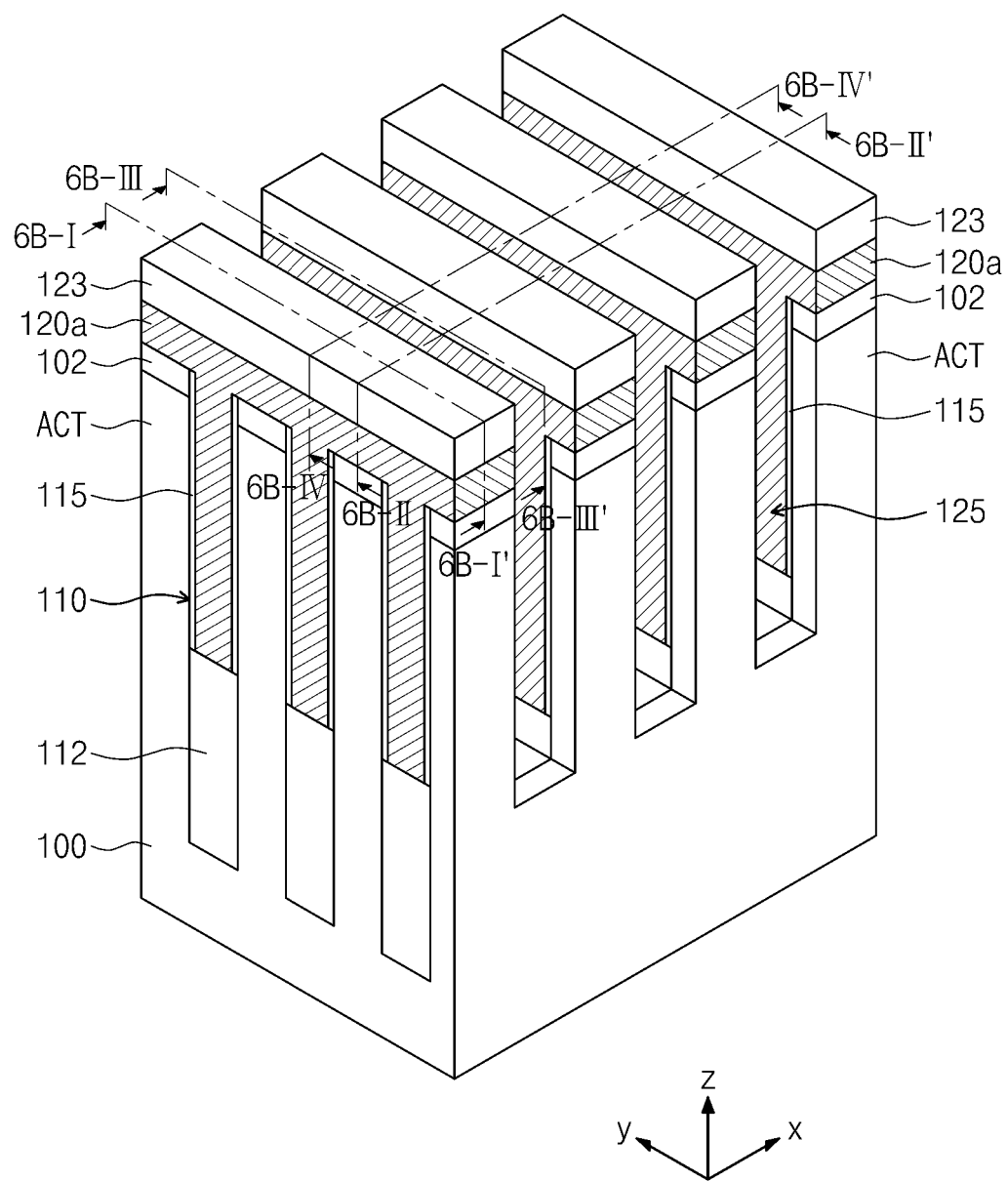
Figure 6B:
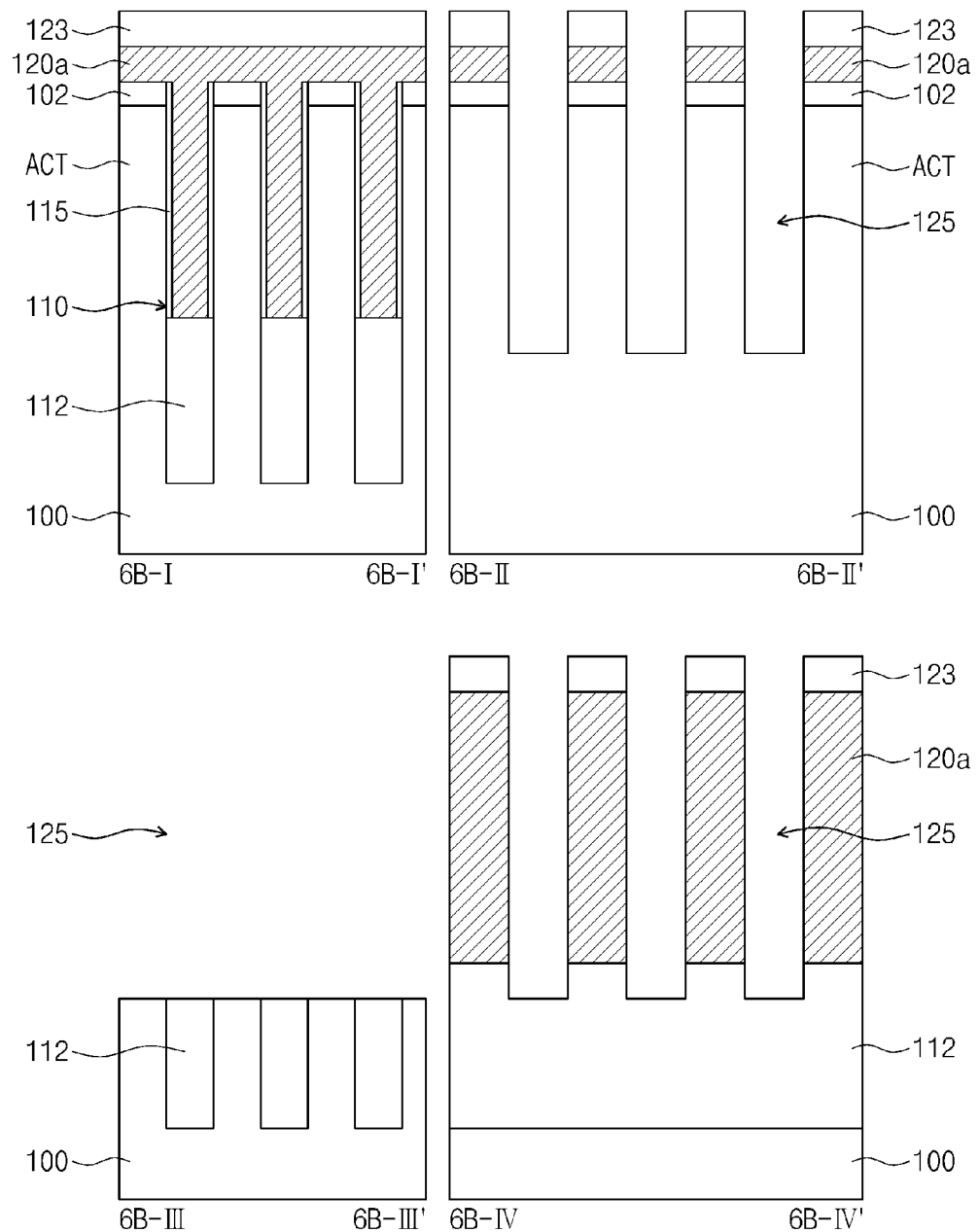

Referring to FIGS. 6A and 6B, a capping dielectric layer 123 may be formed on the gate conductive layer 120. The capping dielectric layer 123 may be a single-layered material or a multi-layered material. For example, the capping dielectric layer 123 may include an oxide material, a nitride material and/or an oxynitride material. The capping dielectric layer 123, the gate conductive layer 120, the hard mask patterns 102, fin patterns PT and the buried dielectric patterns 112 may be patterned to form second trenches 125. The second trenches 125 may cross the first trenches 110 and may be in parallel. The second trenches 125 may extend in the second direction. A plurality of active pillars ACT may be defined by formation of the second trenches 125. Each of the active pillars ACT may correspond to a portion of one of the fin patterns PT. The active pillars ACT may relatively protrude from the substrate 100 upwardly (e.g., may be protrusions of the substrate 100). According to at least one example embodiment, each of the active pillars ACT may be a square pillar with four sidewalls. The active pillars ACT may be two-dimensionally arrayed along rows and columns in a plan view. The active pillars ACT may be doped with dopants of a first conductivity type.

Formation of the second trenches 125 may form preliminary gate patterns 120a. Capping dielectric patterns 123 may be formed on the preliminary gate patterns 120a. The preliminary gate patterns 120a may correspond to portions of the gate conductive layer 120. The preliminary gate patterns 120a may extend in parallel with the second trenches 125. The preliminary gate patterns 120a may be separated from each other by the second trenches 125. The preliminary gate patterns 120a may include portions that fill the first trenches 110. A bottom surface of the respective second trenches 125 may include first portions formed of the substrate 100 and second portions formed of the buried dielectric patterns 112. According to at least one example embodiment, the first and second portions of the bottom surface of the respective second trenches 125 may be located at a lower level than bottom surfaces of the preliminary gate patterns 120a in the first trenches 110. According to at least one example embodiment, the first and second portions of the bottom surface of the respective second trenches 125 may be higher than bottom surfaces of the buried dielectric patterns 112. The preliminary gate patterns 120a and the second trenches 125 may be alternately and repeatedly arrayed in the first direction. The capping dielectric patterns 123 may correspond to portions of the capping dielectric layer.

Figure 7A:
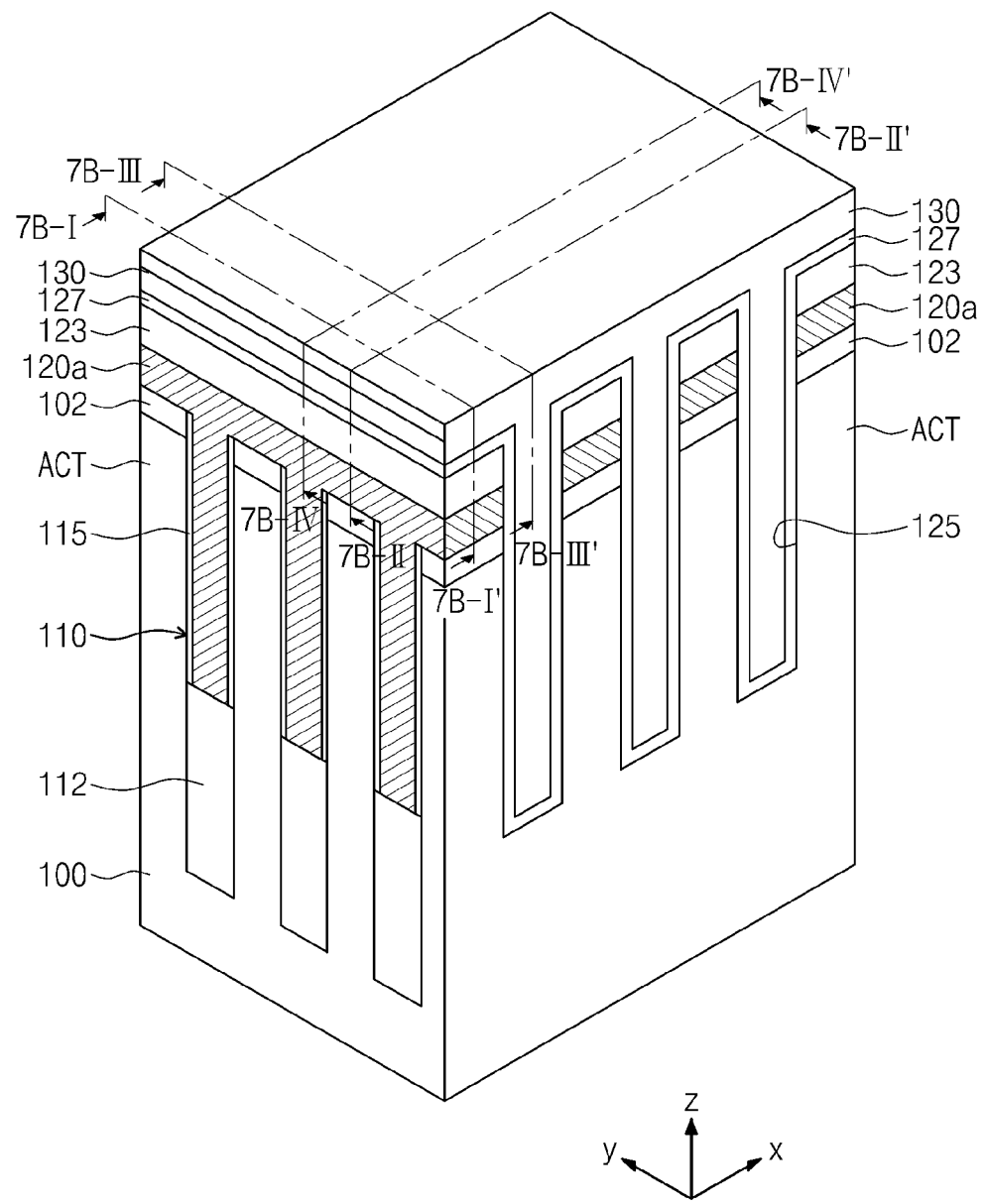
Figure 7B:
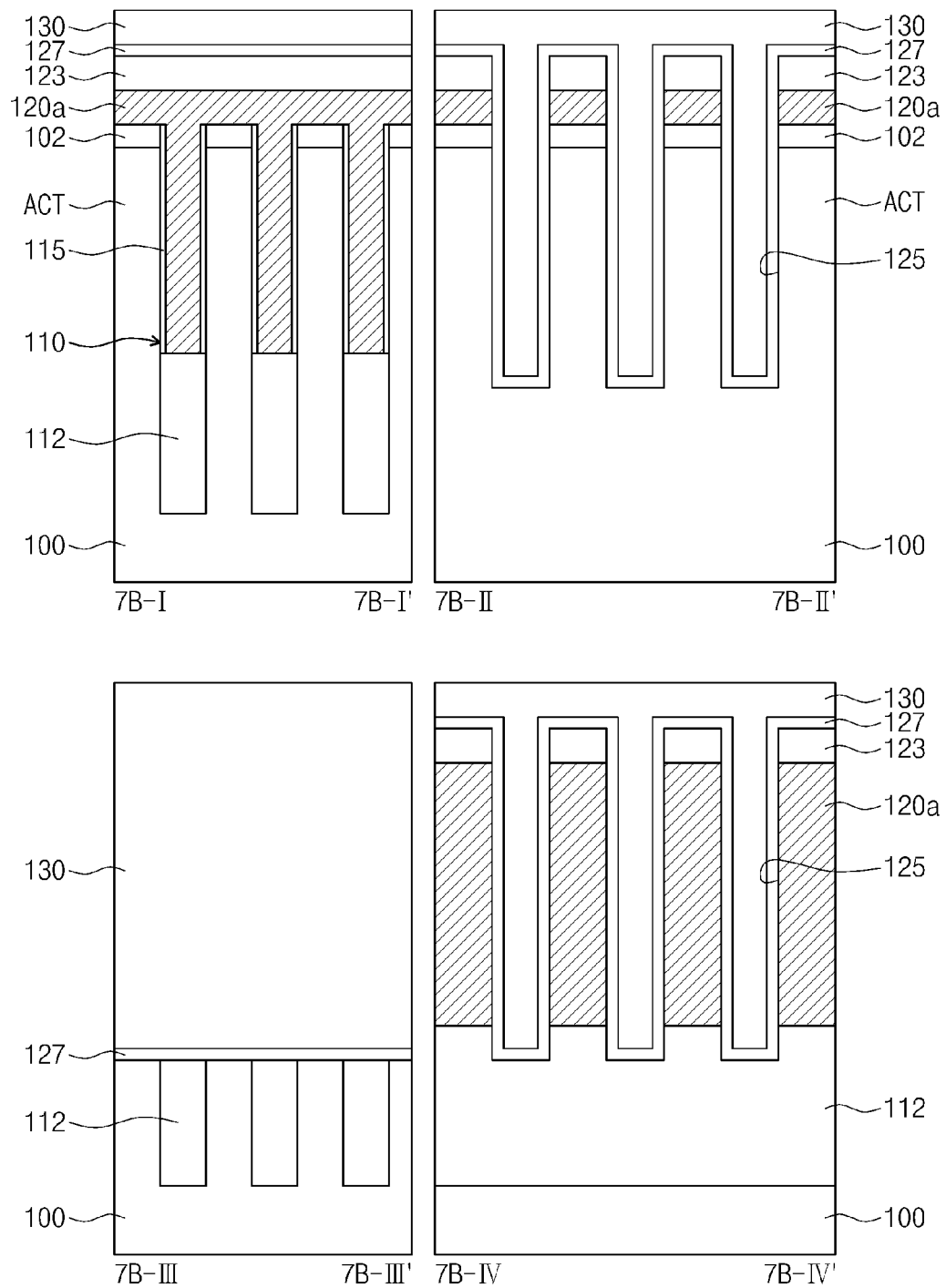

Referring to FIGS. 7A and 7B, an oxidation preventing layer 127 may be conformally formed on the substrate including the second trenches 125. For example, the oxidation preventing layer 127 may be formed to a substantially uniform thickness on inner surfaces of the second trenches 125 and on the capping dielectric patterns 123. The oxidation preventing layer 127 may be formed of a single-layered material or a multi-layered material. For example, the oxidation preventing layer 127 may be formed of an oxide layer, a nitride layer and/or an oxynitride layer. According to at least one example embodiment, the oxidation preventing layer 127 may include an oxide layer formed using an oxidation process and a nitride layer formed using a deposition process which may be sequentially stacked.

A mask layer 130 filling the second trenches 125 may be formed on the oxidation preventing layer 127. For example, the mask layer 130 may include a spin on hard mask (SOH) layer. However, the mask layer 130 is not limited to the SOH layer. The mask layer 130 may include another layer which is different from an SOH layer.

Figure 8A:
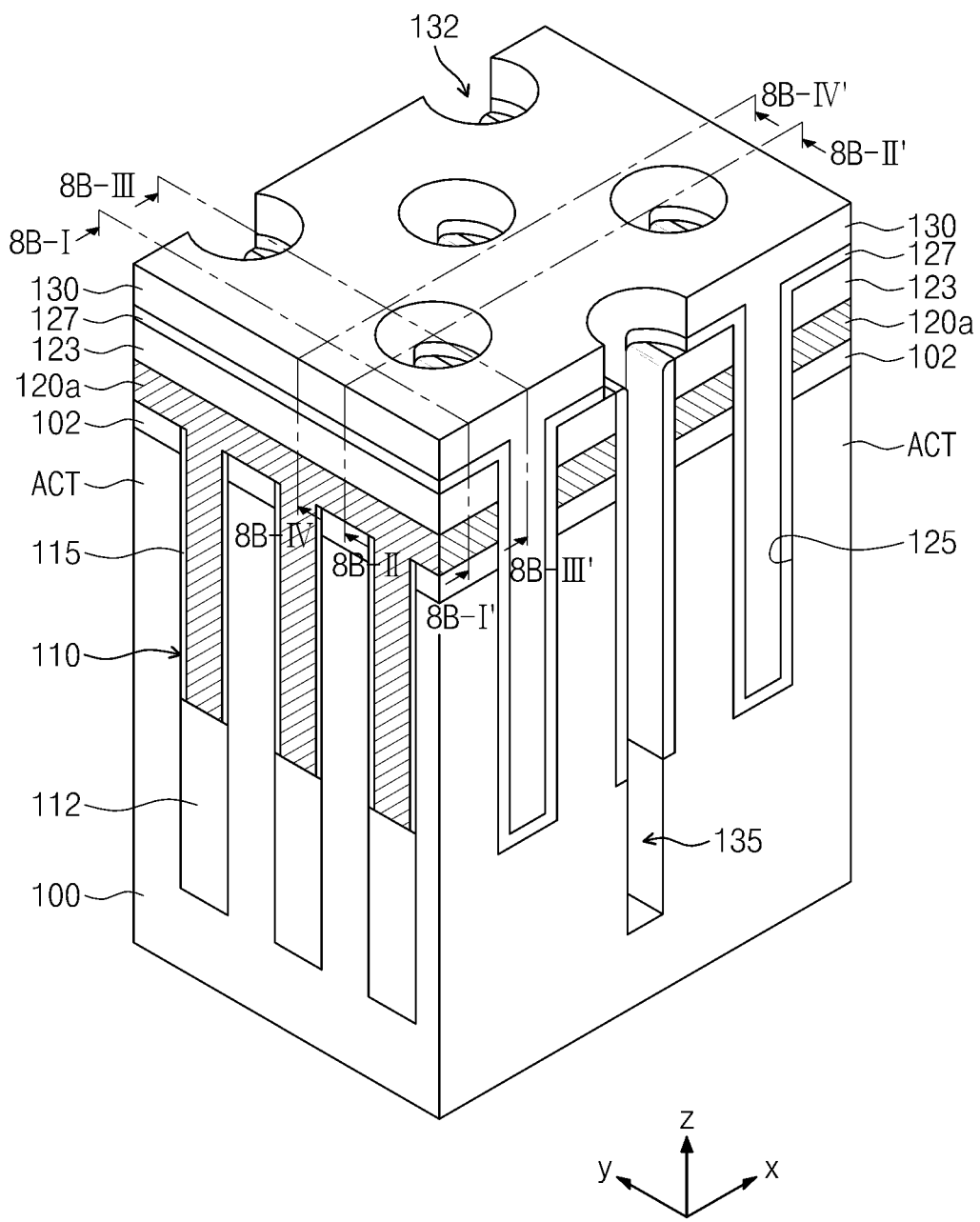
Figure 8B:
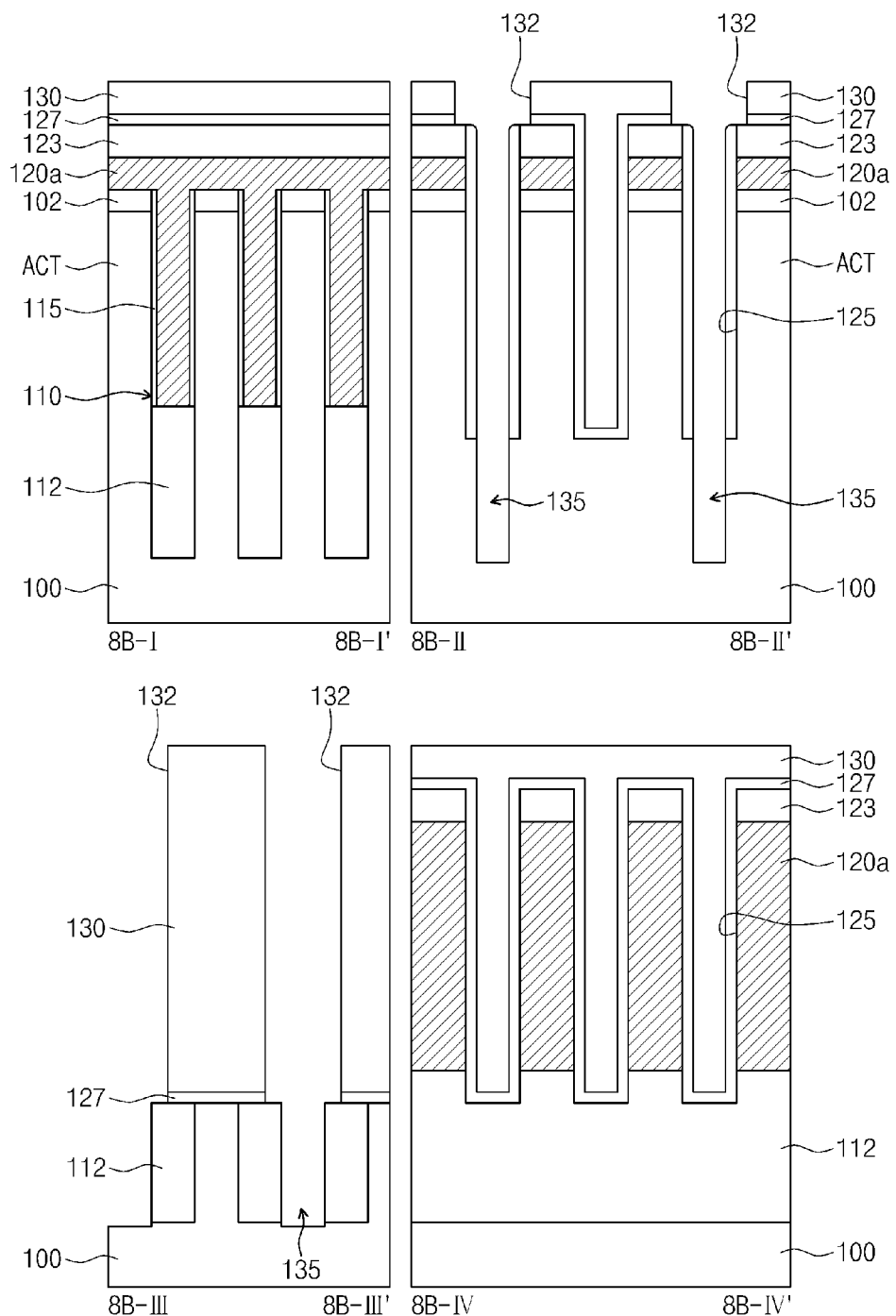

Referring to FIGS. 8A and 8B, the mask layer 130 may be patterned to form openings 132. The openings 132 may expose portions of the oxidation preventing layer 127 located on the bottom surfaces of the second trenches 125. A width of the openings 132 and the second trenches 125 may be in the first direction. The width of the respective openings 132 may be greater than that of the respective second trenches 125. The bottom surface of the respective second trenches 125 may include the first portions formed of the substrate 100 and the second portions formed of the buried dielectric patterns 112. The first portions and the second portions of the bottom surface of the respective second trenches 125 may be alternately and repeatedly arrayed in the second direction.

The openings 132 may be over portions selected from the first portions of the second trenches 125. According to at least one example embodiment, the selected first portions may include odd-numbered first portions in the bottom surface of one of the pair of adjacent second trenches 125 and even-numbered first portions in the bottom surface of the other one of the pair of adjacent second trenches 125. The openings 132 formed on the pair of adjacent second trenches 125 may be arrayed in a zigzag pattern in the second direction. Non-selected first portions of the bottom surfaces of the second trenches 125 (e.g., surfaces at the bottom of the second trenches 125) may be covered with the oxidation preventing layer 127.

The oxidation preventing layer 127 exposed by the openings 132 may be etched to expose the selected first portions of the bottom surfaces of the second trenches 125. In this case, the oxidation preventing layer 127 formed on the inner sidewalls of the second trenches 125 and exposed by the openings 132 may still exist. The exposed first portions may be etched using the mask layer 130 with the openings 132 as an etch mask, thereby forming recessed regions 135.

Figure 9A:
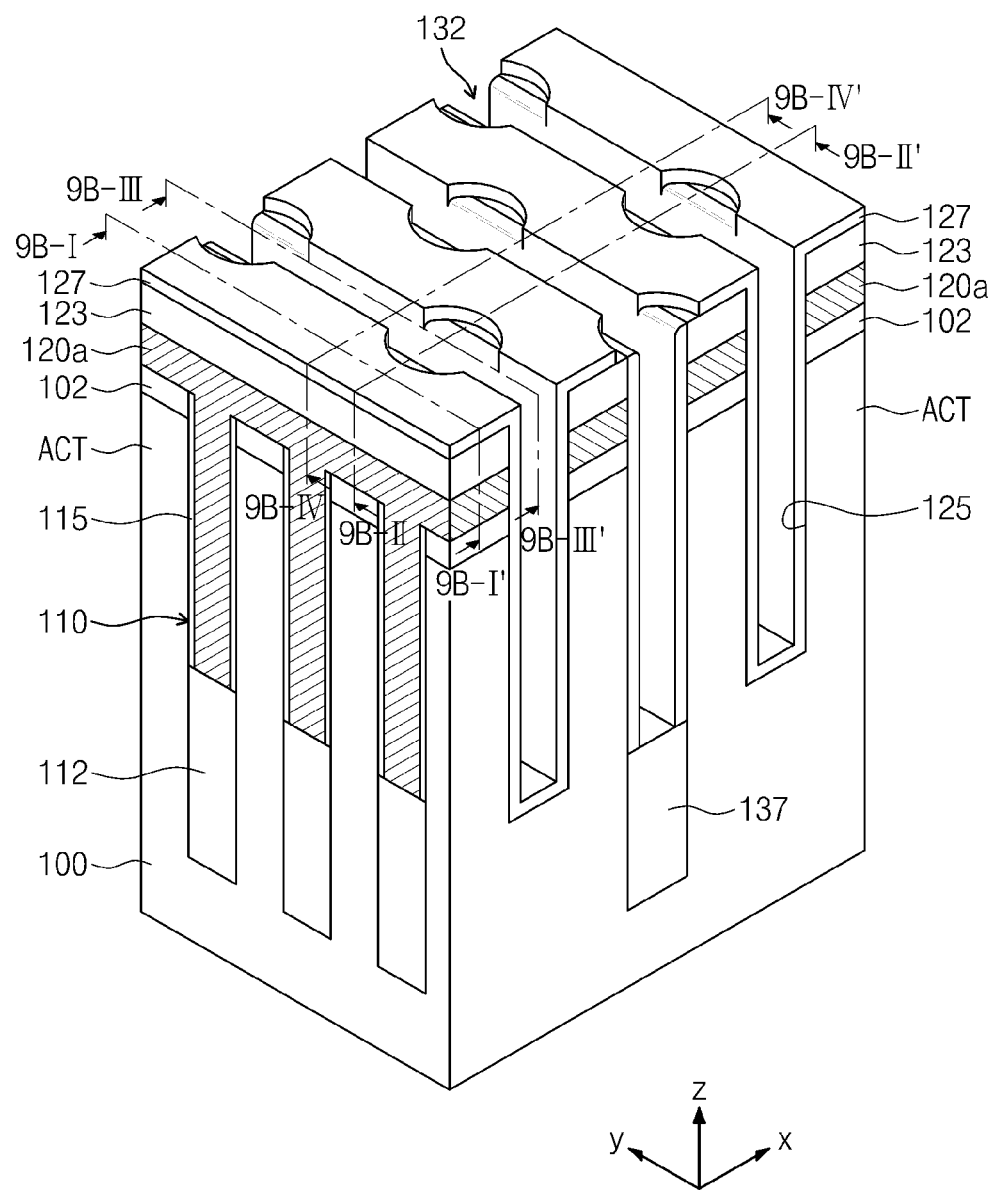
Figure 9B:
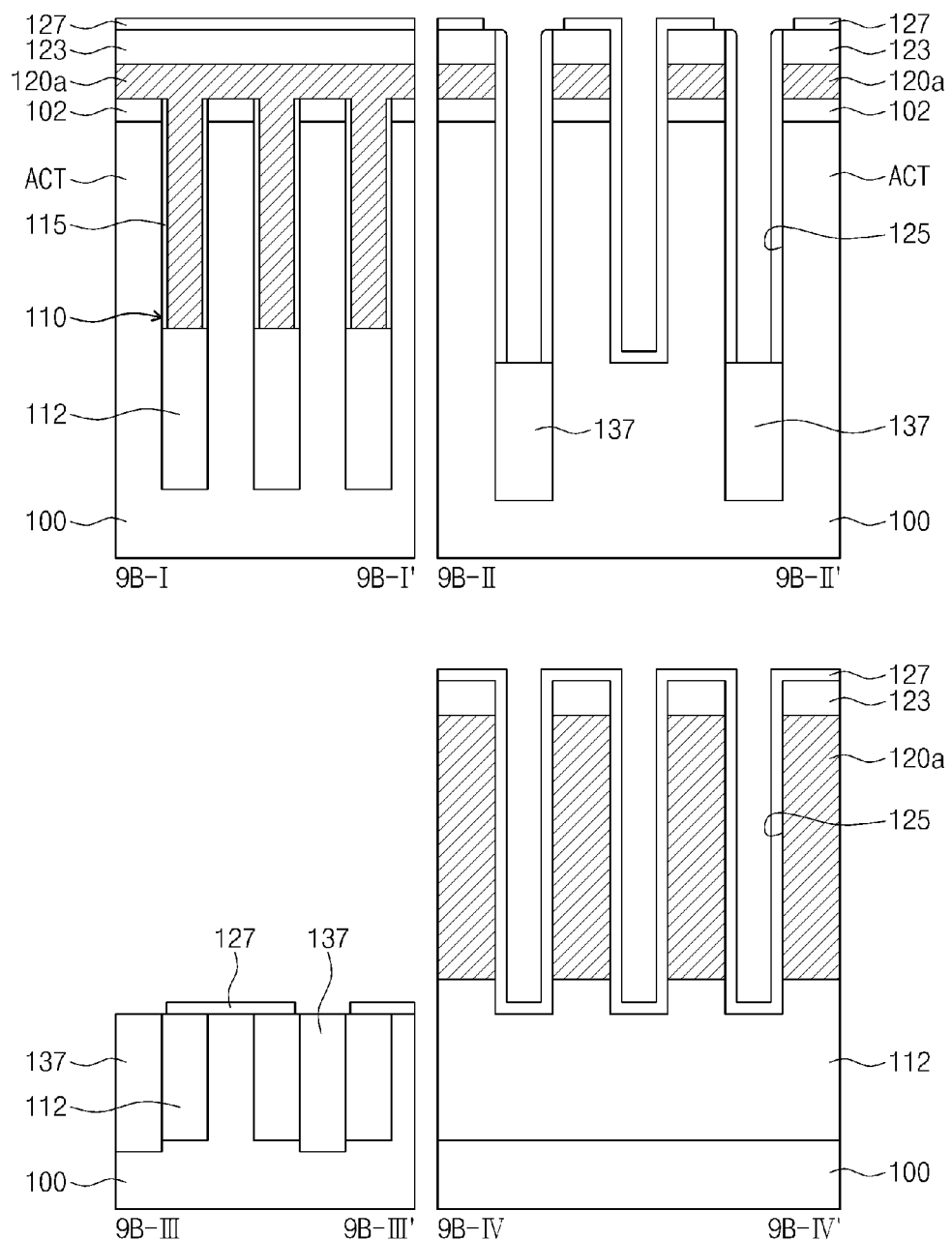

Referring to FIGS. 9A and 9B, the mask layer 130 may be removed after formation of the recessed regions 135. A plurality of plug dielectric patterns 137 may be formed in the recessed regions 135. The plug dielectric patterns 137 may be formed to fill the recessed regions 135. For example, the plug dielectric patterns 137 may be formed using a second oxidation process which may be applied to the substrate exposed by the recessed regions 135. During the second oxidation process, the substrate 100 covered with the oxidation preventing layer 127 and the hard mask patterns 102 may not be oxidized. The active pillars ACT may not be oxidized due to the presence of the oxidation preventing layer 127 during the second oxidation process. The plug dielectric patterns 137 may be laterally grown because the plug dielectric patterns 137 is formed using the second oxidation process (e.g., may consume some of the substrate 100). A width of the plug dielectric patterns 137 in the first direction may be greater than that of the recessed regions 135 in the first direction. The plug dielectric patterns 137 may be under a bottom surface of the oxidation prevent layer 127 formed on the sidewalls of the second trenches 125.

Figure 10A:
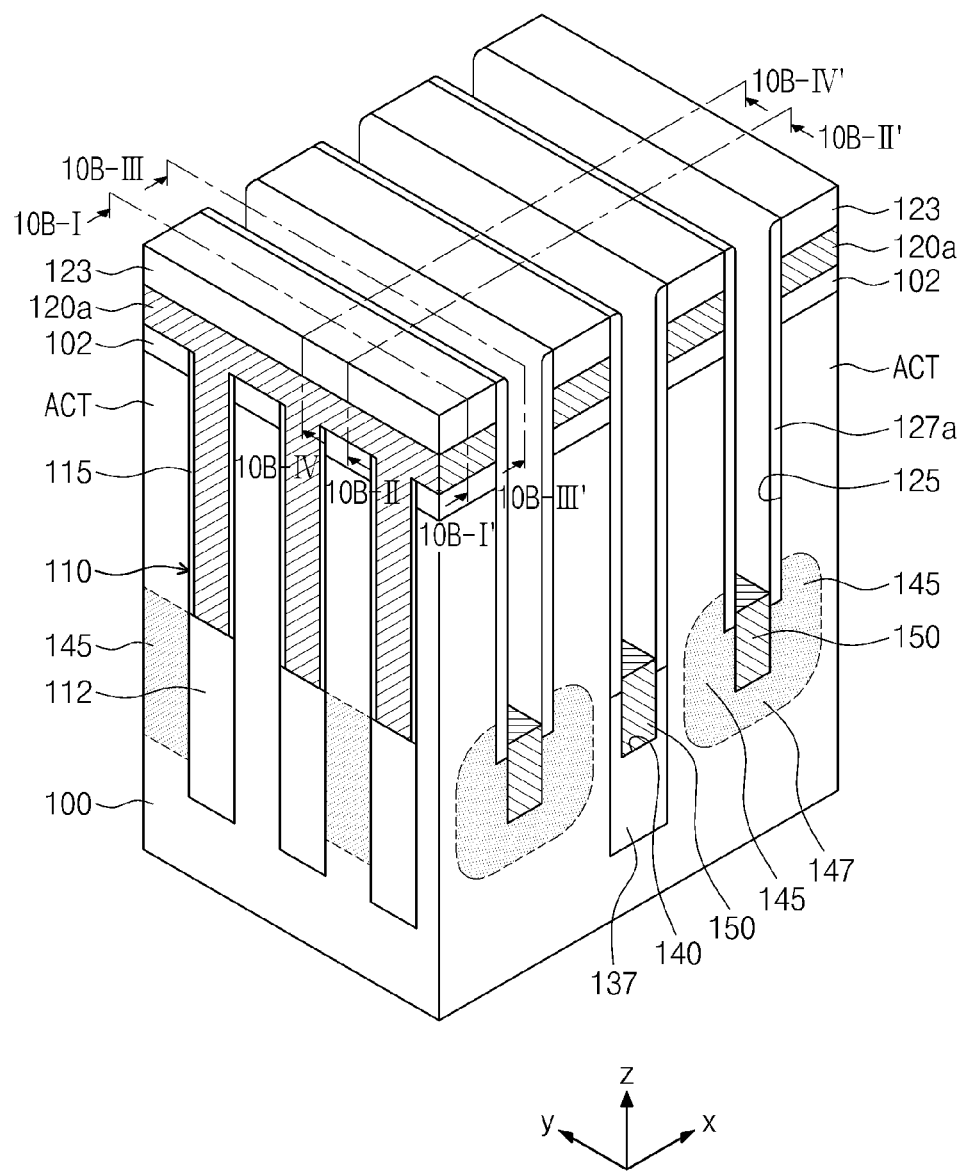
Figure 10B:
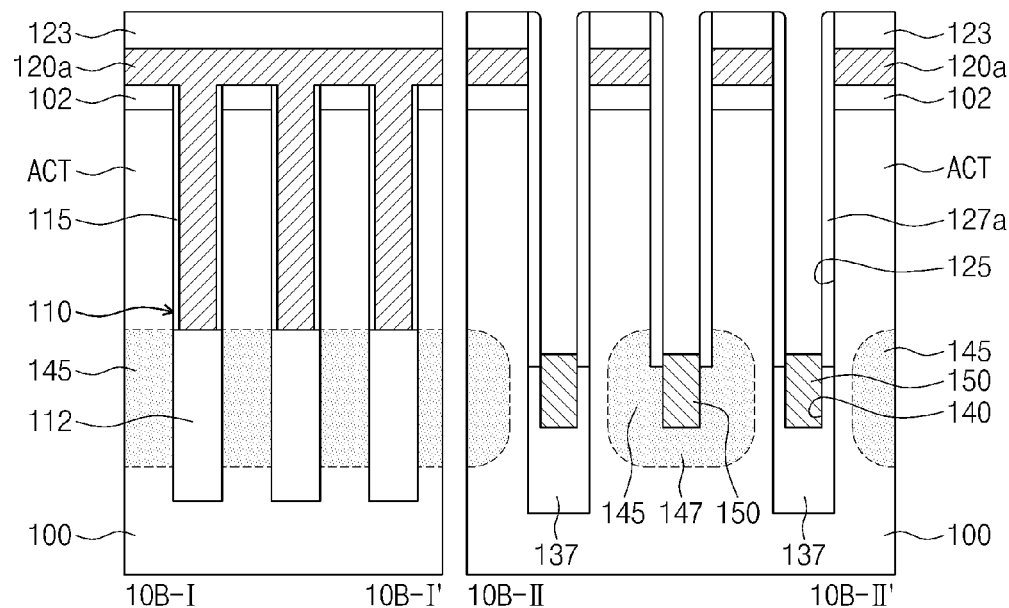
Figure 10B:
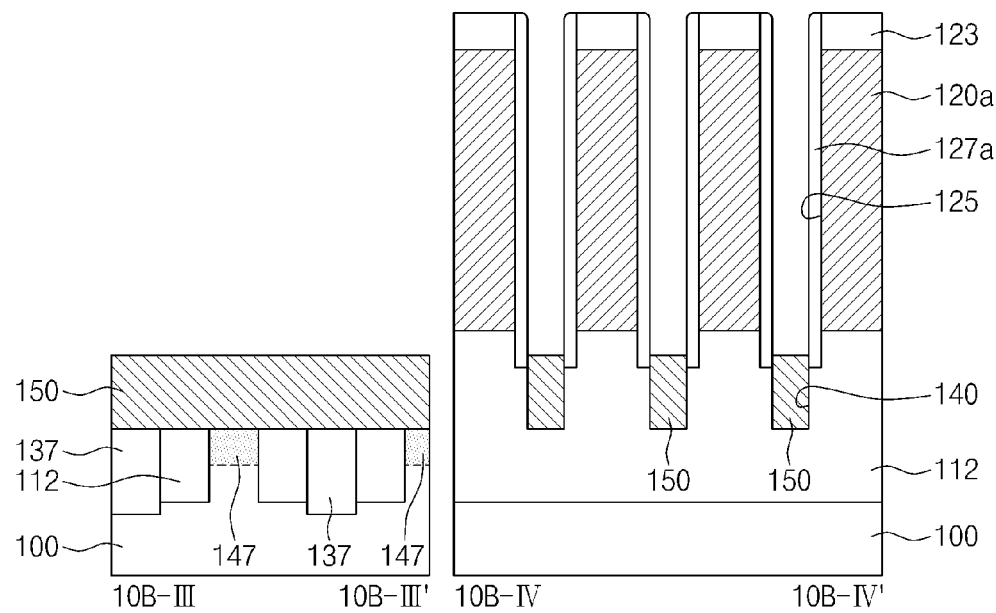

Referring to FIGS. 10A and 10B, the oxidation preventing layer 127 may be etched back to expose the bottom surfaces of the second trenches 125. Sidewall spacers 127a may be formed on both inner sidewalls of the respective second trenches 125. The sidewall spacers 127a may correspond to portions of the oxidation preventing layer 127 that exist after the oxidation preventing layer 127 is etched back. The capping dielectric patterns 123 may be exposed after formation of the sidewall spacers 127a.

The substrate 100, the plug dielectric patterns 137, the buried dielectric patterns 112 under the second trenches 125 may be etched using the sidewall spacers 127a and the capping dielectric patterns 123 as etch masks, forming interconnection trenches 140. The interconnection trenches 140 may be formed under the second trenches 125, respectively. The interconnection trenches 140 may be in parallel and extend in the second direction. Each of the interconnection trenches 140 may include a first region exposing the substrate 100, a second region exposing the buried dielectric patterns 112, and a third region exposing the plug dielectric patterns 137.

The first regions of the interconnection trenches 140 may correspond to regions which are formed by etching the non-selected first portions under the second trenches 125, and the second regions of the interconnection trenches 140 may correspond to regions which may be formed by etching the second portions under the second trenches 125. The third regions of the interconnection trenches 140 may correspond to regions which are formed by etching the plug dielectric patterns 137. The cross-sectional view of FIG. 10B taken along line 10B-II-10B-II' of FIG. 10A illustrates the first region of one of the interconnection trenches 140 and the third regions of the others of the interconnection trenches 140. The cross sectional view of FIG. 10B taken along line 10B-IV-10B-IV' of FIG. 10A illustrates the second regions of the interconnection trenches 140.

The third regions of the interconnection trenches 140 may be formed in the plug dielectric patterns 137. Lower sidewalls of the active pillars ACT adjacent to the third regions of the interconnection trenches 140 may be protected by the plug dielectric patterns 137. According to at least one example embodiment, lower sidewalls of the active pillars ACT adjacent to the first regions of the interconnection trenches 140 may be exposed by the first regions.

Dopants of a second conductivity type may be provided into the substrate 100 through the interconnection trenches 140, forming lower dopant regions 145 in lower portions of the active pillars ACT. During formation of the lower dopant regions 145, the dopants of the second conductivity type may be provided into the lower portions of the active pillars ACT through both the inner sidewalls of the first regions of the interconnection trenches 140. In this case, the plug dielectric patterns 137 may act as a blocking layer that prevents the dopants of the second conductivity type from being provided into the lower portions of the active pillars ACT adjacent to the third regions of the interconnection trenches 140. The dopants of the second conductivity type may not be provided into the active pillars ACT adjacent to the third regions.

While the lower dopant regions 145 are formed, separation dopant regions 147 may be formed under the bottom surfaces of the first regions of the interconnection trenches 140, respectively. The pair of lower dopant regions 145 formed at both sides of each of the first regions of the interconnection trenches 140 may be connected to each other through the separation dopant region 147 therebetween. The pair of lower dopant regions 145 may contact both the inner sidewalls of each of the first regions, respectively, and the separation dopant regions 147 may be formed under the first regions of the interconnection trenches 140.

Each of the first regions of the interconnection trenches 140 may be surrounded by the pair of adjacent lower dopant regions 145 and the separation dopant region 147 between the pair of adjacent lower dopant regions 145. The pair of adjacent lower dopant regions 145 and the separation dopant region 147 therebetween may be connected to each other and constitute a single body. The separation dopant regions 147 may be simultaneously formed with the lower dopant regions 145. The dopants of the second conductivity type may be injected into the lower portions of the active pillars ACT using, for example, an ion implantation process. In this case, the dopant ions may be implanted by a tilted implantation process and/or a non-tilted implantation process. According to at least one example embodiment, the dopants of the second conductivity type may be injected using, for example, a plasma doping process.

According to at least one example embodiment, the lower dopant region 145 may be horizontally separated from one sidewall of the active pillar ACT. For example, the lower dopant region 145 may be horizontally separated from the one sidewall of the active pillar ACT, which is adjacent to the third region of the interconnection trench 140. The active pillar ACT may be between the pair of interconnection trenches 140. The active pillar ACT may include a first sidewall and a second sidewall facing each other. The first and second sidewalls of the active pillar ACT may extend in the second direction. The first sidewall of the active pillar ACT may be adjacent to the first region of one of the pair of interconnection trenches 140, and the second sidewall of the active pillar ACT may be adjacent to the third region of the other interconnection trench 140. In this case, the lower dopant region 145 may be horizontally separated from the second sidewall of the active pillar ACT.

Example embodiments are not limited to the above example embodiments. In other example embodiments, the lower dopant regions 145 may be in contact with all sidewalls of the active pillars ACT.

Buried interconnections 150 may be formed in the interconnection trenches 140. For example, an interconnection conductive layer (not shown) filling the interconnection trenches 140 may be formed on the substrate with the lower dopant regions 145 and the separation dopant regions 147. The interconnection conductive layer may be etched to form the buried interconnections 150. According to at least one example embodiment, top surfaces of the buried interconnections 150 may be located at a lower level than top surfaces of the lower dopant regions 145. The buried interconnections 150 may be electrically connected to the lower dopant regions 145. Each of the buried interconnections 150 may be in contact with the lower dopant regions 145 formed at both sides of the first regions of the respective interconnection trenches 140.

Each of the buried interconnections 150 may be in contact with the separation dopant regions 147 under the respective interconnection trenches 140. The first regions of the interconnection trenches 140 may be surrounded by the lower dopant regions 145 and the separation dopant regions 147, and the lower dopant regions 145 and the separation dopant regions 147 may be of a different conductivity type than the substrate 100. The buried interconnections 150 may be electrically isolated from the substrate 100. The buried interconnections 150 in the third regions of the interconnection trenches 140 may be insulated from the lower dopant regions 145 adjacent to the third regions due to the presence of the plug dielectric patterns 137. Each of the lower dopant regions 145 may be connected to one of the buried interconnections 150. The buried interconnections 150 may include at least one of a metal layer (e.g., a tungsten layer), a conductive metal nitride layer (e.g., a titanium nitride layer and/or a tantalum nitride layer) and a transition metal layer (e.g., a titanium layer and/or a tantalum layer).

Figure 11A:
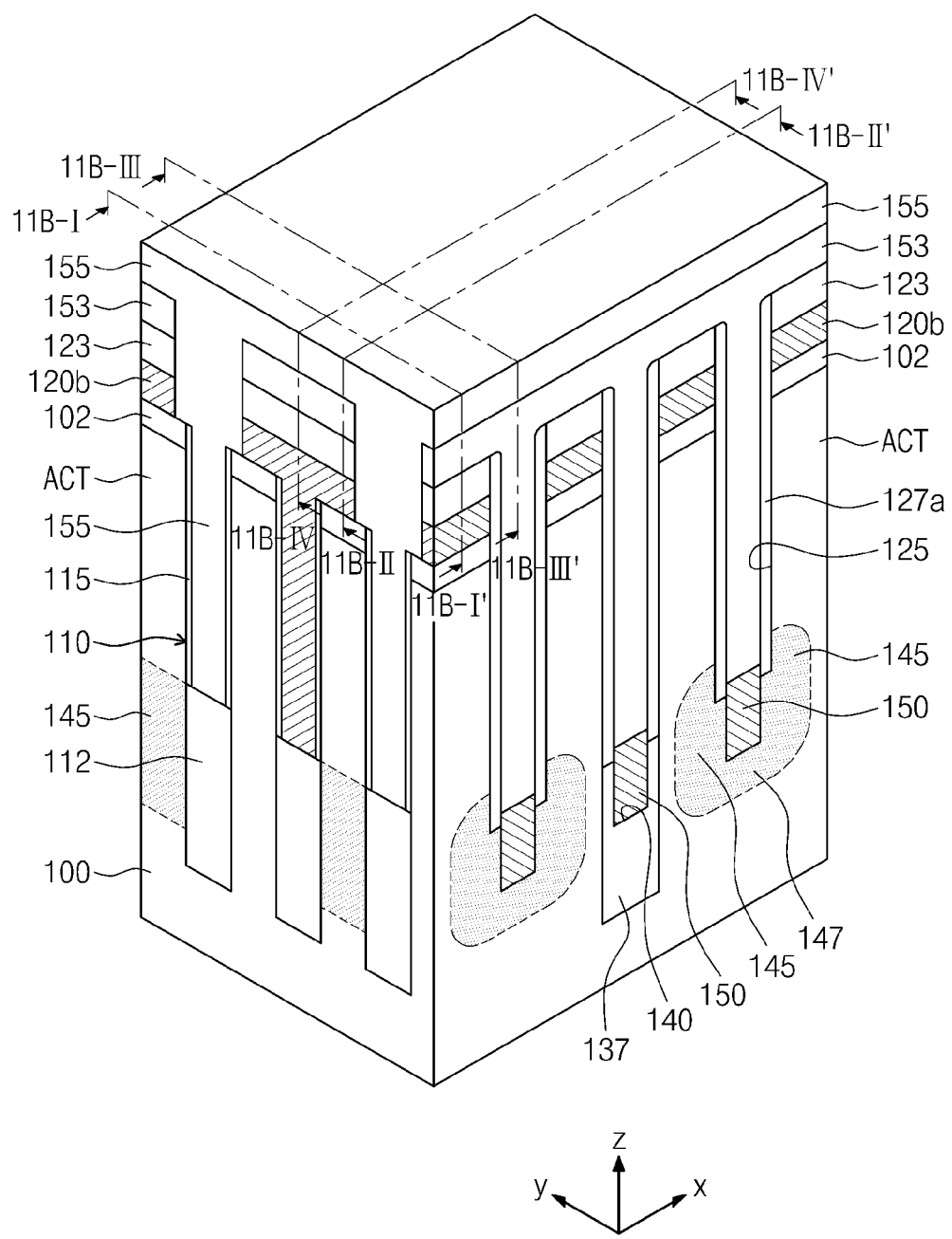
Figure 11B:
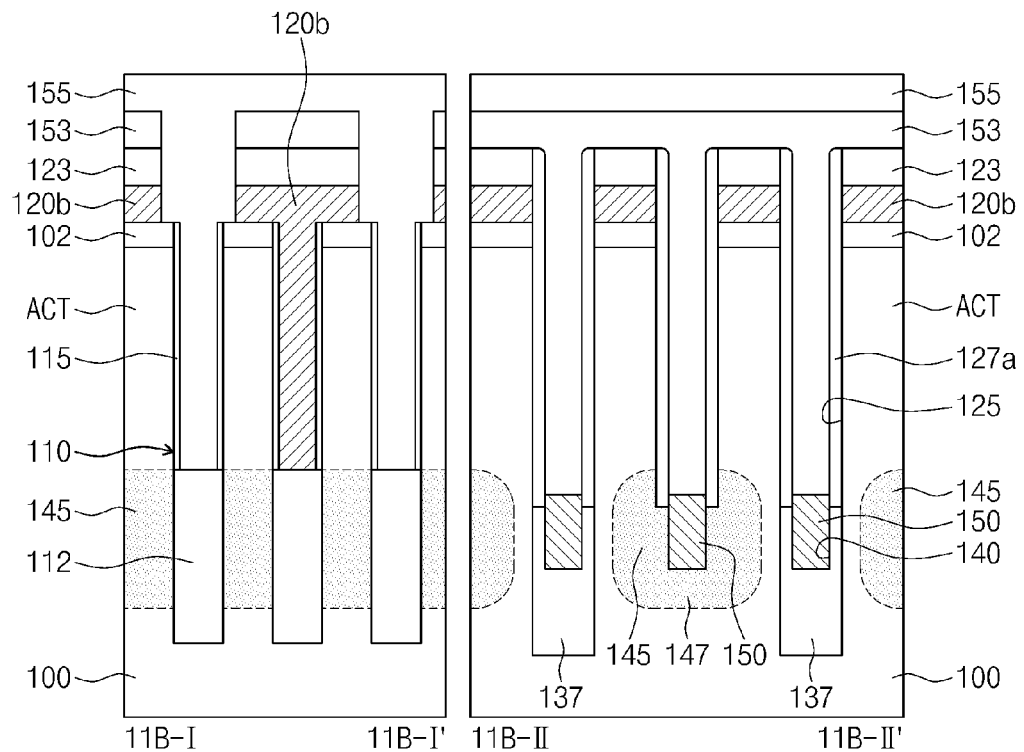
Figure 11B:
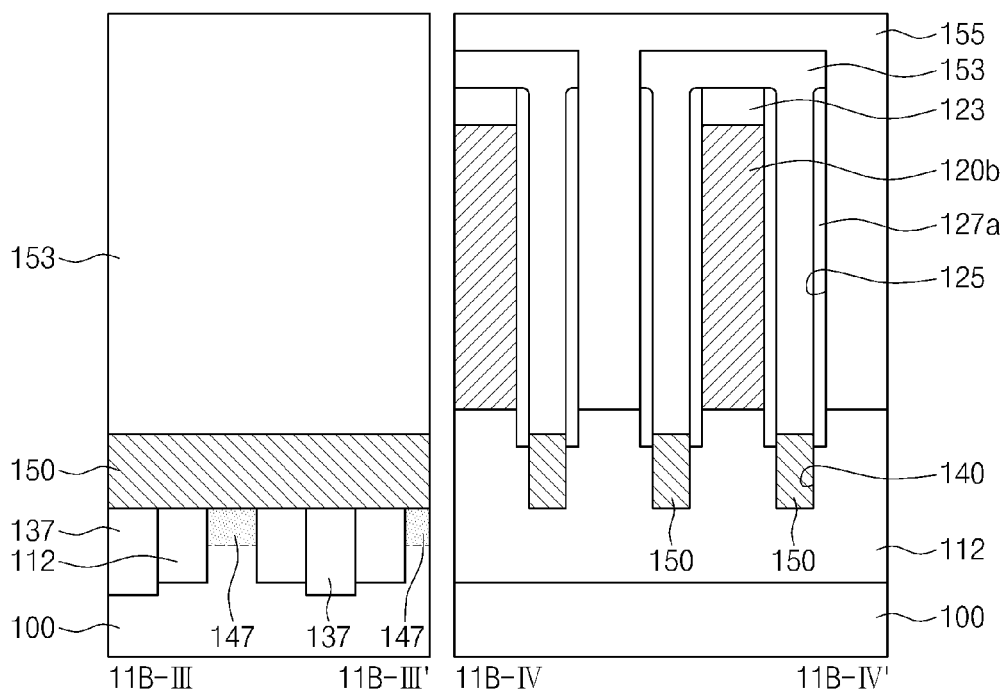

Referring to FIGS. 11A and 11B, a first filling dielectric layer 153 filling the second trenches 125 may be formed on the substrate including the buried interconnections 150. The first filling dielectric layer 153 may include an oxide layer, a nitride layer and/or an oxynitride layer. According to at least one embodiment, the first filling dielectric layer 153 may be a nitride layer. The first filling dielectric layer 153, the capping dielectric patterns 123 and the preliminary gate patterns 120a may be patterned to form gate patterns 120b. Each of the preliminary gate patterns 120a may include portions filling the first trenches 110. While the preliminary gate patterns 120a are patterned, some portions of each of the preliminary gate patterns 120a may be removed. The preliminary gate patterns 120a in some of the first trenches 110 may be selectively removed while the preliminary gate patterns 120a are patterned. The gate patterns 120b may fill only the non-selected first trenches 110 of all the first trenches 110. The gate patterns 120b may be separated from each other.

Each of the gate patterns 120b filling the non-selected first trenches 110 may be disposed between the pair of active pillars ACT which are adjacent to each other in the second direction. Each of the gate patterns 120b may extend to cover top surfaces of the pair of active pillars ACT which are adjacent to each other in the second direction. The first trenches 110 adjacent to the gate patterns 120b in the second direction may correspond to the selected first trenches 110 where the preliminary gate patterns 120a are removed. The gate patterns 120b at two sides of each of the second trenches 125 may be arrayed zigzag in the second direction. A second filling dielectric layer 155 may be formed to fill the selected first trenches 110 on the substrate including the gate patterns 120b. The second filling dielectric layer 155 may be, for example, an oxide layer, a nitride layer and/or an oxynitride layer.

Figure 12A:
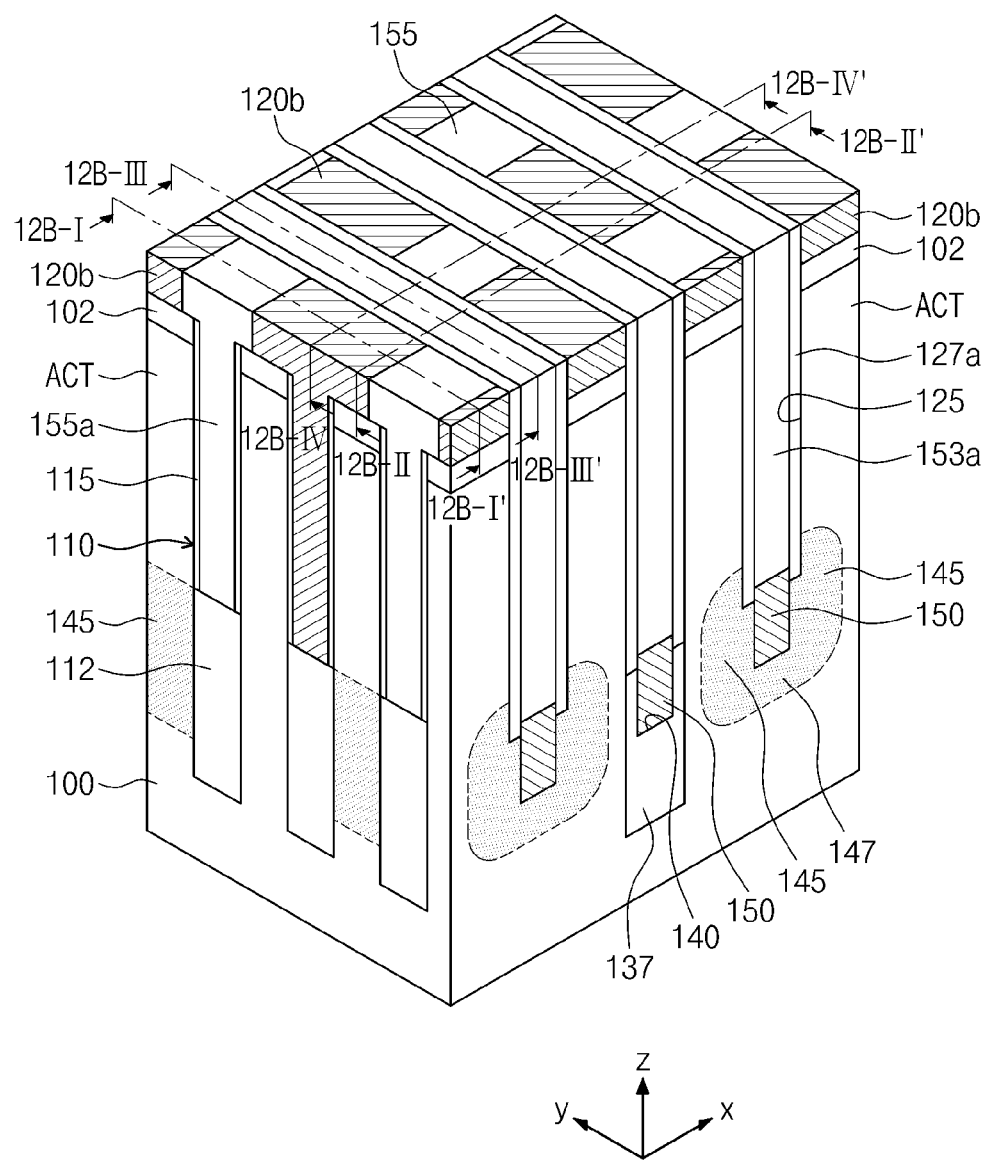
Figure 12B:
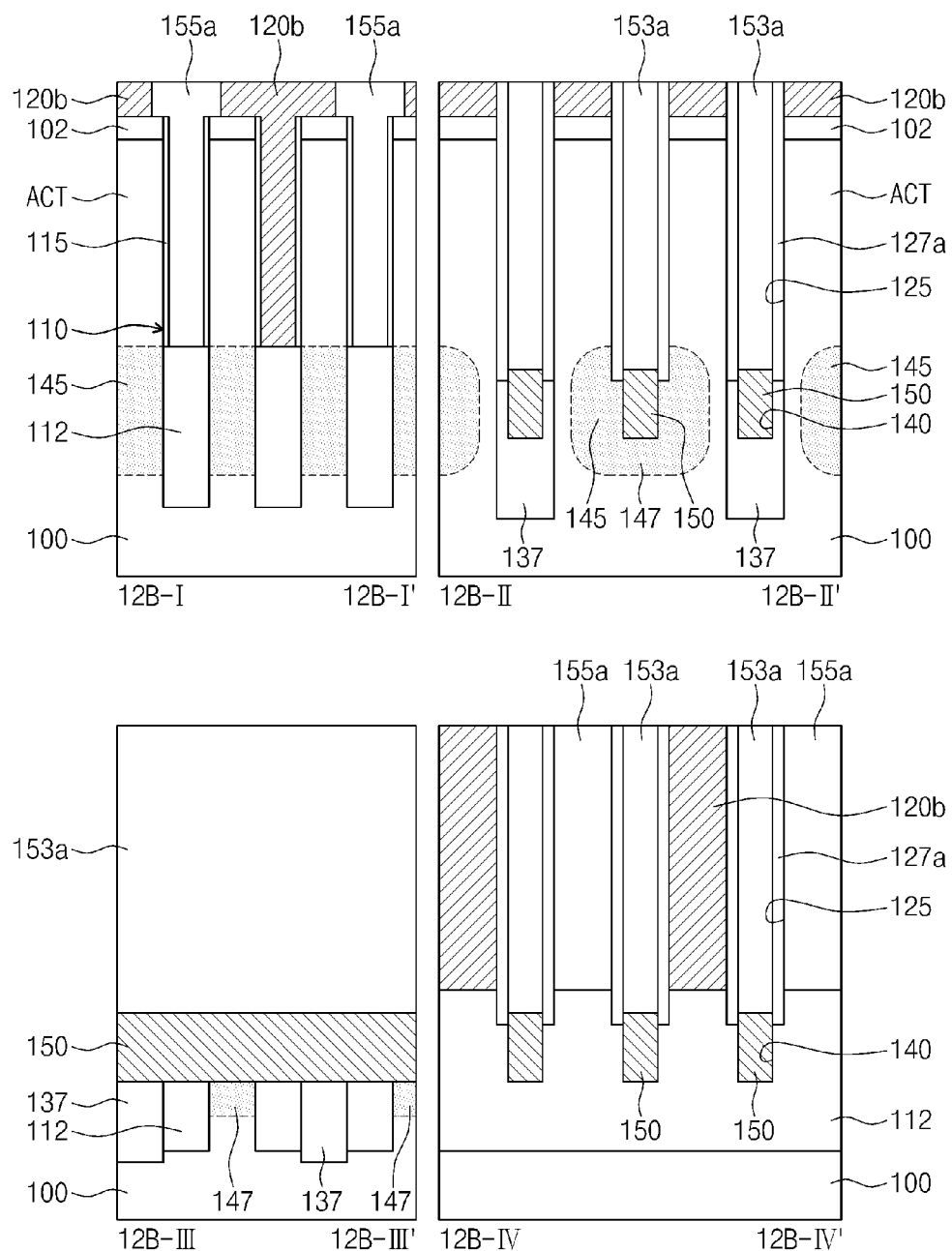

Referring to FIGS. 12A and 12B, the second filling dielectric layer 155, the first filling dielectric layer 153 and the capping dielectric patterns 123 may be planarized until top surfaces of the gate patterns 120b are exposed. First filling dielectric patterns 153a and second filling dielectric patterns 155a may be formed. The first filling dielectric patterns 153a may fill the second trenches 125, and the second filling dielectric patterns 155a may fill the selected first trenches 110 where the preliminary gate patterns 120a are removed.

Figure 13A:
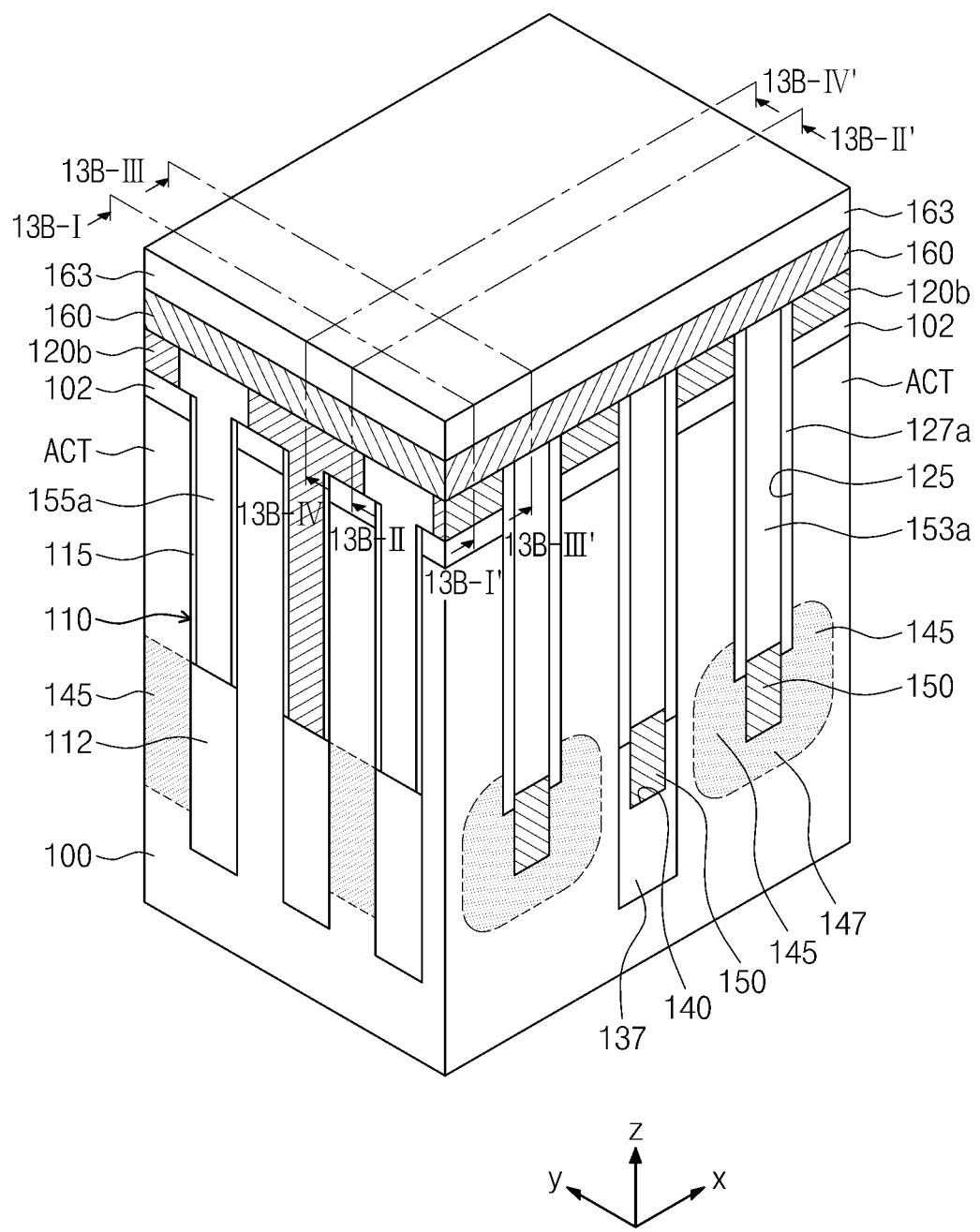
Figure 13B:
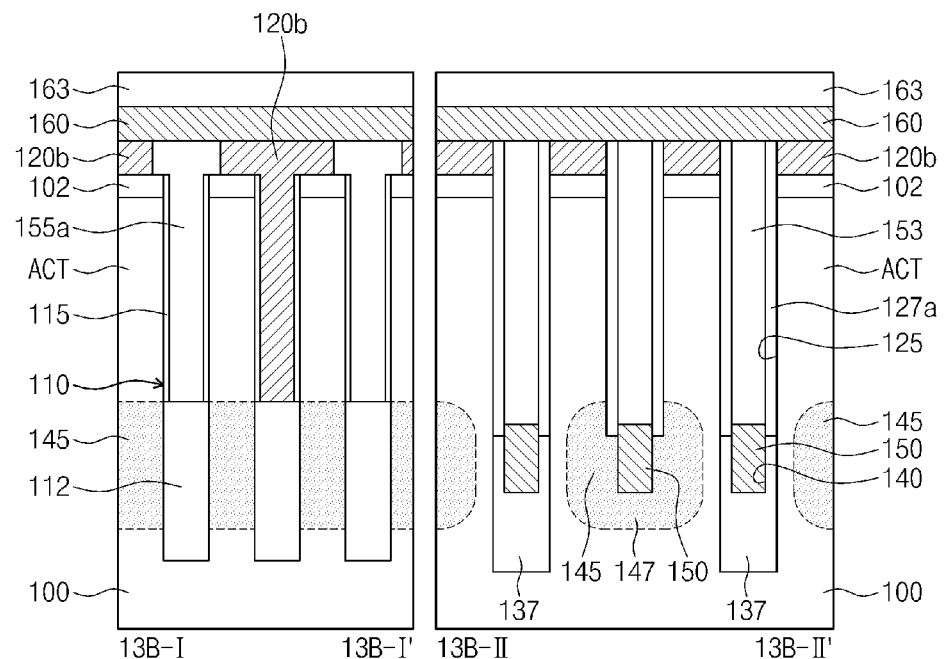
Figure 13B:
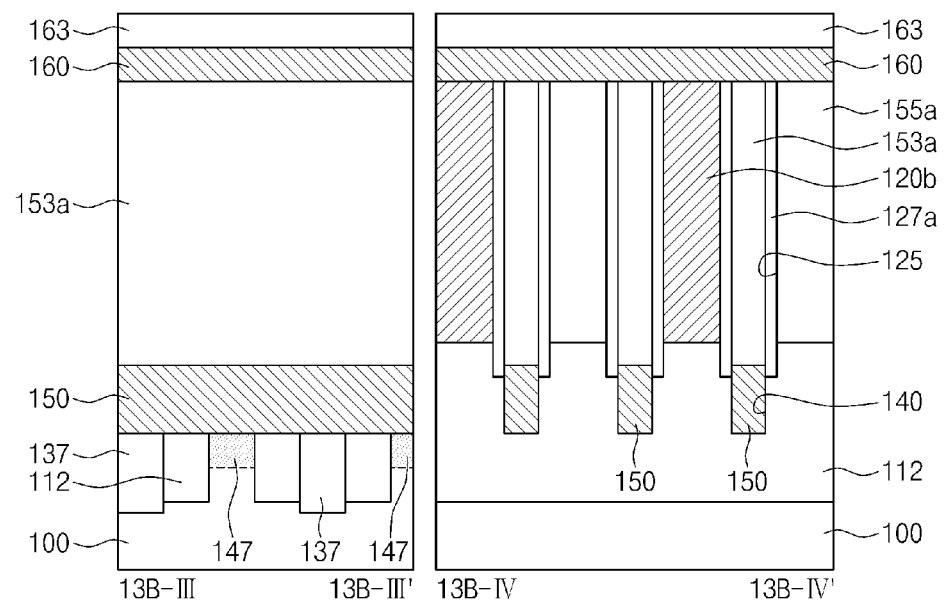

Referring to FIGS. 13A and 13B, an upper conductive layer 160 and a gate capping layer 163 may be sequentially formed on the substrate including the first and second filling dielectric patterns 153a and 155a. The upper conductive layer 160 may be in contact with the gate patterns 120b. The upper conductive layer 160 may be formed of a single-layered material layer or a multi-layered material layer. The upper conductive layer 160 may include a conductive layer of low resistivity. For example, the upper conductive layer 160 may include a conductive metal nitride layer (e.g., a titanium nitride layer and/or a tantalum nitride layer), a transition metal layer (e.g., a titanium layer and/or a tantalum layer), a metal layer (e.g., a tungsten layer and/or an aluminum layer) and/or a metal-semiconductor compound layer (e.g., a metal silicide layer). According to at least one example embodiment, the upper conductive layer 160 may include a semiconductor layer doped with dopants. The gate capping layer 163 may be formed of a single-layered dielectric layer or a multi-layered dielectric layer. For example, the gate capping layer 163 may include an oxide layer, a nitride layer and/or an oxynitride layer.

Figure 14A:
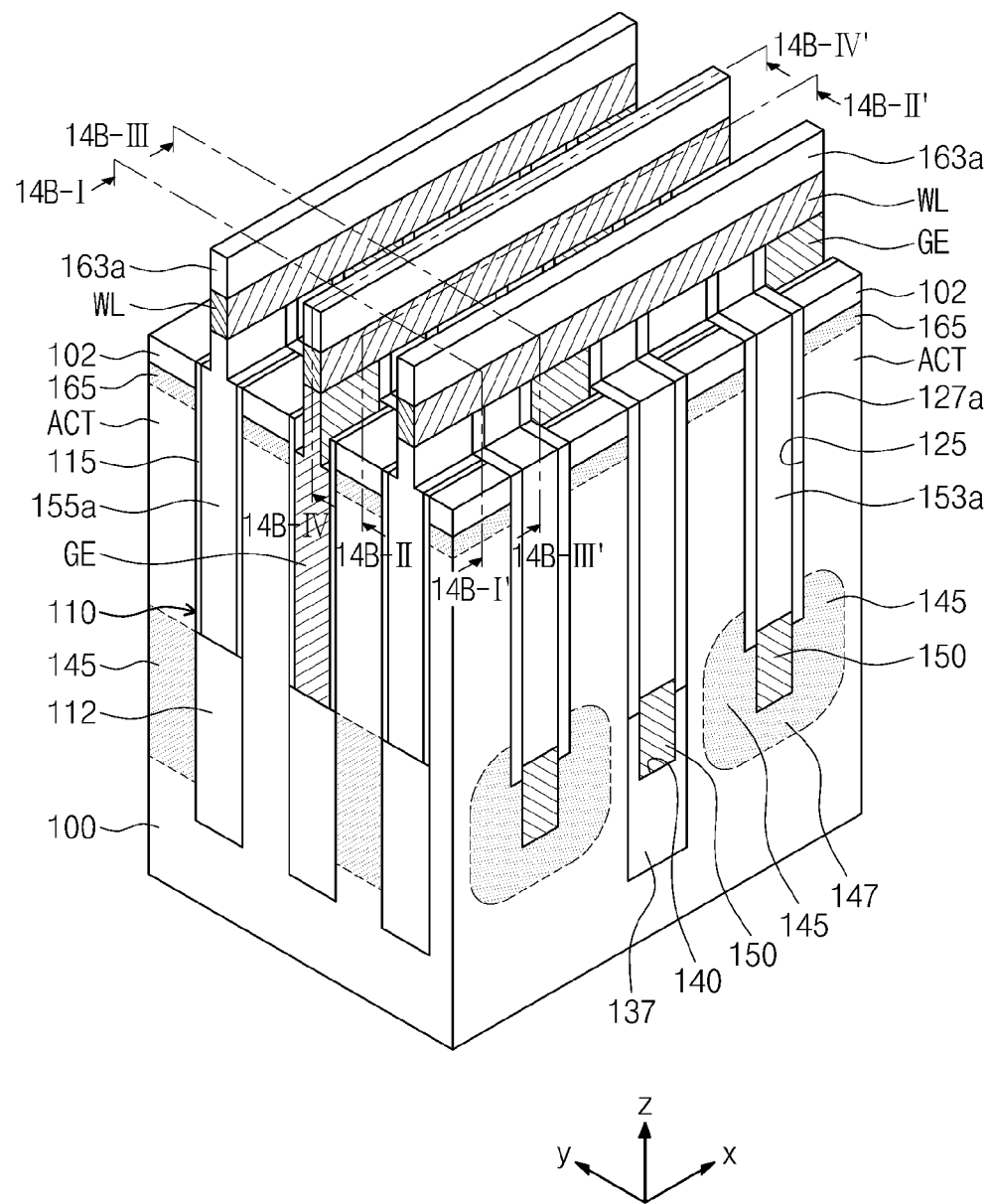
Figure 14B:
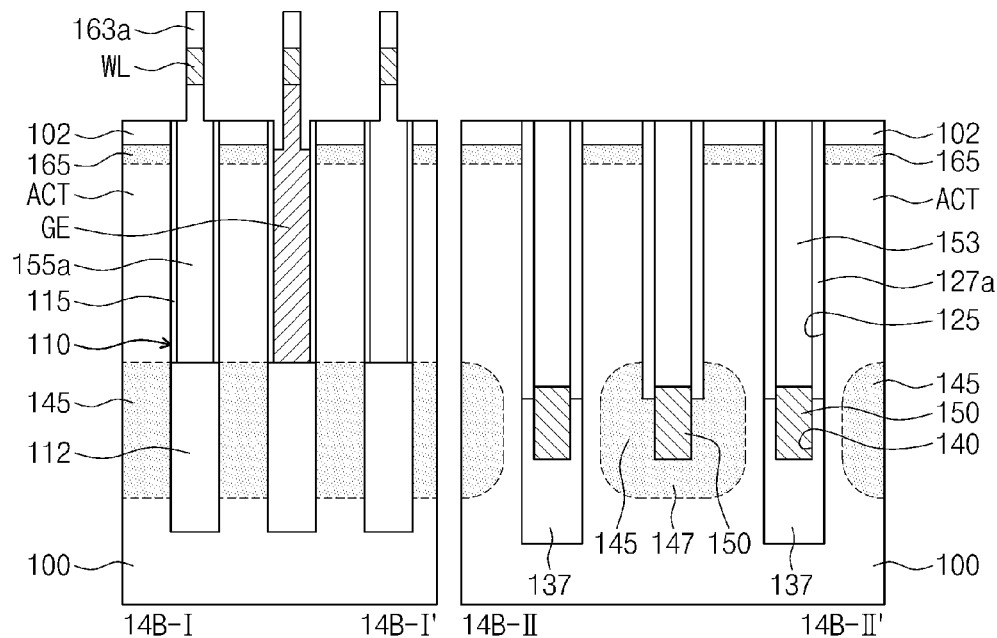
Figure 14B:
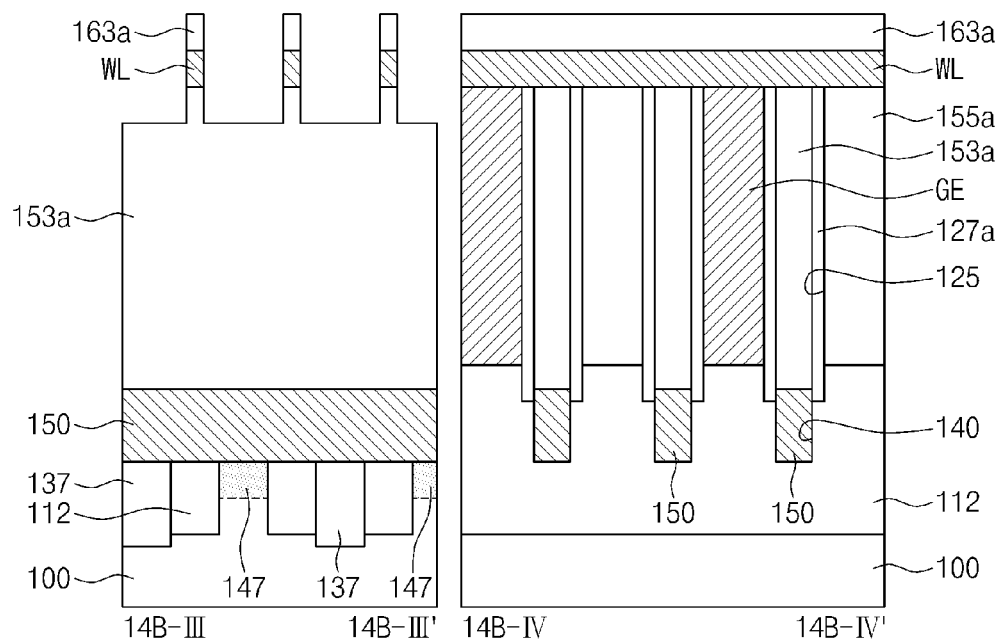

Referring to FIGS. 14A and 14B, the gate capping layer 163, the upper conductive layer 160 and the gate patterns 120b may be patterned to form gate patterns extending in the first directions. Each of the gate patterns may include a gate electrode GE, a word line WL and gate capping pattern 163a which may be sequentially stacked. The word lines WL and the gate capping patterns 163a may extend in the first direction. Each of the word lines WL may correspond to a portion of the upper conductive layer 160. While the upper conductive layer 160 and the gate patterns 120b are patterned, the gate patterns 120b over the top surfaces of the active pillars ACT may be removed. The gate electrodes GE may be formed. Each of the gate electrodes GE may be disposed between the pair of adjacent active pillars ACT.

Dopants of the second conductivity type may be injected into upper portions of the active pillars ACT to form upper dopant regions 165. The upper dopant regions 165 may be formed in the upper portions of the active pillars ACT. The upper dopant regions 165 may be vertically spaced apart from the lower dopant regions 145. The active pillars ACT between the upper dopant regions 165 and the lower dopant regions 145 may correspond to channel bodies.

Each of the gate electrodes GE may correspond to the gates of the first and second vertical channel transistors FET1 and FET2 of each of the first and second transistor-pairs TRP1 and TRP2 illustrated in FIG. 1. Each of the gate electrodes GE may correspond to a common gate electrode that two vertical channel transistors share. The lower dopant regions 145 may correspond to the first source/drain terminals of the first and second vertical channel transistors FET1 and FET2 of FIG. 1, and the upper dopant regions 165 may correspond to the second source/drain terminals of the first and second vertical channel transistors FET1 and FET2 of FIG. 1. The word lines WL may correspond to the word lines WL1 and WL2 of FIG. 1, and the buried interconnections 150 may correspond to the buried wirings BW1 and BW2.

Figure 15A:
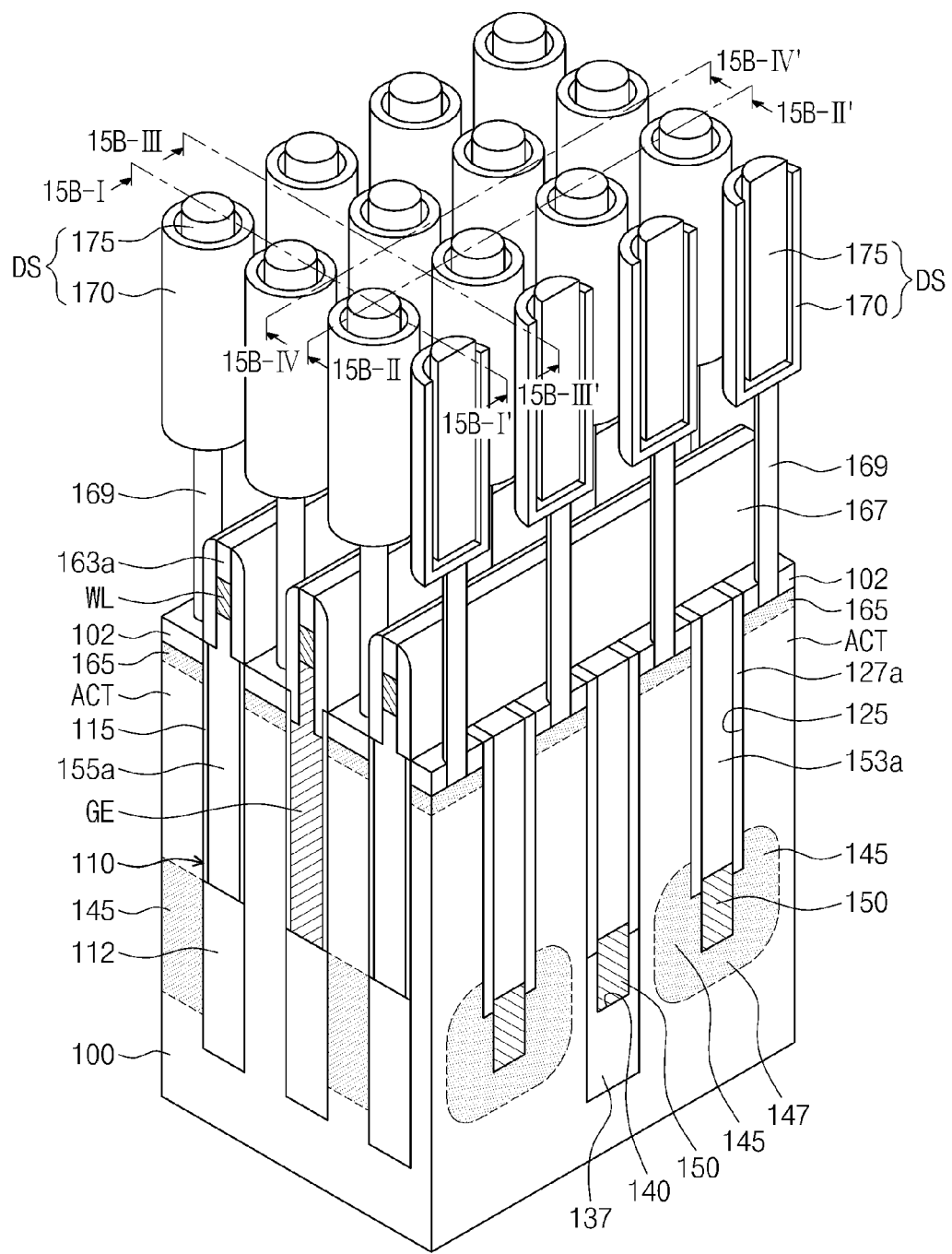
FIGS. 15A and 15B include a perspective diagram and cross-sectional views illustrating semiconductor devices according to some example embodiments of the inventive concepts.
Figure 15A:
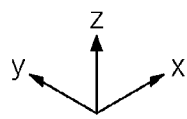
Figure 15B:
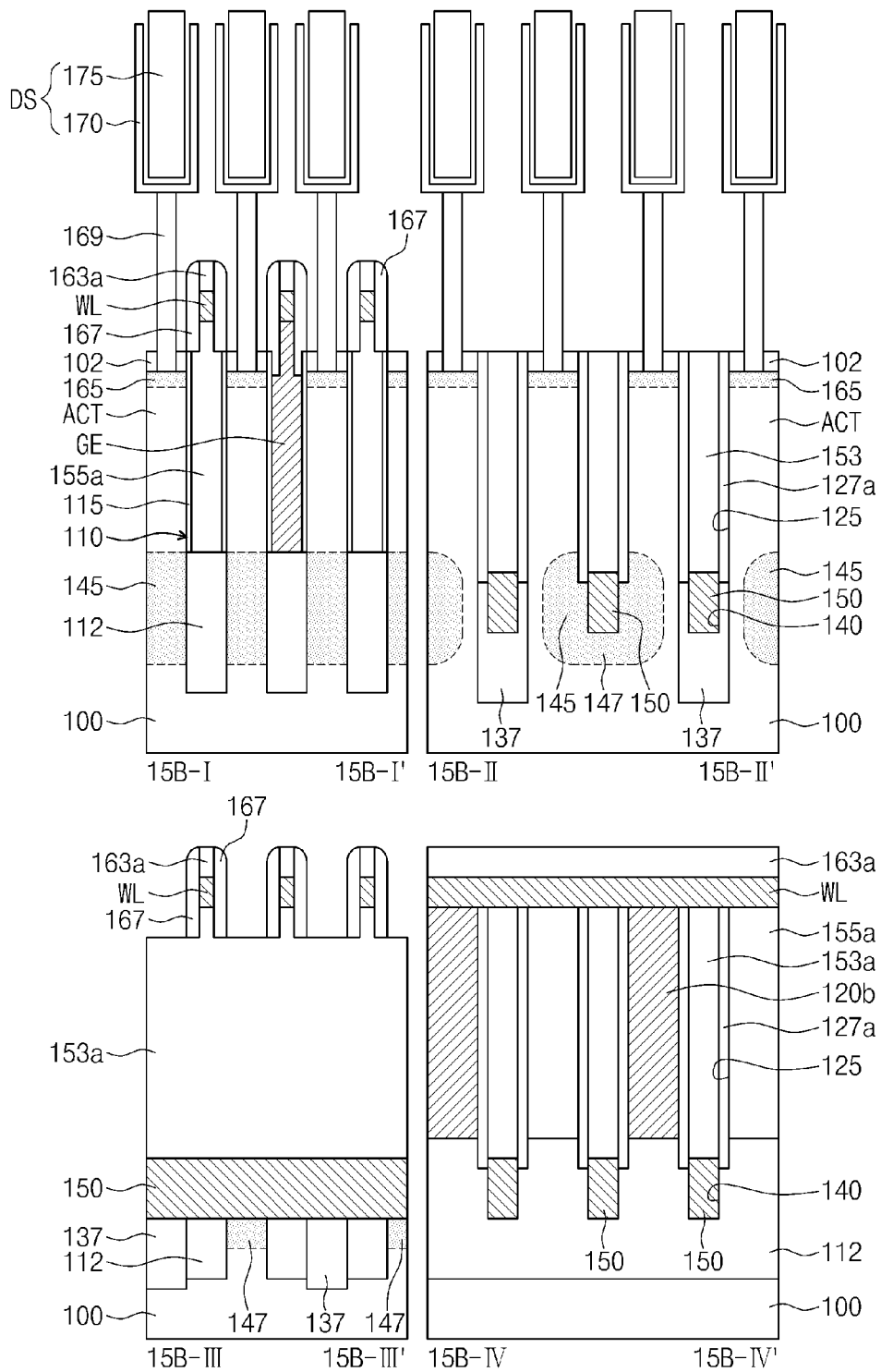

Referring to FIGS. 15A and 15B, Gate spacers 167 may be formed on both sidewalls of the word lines WL. Data storage elements DS may be formed on the substrate including the gate spacers 167. The data storage elements DS may be electrically connected to the upper dopant regions 165, respectively.

According to example embodiments including methods of fabricating semiconductor devices, the second trenches 125 may be formed after formation of the gate conductive layer 120 filling the first trenches 110. The gate electrodes GE vertically extending on the sidewalls of the pillars may have reproducibility. Width variation of the gate electrodes GE may be minimized and/or reduced.

According to example embodiments including methods of fabricating semiconductor devices, the lower dopant regions 145 may be formed after formation of the gate dielectric layer 115 and the gate conductive layer 120. The thermal budget with respect to the lower dopant regions 145 may be minimized and/or reduced. For example, the gate dielectric layer 115 may be formed using a thermal oxidation process. In this case, the lower dopant regions 145 may be free from a heat budget during formation of the gate dielectric layer 115 (e.g., the lower dopant regions 145 may not yet exist). As a result, diffusion of impurities into the lower dopant regions 145 may be significantly suppressed and/or reduced.

According to at least one example embodiment, each of the lower dopant regions 145 may be in contact with one sidewall of the respective active pillars ACT and may be horizontally spaced apart from the other sidewall of the respective active pillars ACT. The channel bodies in the active pillars ACT may be electrically connected to the substrate 100 through the portions of the active pillars ACT between the lower dopant regions 145 and the other sidewalls of the active pillars ACT. As a result, the channel bodies may be prevented from being electrically floated or a floating body effect may be reduced.

FIG. 15A is a perspective diagram illustrating semiconductor devices according to some example embodiments of the inventive concepts. FIG. 15B is a cross-sectional view taken along lines 15B-I-15B-I', 15B-II-15B-II', 15B-III-15B-III' and 15B-IV-15B-IV' of FIG. 15A. Semiconductor device according to example embodiments may be described with reference to FIGS. 15A and 15B. The structural features of the semiconductor device according to some example embodiments may include features described with reference to FIGS. 2A-14B.

Referring to FIGS. 15A and 15B, a plurality of active pillars ACT may be on a substrate 100. A configuration of each of the active pillars ACT may be a configuration in which the active pillars ACT upwardly protrude from the substrate 100. The active pillars ACT may be two dimensionally arrayed along rows and columns in a plan view. The rows may be parallel to a first direction and the columns may be parallel to a second direction. The first and second directions may correspond to an x-axis direction and a y-axis direction in FIG. 15A, respectively. The active pillars ACT may be defined by first trenches 110 in parallel and extending in the first direction, and second trenches 125 in parallel and extending in the second direction to cross the first trenches 110.

Lower dopant regions 145 and upper dopant regions 165 may be disposed in lower portions and upper portions of the active pillars ACT, respectively. The lower dopant regions 145 may be vertically spaced apart from the upper dopant regions 165. Gate electrodes GE may be on one sidewall of each of the active pillars ACT, and a gate dielectric layer 115 may be between the gate electrodes GE and the active pillars ACT. Each of the gate electrodes GE may be between a pair of active pillars ACT which may be adjacent to each other in the second direction. A pair of vertical channel transistors including the pair of adjacent active pillars ACT may share any one of the gate electrodes GE. The gate electrodes GE in two adjacent columns may be arrayed in a zigzag pattern in the second direction. A plurality of buried dielectric patterns 112 may be disposed under the gate electrodes GE. Each of the buried dielectric patterns 112 may include an oxide material layer (e.g., formed by an oxidation process).

A plurality of plug dielectric patterns 137 may be under each of the second trenches 125. A plurality of buried interconnections 150 may be in interconnection trenches 140 under the second trenches 125. Each of the buried interconnections 150 may be in the substrate 100 and the plug dielectric patterns 137 which are located under the respective second trenches 125. Each of the interconnection trenches 140 may correspond to a region where the substrate 100 and the plug dielectric patterns 137 under the second trench 125 are etched. The buried interconnections 150 may extend in the second direction.

A pair of active pillars ACT arrayed in the second direction may be between the pair of adjacent buried interconnections 150, and one of the gate electrodes GE may be between the pair of active pillars ACT. In this case, one of the pair of adjacent buried interconnections 150 may be electrically connected to the lower dopant region 145 of one of the pair of active pillars ACT, and the other of the pair of adjacent buried interconnections 150 may be electrically connected to the lower dopant region 145 of another of pair of active pillars ACT.

Separation dopant regions 147 may be under portions of each of the buried interconnections 150. One of the separation dopant regions 147 may be under the pair of adjacent lower dopant regions 145. The buried interconnections 150 may be electrically isolated from the substrate 100 due to the presence of the lower dopant regions 145 and the separation dopant regions 147. The pair of adjacent lower dopant regions 145 contacting both sidewalls of the respective buried interconnections 150 may be electrically connected to each other through the separation dopant region 147 between the pair of adjacent lower dopant regions 145. The lower dopant regions 145 may be the same conductivity type as the separation dopant regions 147.

According to at least one example embodiment, each of the lower dopant regions 145 may be horizontally spaced apart from another sidewall of the respective active pillars ACT. For example, first and second sidewalls of the respective active pillars ACT may extend in the second direction and face each other. Each of the lower dopant regions 145 may be in contact with the first sidewall of the respective active pillars ACT and may be horizontally spaced apart from the second sidewall of the respective active pillars ACT. A channel body between the lower dopant region 145 and the upper dopant region 165 may be electrically connected to the substrate 100 through a portion of the active pillar ACT between the lower dopant region 145 and the second sidewall of the active pillar ACT.

The channel body may be prevented from being electrically floated and/or a floating body effect may be reduced. The gate electrode GE may be on the one sidewall of the respective active pillars ACT. One sidewall of the respective active pillars ACT may extend in the first direction. The one sidewall of the respective active pillars ACT, which the gate electrode GE is on, may be perpendicular to the first and second sidewalls of the respective active pillars ACT.

First filling dielectric patterns 153a may fill the second trenches 125. Second filling dielectric patterns 155a may fill regions between the active pillars ACT which are adjacent to each other in the second direction. The regions may correspond to empty spaces where the gate electrodes GE are not formed. Each column with the active pillars ACT arrayed in the second direction may include the gate electrodes GE and the second filling dielectric patterns 155a. In each column, the gate electrodes GE and the second filling dielectric patterns 155a may be alternately and repeatedly arrayed in the second direction. Word lines WL may be on the gate electrodes GE. The word lines WL may cross over the buried interconnections 150. The gate electrodes GE arrayed in one row may be electrically connected to each other through one of the word lines WL.

A plurality of data storage elements DS may be electrically connected to the upper dopant regions 165. The data storage elements DS may be electrically connected to the upper dopant regions 165 through contact plugs 169. According to at least one example embodiment, each of the data storage elements DS may include a capacitor. For example, each of the data storage elements DS may include a first electrode 170, a second electrode 175 and a capacitor dielectric layer (not shown) between the first and second electrodes 170 and 175.

The data storage elements DS are not limited to capacitors. The data storage elements DS may be realized in different forms. According to at least one example embodiment, each of the data storage elements DS may include a phase change material. The phase change material may be transformed into one of a plurality of states with different resistivity values. The phase change material, for example, may include at least one of tellurium and selenium which correspond to chalcogenide elements. According to at least one example embodiment, each of the data storage elements DS may include a magnetic tunnel junction (MTJ) pattern. According to at least one example embodiment, each of the data storage elements DS may include a variable resistor whose electrical resistance varies according to the presence or absence of filaments. For example, each of the data storage elements DS may include a transition metal oxide material.

Figure 16A:
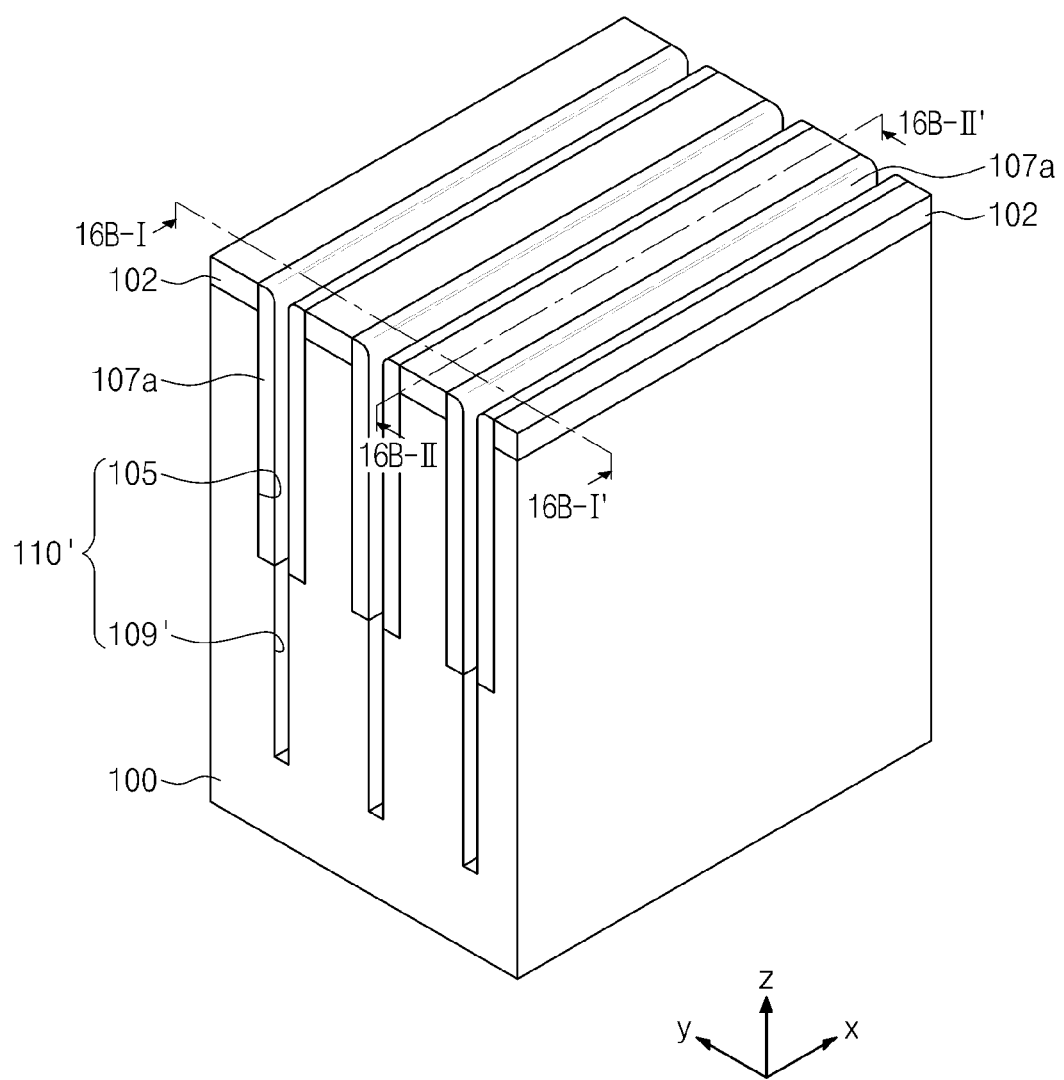
Figure 16B:
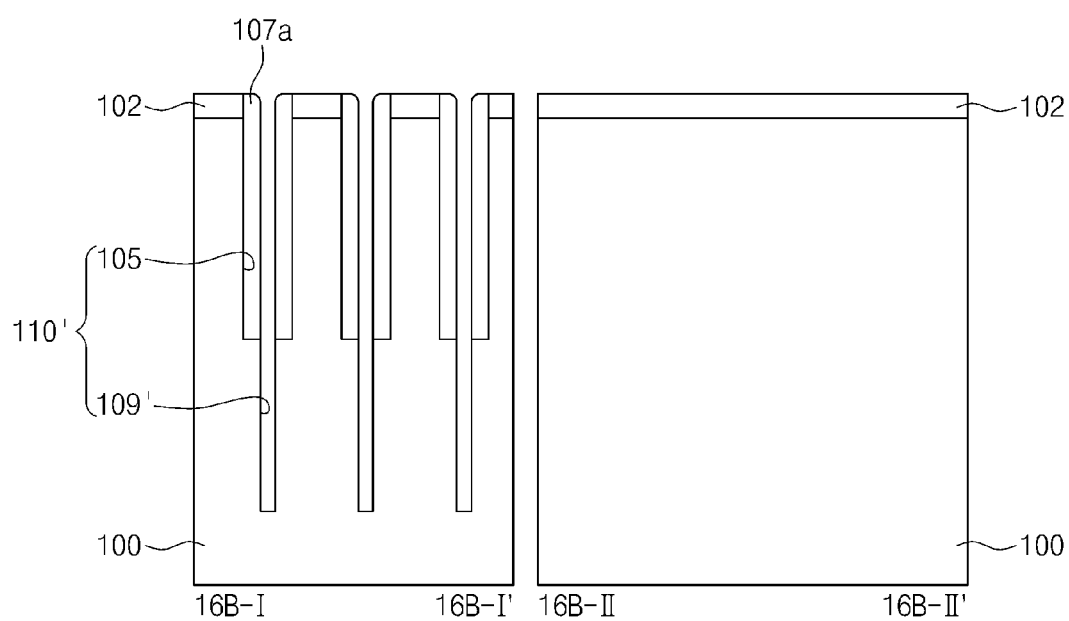
Figure 17A:
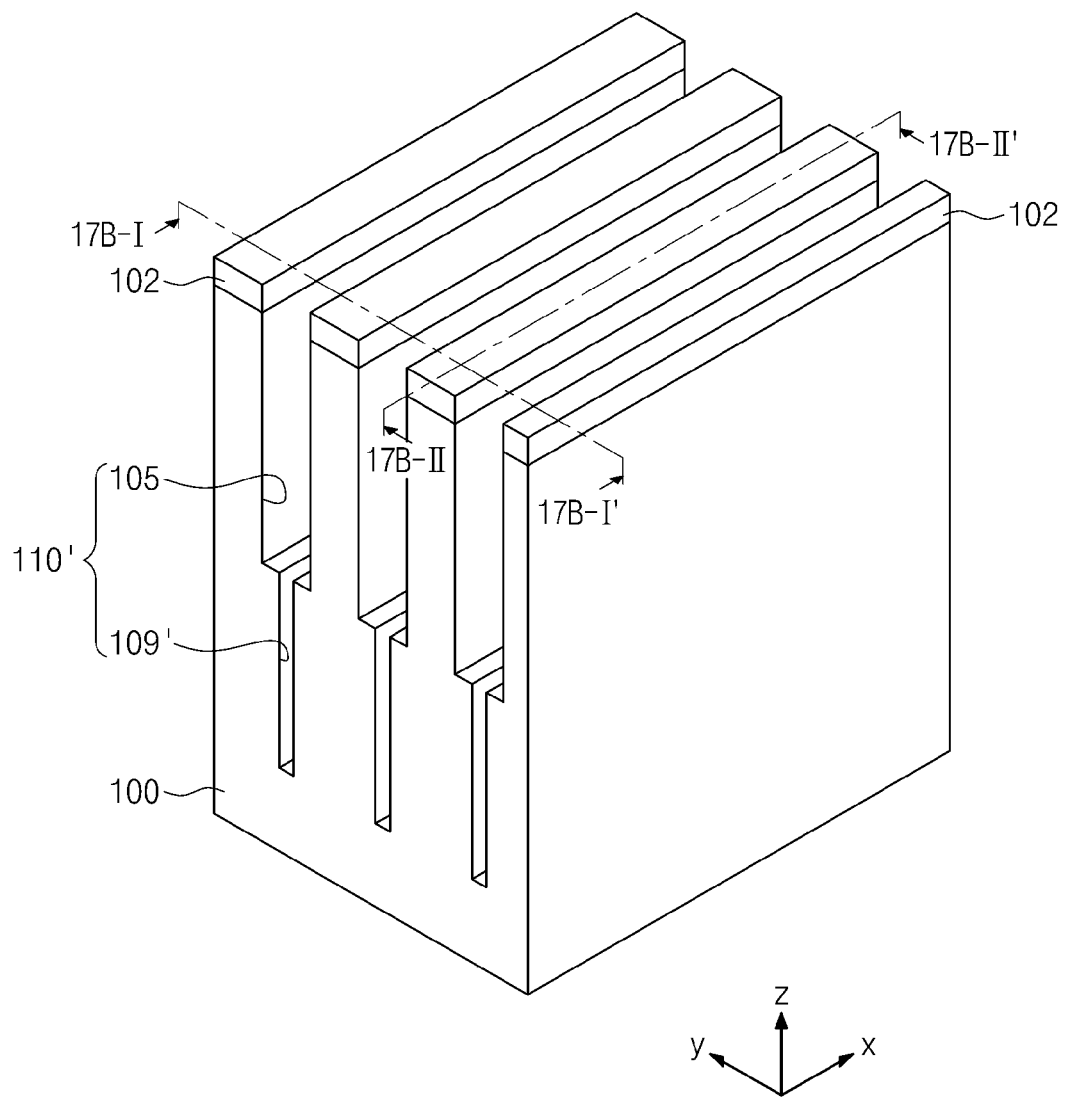
Figure 17B:
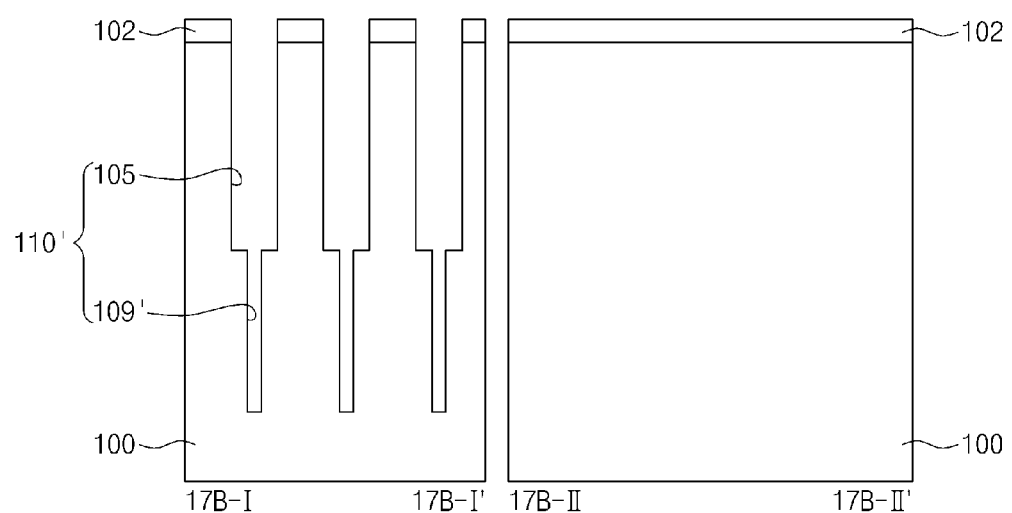
Figure 18A:
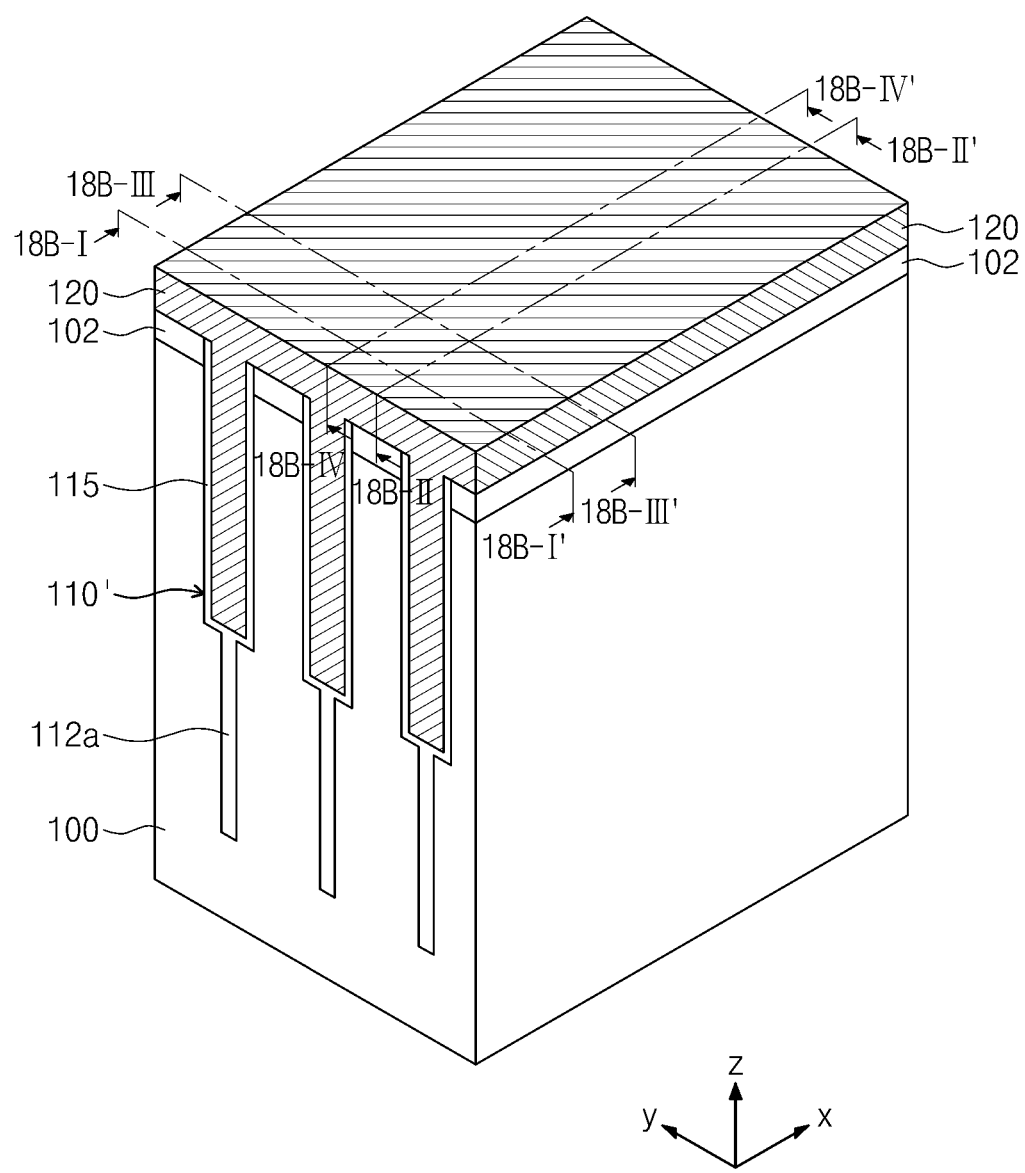
Figure 18B:
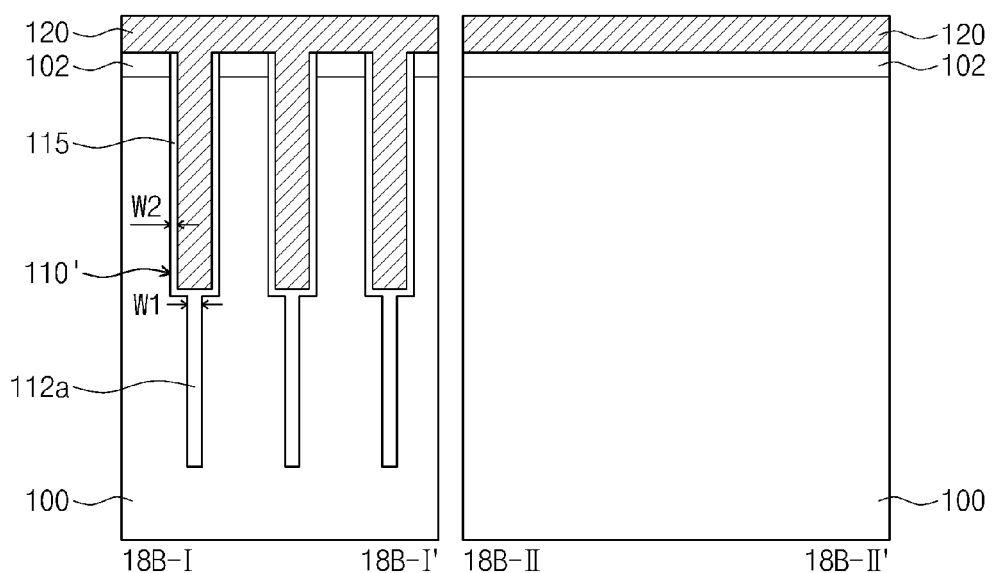
Figure 18B:
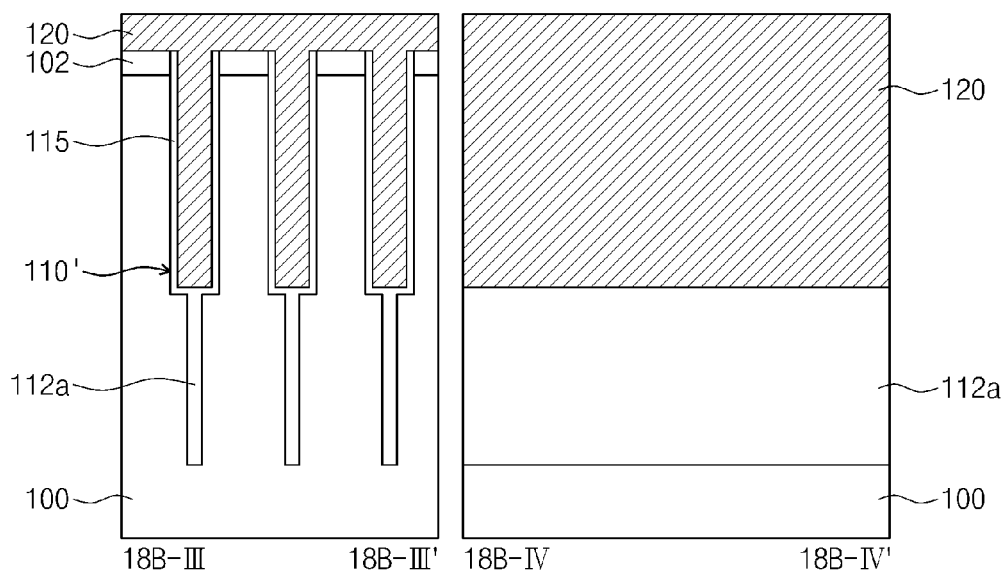

FIGS. 16A, 17A and 18A are perspective diagrams illustrating methods of fabricating semiconductor devices according to other example embodiments of the inventive concepts. FIGS. 16B, 17B and 18B include cross-sectional diagrams of FIGS. 16A, 17A and 18A, respectively. Methods of fabricating a semiconductor device according to example embodiments illustrated in FIGS. 16A-18B may be similar to example embodiments described with reference to FIGS. 2A-15B. The same components as described in the first embodiment may be indicated by the same reference numerals. For the purpose of ease and convenience in explanation, the descriptions to the same components as in the first embodiment may be omitted or briefly mentioned.

Referring to FIGS. 16A and 16B, hard mask patterns 102 may be in parallel and formed on a substrate 100. The hard mask patterns 102 may be formed to extend in a first direction. The substrate 100 may be etched using the hard mask patterns 102 as etch masks, forming upper trenches 105. Sacrificial spacers 107a may be formed on inner sidewalls of the upper trenches 105, respectively. A width of the sacrificial spacers 107a may be greater than the width of the sacrificial spacers 107 described with respect to FIGS. 2A-15B. The upper trenches 105 may extend in the first direction. The upper trenches 105 may be separated from each other in a second direction perpendicular to the first direction. The first direction and the second direction may correspond to the x-axis direction and the y-axis direction of FIG. 16A, respectively.

The substrate 100 under the upper trenches 105 may be etched using the hard mask patterns 102 and the sacrificial spacers 107a, thereby forming lower trenches 109' under the upper trenches 105. A width of the lower trenches 109' may be less than that of the lower trenches 109 described with respect to FIGS. 2A-15B. The lower trench 109' and the upper trench 105, which are vertically aligned, may constitute a single first trench 110'. Referring to FIGS. 17A and 17B, the sacrificial spacers 107a may be removed. All inner walls of the upper trenches 105 and the lower trenches 109' may be exposed.

Referring to FIGS. 18A and 18B, an oxidation process may be applied to the substrate where the sacrificial spacers 107a are removed. Buried dielectric patterns 112a filling lower regions of the first trenches 110' may be formed. While the buried dielectric patterns 112a are formed, gate dielectric layer 115 may be formed on inner sidewalls of upper regions of the first trenches 110'. The buried dielectric patterns 112a and the gate dielectric layer 115 may be simultaneously formed during the oxidation process. A width W1 of the upper portions of the buried dielectric patterns 112a may be in the second direction.

The width W1 of the buried dielectric patterns 112a may be equal to or less than twice a width W2 of the gate dielectric layer 115. The buried dielectric patterns 112a may completely fill the lower regions of the first trenches 110'. The oxidation process may be, for example, a thermal oxidation process. A gate conductive layer 120 filling the first trenches 110' may be formed on the substrate including the gate dielectric layer 115 and the buried dielectric patterns 112a. Subsequent processing may be performed by, for example, using the same or similar methods as described with reference to FIGS. 5A-15B.

The buried dielectric patterns 112a and the gate dielectric layer 115 may be simultaneously formed using a single step of an oxidation process. The fabrication process of the semiconductor device may be simplified. A heat budget of the semiconductor device may be minimized and/or reduced to realize a high and/or improved reliability semiconductor device.

Figure 19A:
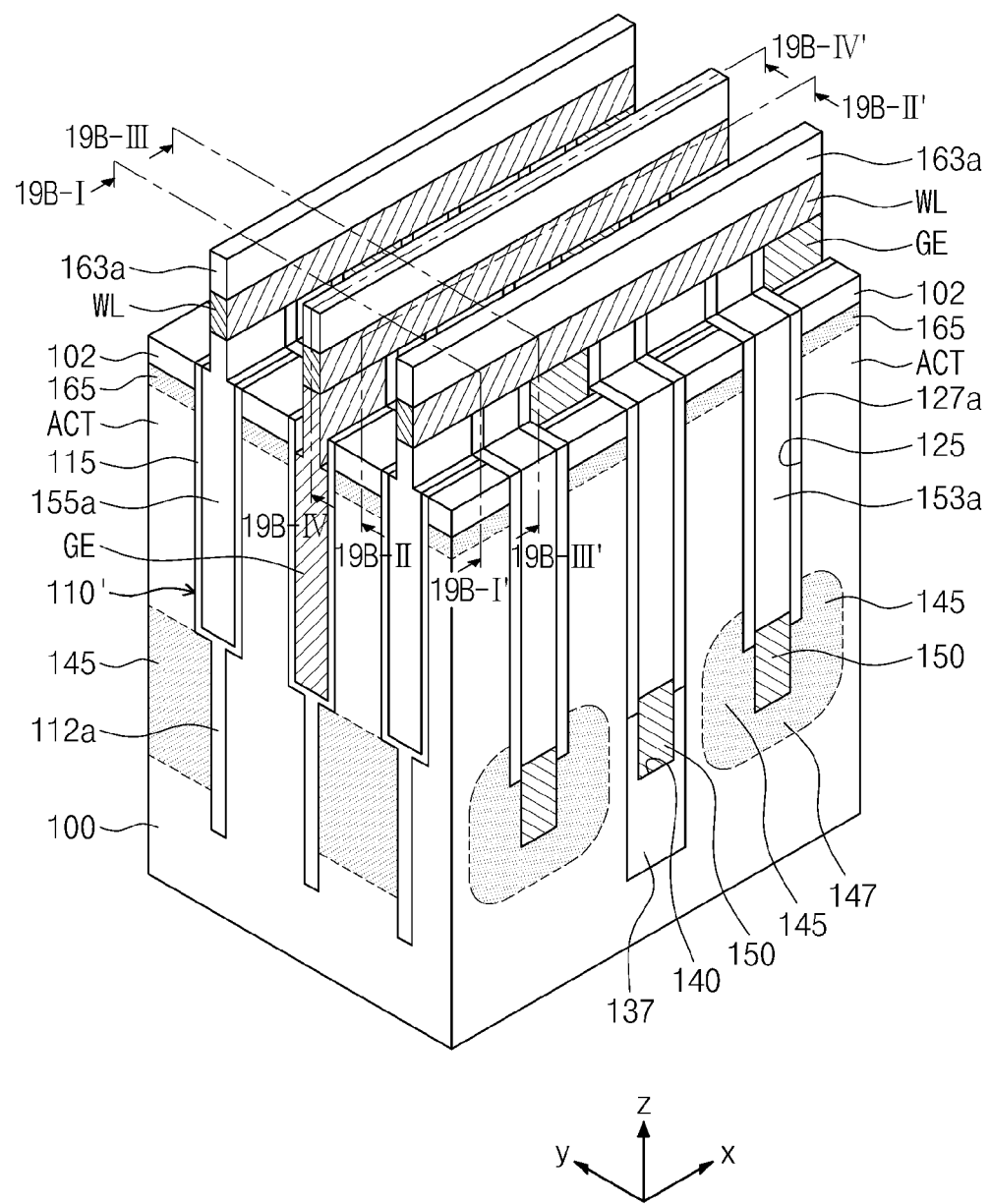
FIGS. 19A and 19B include a perspective diagram and cross-sectional views illustrating semiconductor devices according to still other example embodiments of the inventive concepts.
Figure 19B:
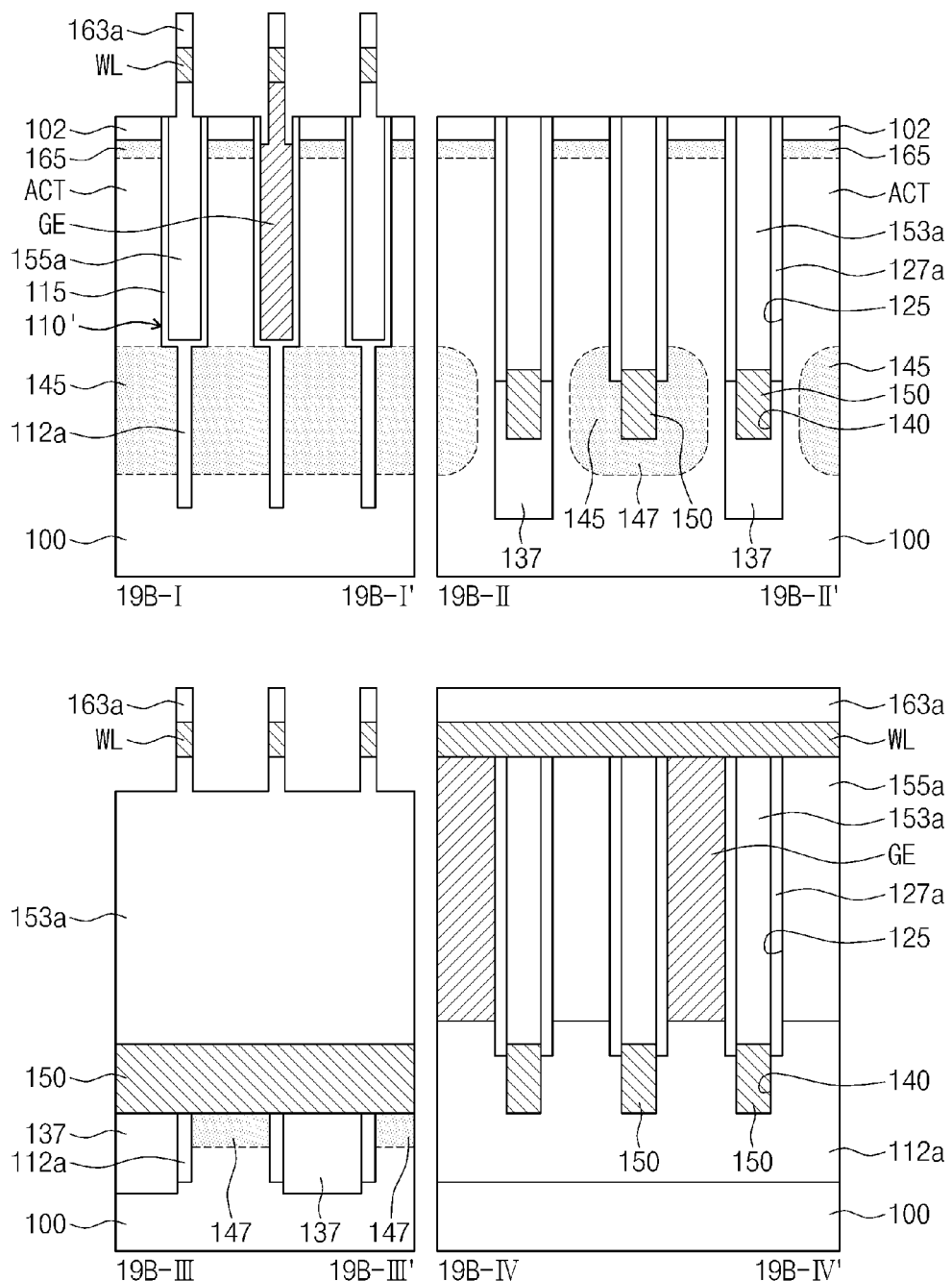

FIG. 19A is a perspective diagram illustrating semiconductor devices according to still other example embodiments of the inventive concepts. FIG. 19B includes cross-sectional diagrams of FIG. 19A. Referring to FIGS. 19A and 19B, word lines WL extending in a first direction may be connected to upper portions of the gate electrodes GE. A gate dielectric layer 115 may be between the gate electrodes GE and the active pillars ACT. Buried dielectric patterns 112a may be under the gate electrodes GE. A width of the buried dielectric patterns 112a may be equal to or less than twice a thickness of a width of the gate dielectric layer 115. The second direction may be perpendicular to the first direction. The buried dielectric patterns 112a may be formed of the same dielectric layer as the gate dielectric layer 115. For example, the buried dielectric patterns 112a and the gate dielectric layer 115 may be formed of an oxide material layer. The buried dielectric patterns 112a and the gate dielectric layer 115 may include an oxide material layer which is formed using an oxidation process.

According to at least one example embodiment, the width of the buried dielectric patterns 112a may be less than a width of the gate electrodes GE. A width of lower portions of the active pillars ACT in the second direction may be greater than a width of upper portions of the active pillars ACT in the second direction. Each of the gate electrodes GE may be on one sidewall the upper portion of each of the active pillars ACT. The semiconductor device illustrated in FIGS. 19A and 19B may include gate spacers 167 and data storage elements DS described with reference to FIGS. 15A and 15B. In FIGS. 19A and 19B, the gate spacers and the data storage elements are omitted for ease and convenience of explanation.

Figure 20A:
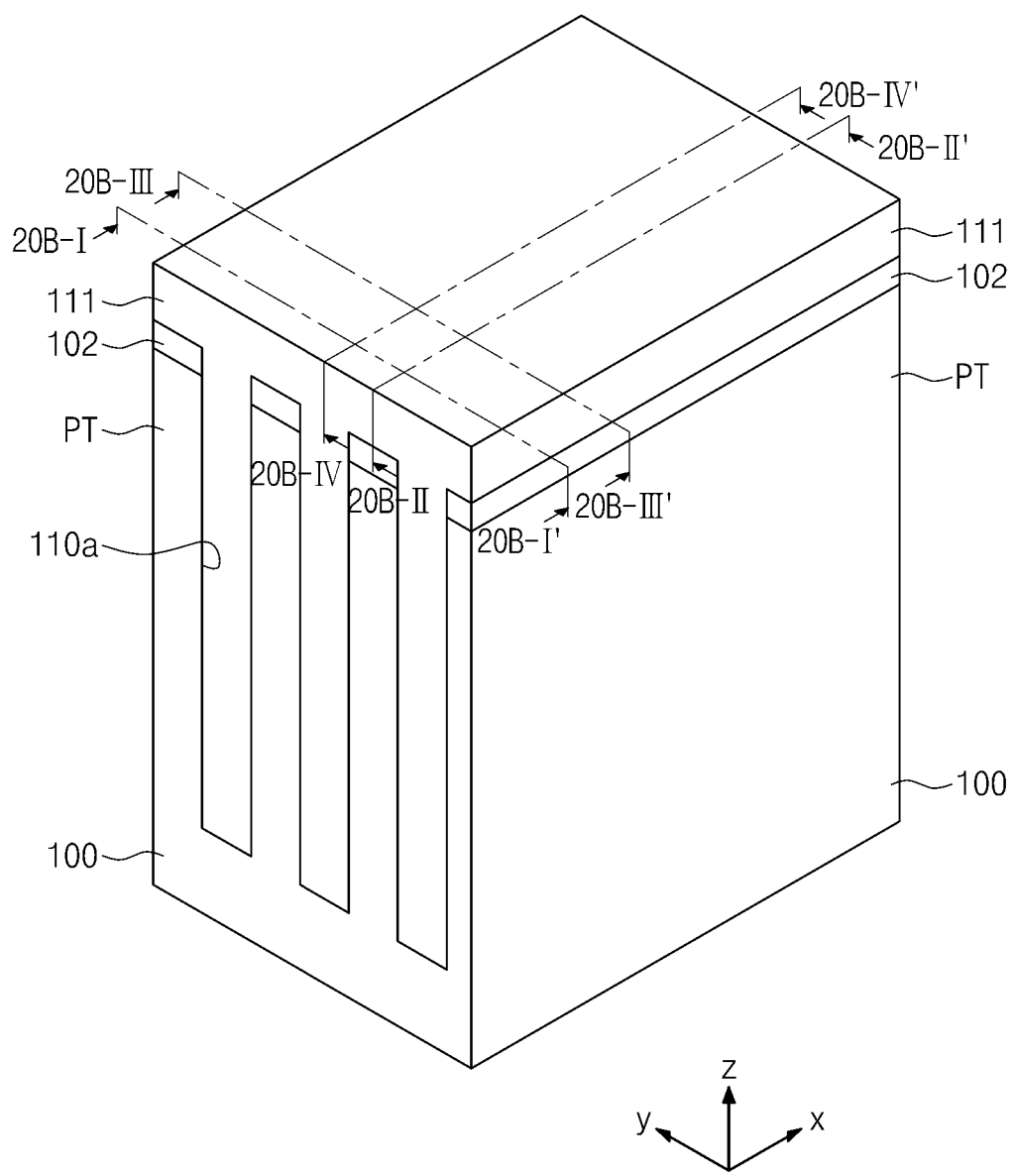
Figure 20B:
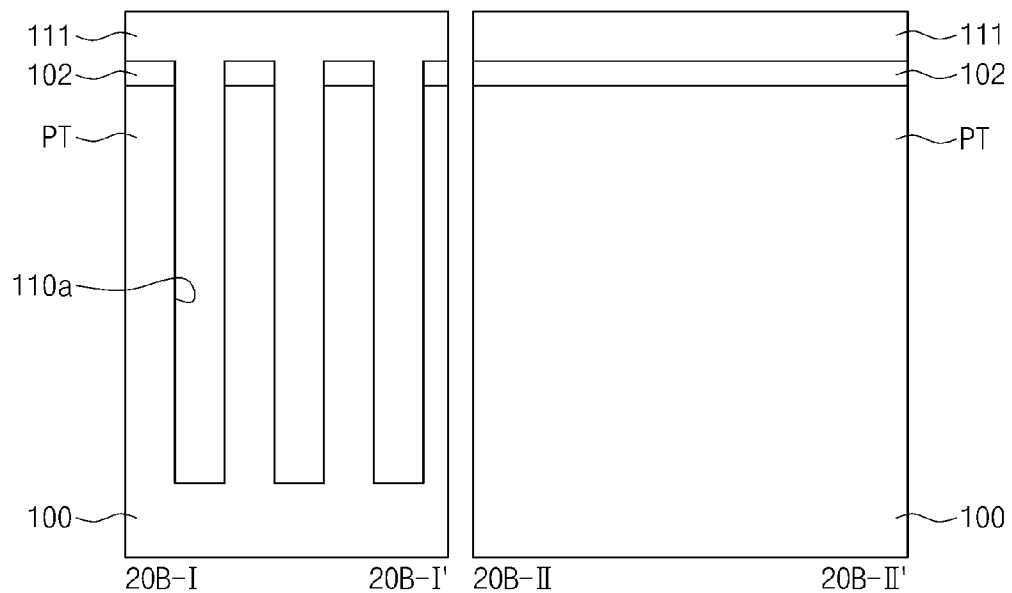
Figure 20B:
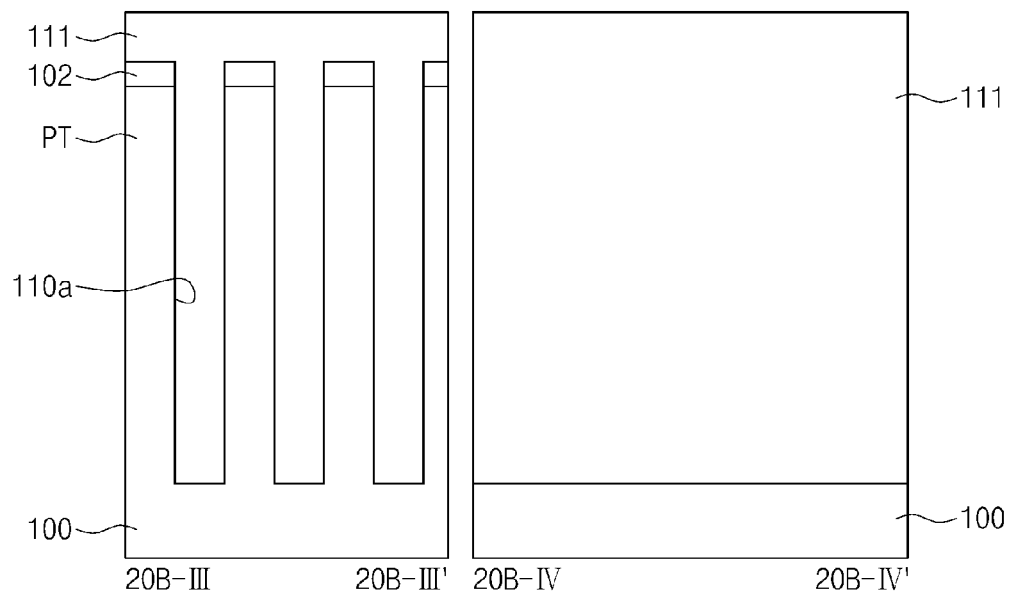
Figure 21A:
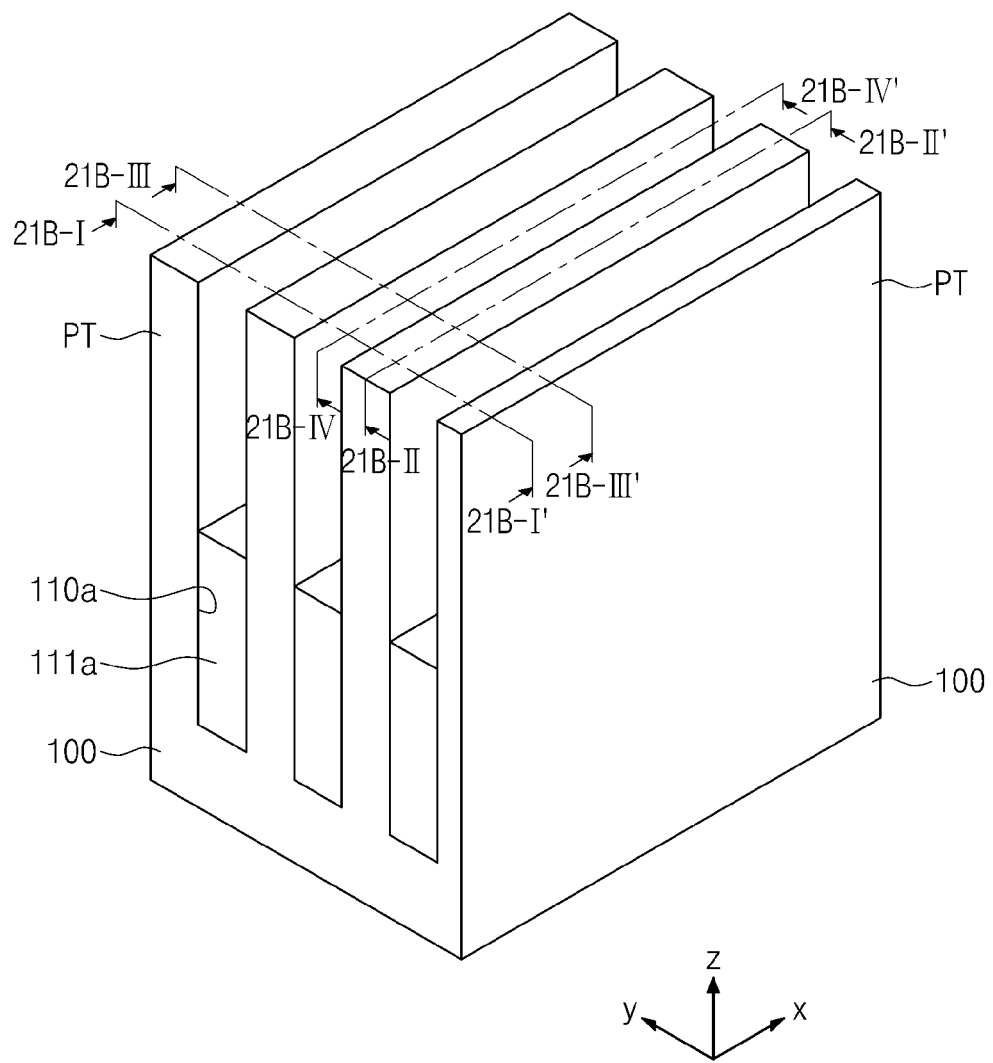
Figure 21B:
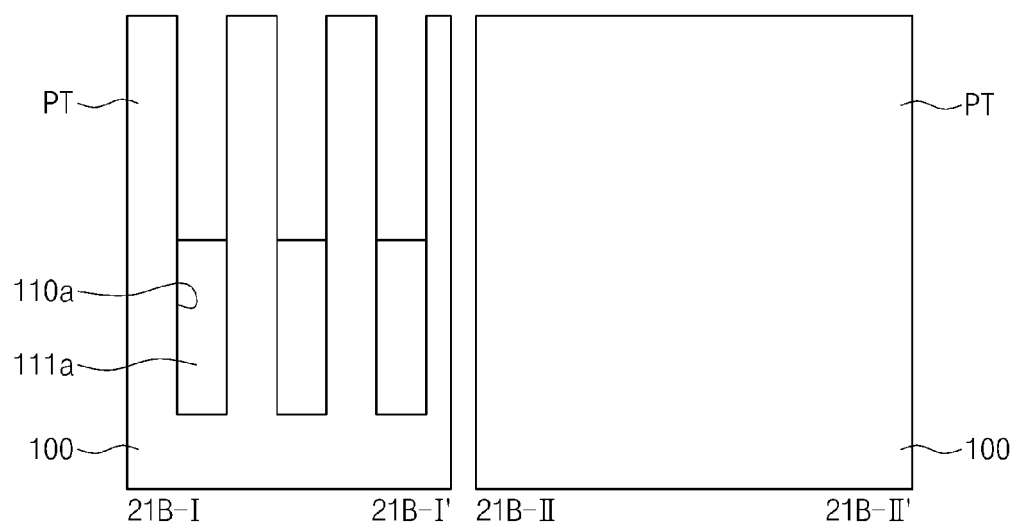
Figure 21B:
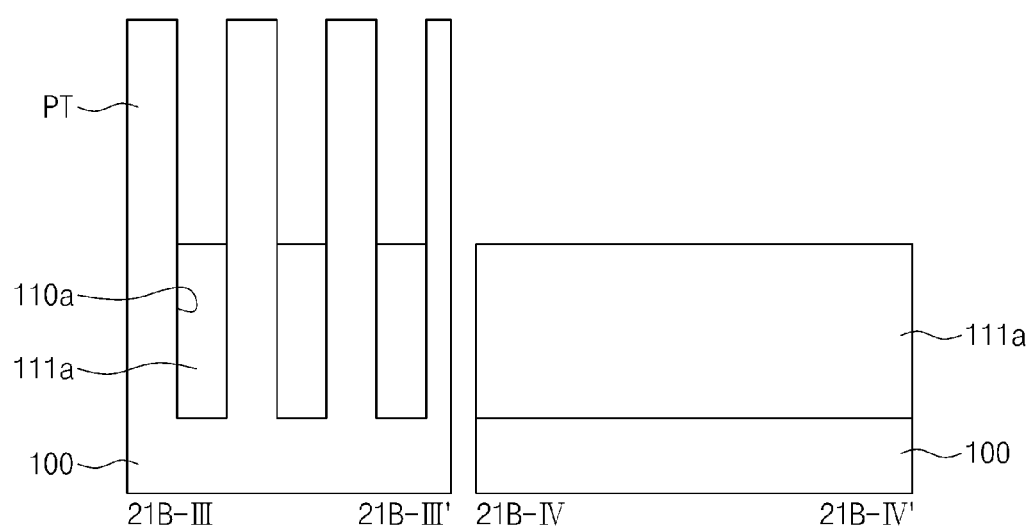
Figure 22A:
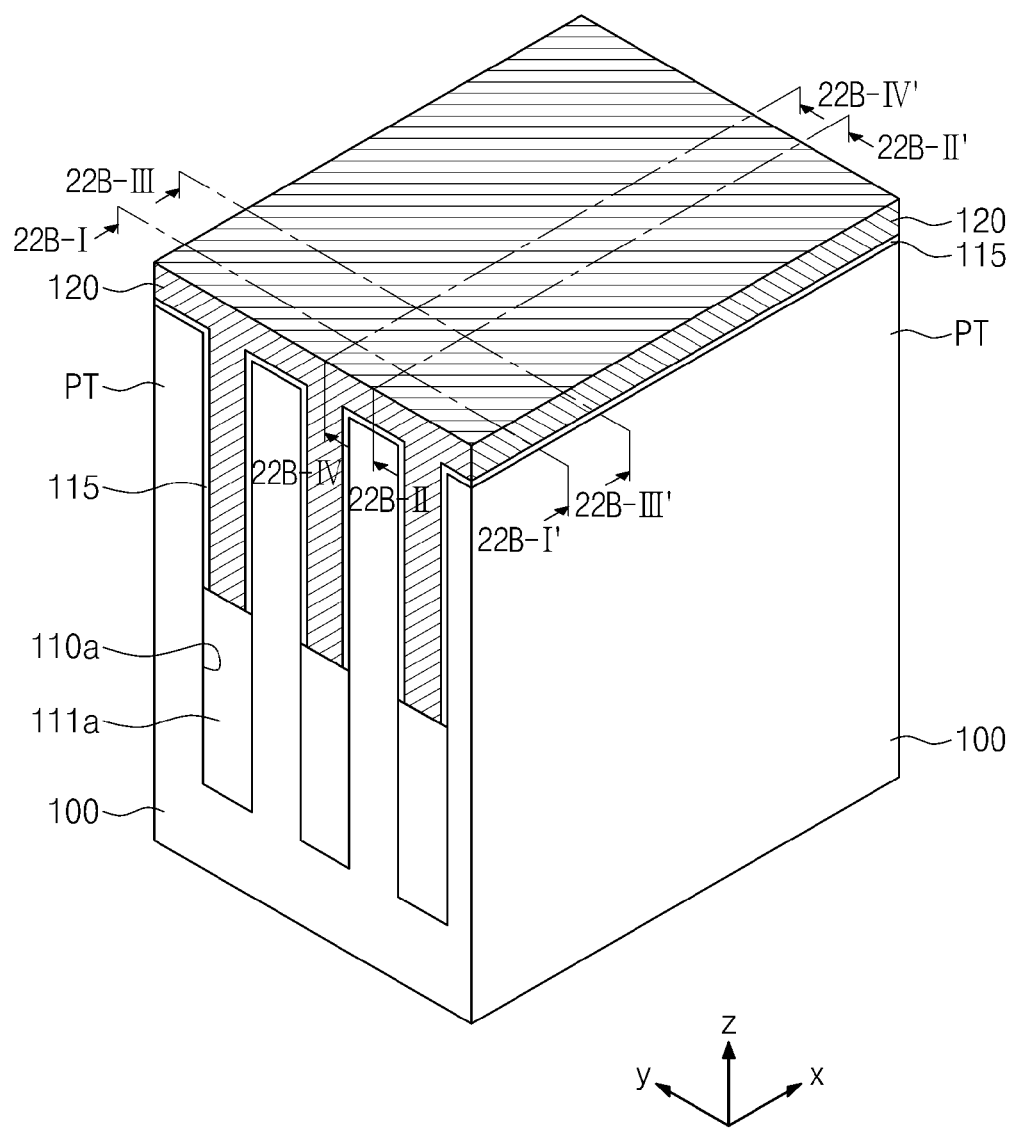
Figure 22B:
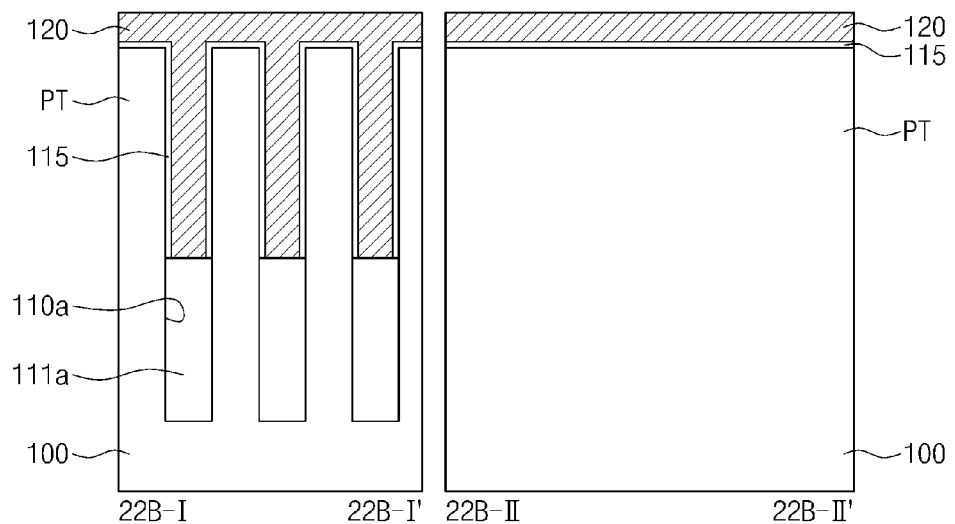
Figure 22B:
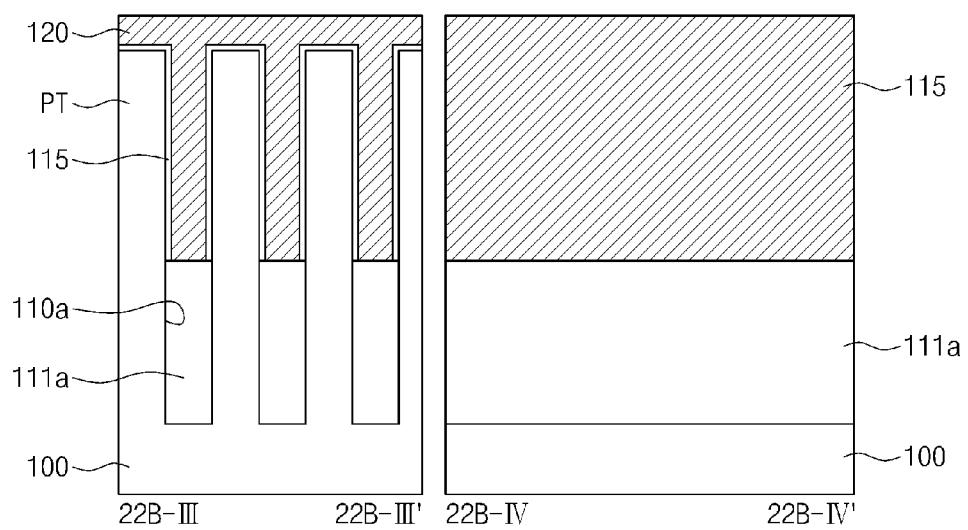

FIGS. 20A, 21A and 22A are perspective diagrams illustrating methods of fabricating semiconductor devices according to yet still other example embodiments of the inventive concepts. FIGS. 20B, 21B and 22B include cross-sectional diagrams of FIGS. 20A, 21A and 22A, respectively. The same components as described with reference to FIGS. 2A-19B may be indicated by the same reference numerals. Referring to FIGS. 20A and 20B, hard mask patterns 102 may be in parallel and formed on a substrate 100. The hard mask patterns 102 may be formed to extend in a first direction. The substrate 100 may be etched using the hard mask patterns 102 as etch masks, forming first trenches 110a which define a plurality of fin patterns PT. The fin patterns PT and the first trenches 110a may extend in parallel with the first direction.

The fin patterns PT and the first trenches 110a may be alternately and repeatedly arrayed in a second direction crossing the first direction.

A buried dielectric layer 111 filling the first trenches 110a may be formed on the substrate including the first trenches 110a. The buried dielectric layer 111 may be formed of a single-layered material layer or a multi-layered material layer. For example, the buried dielectric layer 111 may be formed of an oxide layer, a nitride layer and/or an oxynitride layer. According to at least one example embodiment, the buried dielectric layer 111 may include an oxide layer. The buried dielectric layer 111 may be deposited using, for example, a chemical vapor deposition (CVD) process and/or an atomic layer deposition (ALD) process.

Referring to FIGS. 21A and 21B, the buried dielectric layer 111 may be etched to form buried dielectric patterns 111a in the first trenches 110a. The buried dielectric patterns 111a may fill lower regions of the first trenches 110a. Upper regions of the first trenches 110a may be empty spaces after formation of the buried dielectric patterns 111a. The buried dielectric layer 111 may be etched using, for example, an etch-back process. According to at least one example embodiment, the buried dielectric layer 111 may be etched using, for example, a wet etch process. According to at least one example embodiment, while the buried dielectric layer 111 is etched, the hard mask patterns 102 may be removed to expose top surfaces of the fin patterns PT.

Referring to FIGS. 22A and 22b, a gate dielectric layer 115 may be formed on inner sidewalls of the upper regions of the first trenches 110a. The gate dielectric layer 115 may be formed using, for example, an oxidation process (e.g., a thermal oxidation process). A gate conductive layer 120 may be formed to fill the first trenches 110a. Subsequent processes may be performed using the same or similar methods as described with reference to FIGS. 5A-15B.

According to at least one embodiment, in the event that the top surfaces of the fin patterns PT are exposed, the gate dielectric layer 115 may be formed on not only the inner sidewalls of the upper regions of the first trenches 110a but also the top surfaces of the fin patterns PT.

Figure 23A:
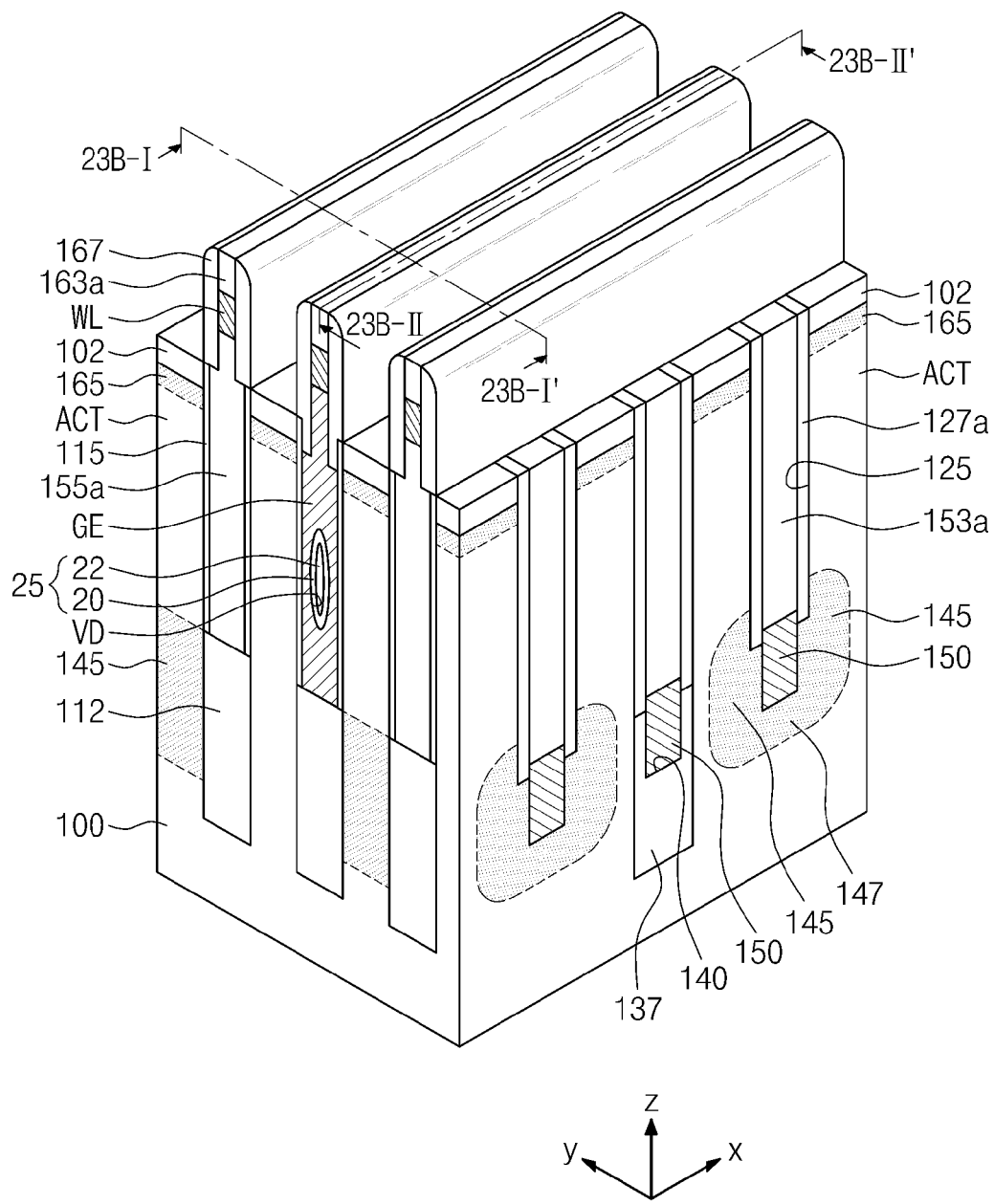
FIGS. 23A and 23B include a perspective diagram and cross-sectional views illustrating semiconductor devices according to still yet other example embodiments of the inventive concepts.
Figure 23B:
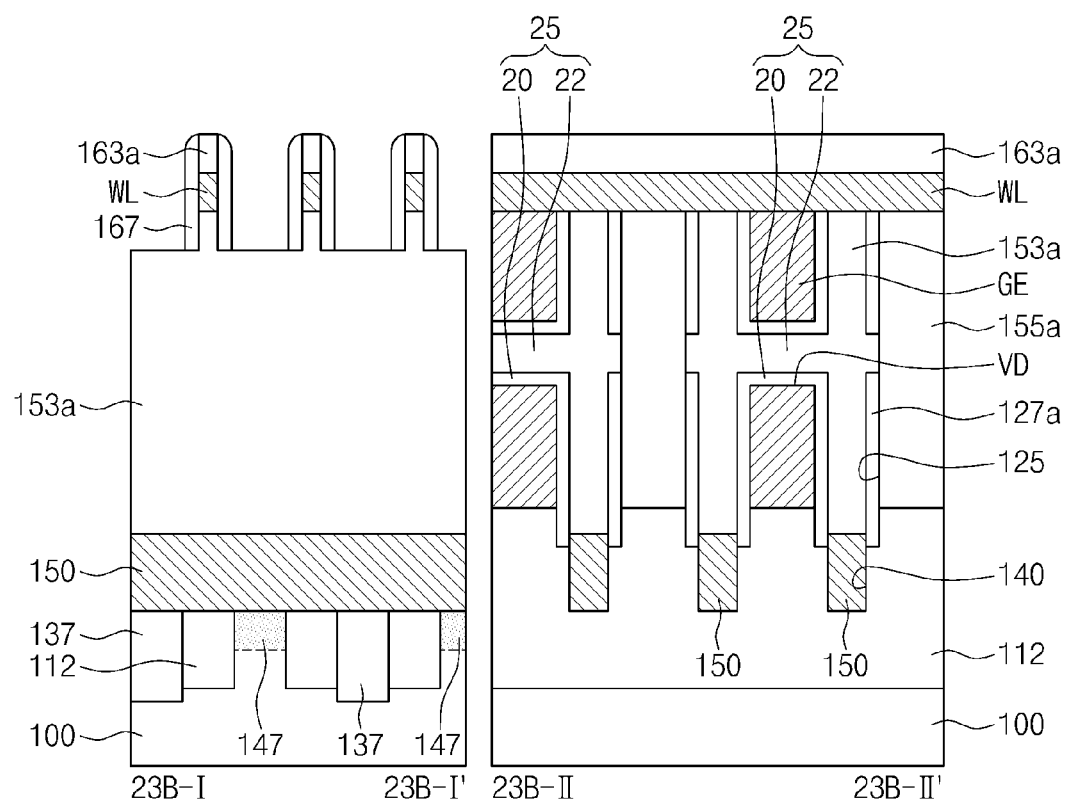

FIG. 23A is a perspective diagram illustrating semiconductor devices according to still yet other example embodiments of the inventive concepts. FIG. 23B includes cross-sectional diagrams of FIG. 23A. Referring to FIGS. 23A and 23B, a void VD may be formed inside at least one of the gate electrodes GE. In this case, at least a portion of the void VD may be filled with a void-filling dielectric pattern 25. According to at least one example embodiment, the void-filling dielectric pattern 25 may include a first portion 20 and a second portion 22. The first portion 20 of the void-filling dielectric pattern 25 may include the same material as the sidewall spacers 127a which are on the inner sidewalls of the second trenches 125.

The second portion 22 of the void-filling dielectric pattern 25 may include the same material as the first filling dielectric patterns 153a filling the second trenches 125. However, example embodiments are not so limited. For example, the void-filling dielectric pattern 25 may include only the first portion 20. In the event that the void-filling dielectric pattern 25 includes only the first portion 20, the first portion 20 of the void-filling dielectric pattern 25 may include the same material as at least a portion of the sidewall spacer 127a.

For example, when the gate conductive layer 120 of FIGS. 5A and 5B are formed, the void VD may be formed inside the gate conductive layer 120 in the first trenches 110. In this case, after formation of the second trenches 125 illustrated in FIGS. 6A and 6B, the void VD may be exposed by the second trenches 125. The void VD may be filled with the oxidation preventing layer 127 of FIGS. 7A and 7B. According to at least one example embodiment, the void VD may be filled with the oxidation preventing layer 127 of FIGS. 7A and 7B as well as the first filling dielectric layer 153 of FIGS. 11A and 11B. The first portion 20 of the void-filling dielectric pattern 25 may include the same material as the sidewall spacers 127a, and the second portion 22 may include the same material as the first filling dielectric patterns 153a.

According to at least one example embodiment, when at least one of the gate electrodes GE include the void VD, the void VD may be partially or completely filled with the void-filling dielectric pattern 25. Even though the void VD is formed, the void-filling dielectric pattern 25 in the void VD may suppress and/or reduce movement of the void VD. As a result, high and/or improved reliability semiconductor devices may be realized.

The semiconductor devices disclosed with respect to FIGS. 1-23B may be encapsulated using various packaging techniques. For example, the semiconductor devices according to example embodiments may be encapsulated using a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and/or a wafer-level processed stack package (WSP) technique. The package according to example embodiments may include a controller and/or a logic device which controls the semiconductor device.

Figure 24:
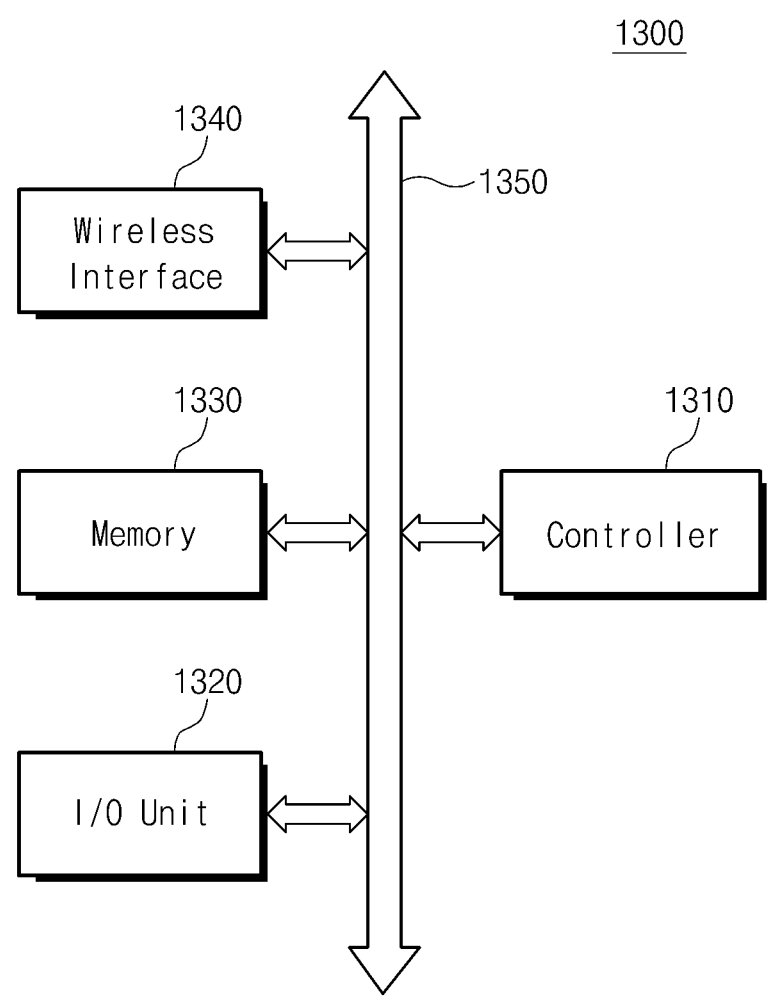

FIG. 24 is a schematic block diagram illustrating electronic products including semiconductor devices according to example embodiments of the inventive concepts. Referring to FIG. 24, an electronic product 1300 according to example embodiments may include a personal digital assistant (PDA), a laptop computer, a portable computer, a web tablet, a wireless telephone, a mobile phone, a digital music player, and/or a wireless and/or cable electronic equipment. The electronic product 1300 may include a controller 1310, an input/output (I/O) unit 1320, a memory 1330 and a wireless interface 1340 which communicate with each other through the data bus 1350. The I/O unit 1320 may include, for example, a keypad, a keyboard and/or a display unit.

The controller 1310, for example, may include a microprocessor, a digital signal processor, a microcontroller and/or the like. The memory 1330 may store commands which are executed by the controller 1310. The memory 1330 may store user's data. The memory 1330 may include at least one of semiconductor devices with vertical channel transistors according to example embodiments of the inventive concepts, for example, as described with respect to FIGS. 1-23B. The electronic product 1300 may use the wireless interface 1340 to transmit electrical data to a wireless communication network that communicates using radio frequency (RF) signals and/or to receive electrical data from the wireless communication network. For example, the wireless interface 1340 may include an antenna and/or a wireless transceiver. The electronic product 1300 may be used in a communication interface protocol, for example, a third generation communication system. The third generation communication system may include CDMA, GSM, NADC, E-TDMA, WCDAM and/or CDMA2000.

Figure 25:
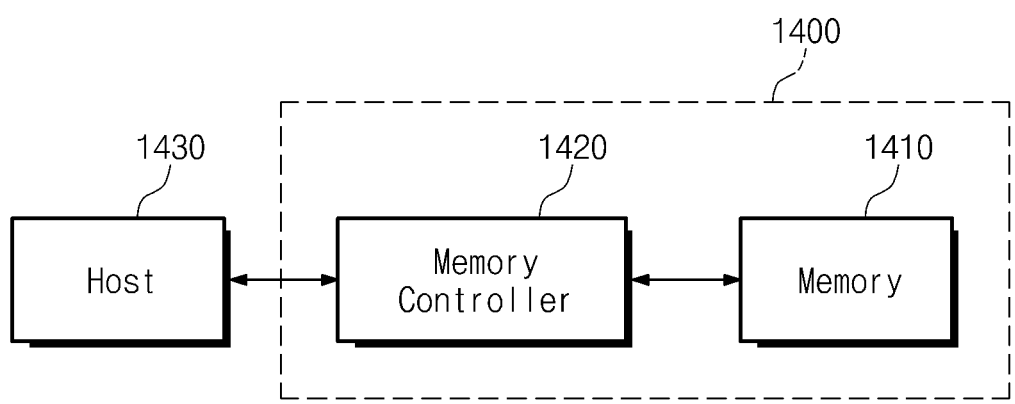

FIG. 25 is a schematic block diagram illustrating memory systems including semiconductor devices according to example embodiments of the inventive concepts. Referring to FIG. 25, semiconductor devices according to example embodiments may be used to realize a memory system 1400. The memory system 1400 may include a memory 1410 for storing large capacity data and a memory controller 1420. The memory controller 1420 may control the memory device 1410 to read out the data stored in the memory device 1410 and/or write new data into the memory device 1410 in response to signals from the host 1430.

The memory controller 1420 may generate address mapping tables to transform addresses provided by the host 1430, a mobile device and/or a computer system into a physical address of the memory device 1410. The memory device 1410 may include at least one of semiconductor devices with vertical channel transistors according to example embodiments of the inventive concepts, for example, as described with respect to FIGS. 1-23B.

While example embodiments have been particularly shown and described, it will be understood by one of ordinary skill in the art that variations in form and detail may be made therein without departing from the spirit and scope of the claims.

What is claimed is:

1. A method of fabricating a semiconductor device, the method comprising:
   forming at least one fin pattern by forming a plurality of first trenches extending in parallel in a substrate;
   forming a plurality of buried dielectric patterns filling lower regions of the first trenches;
   forming a gate dielectric layer on upper sidewalls inside the first trenches;
   forming a gate conductive layer filling the first trenches on the substrate after the forming a gate dielectric layer, the forming the gate conductive layer includes forming the gate conductive layer directly on upper surfaces of the plurality of buried dielectric patterns, respectively; and
   forming a plurality of active pillars by patterning the gate conductive layer, the gate dielectric layer and the fin pattern to form second trenches crossing the first trenches.

2. The method of claim 1, wherein the forming a plurality of buried dielectric patterns includes an oxidation process.

3. The method of claim 2, wherein the forming at least one fin pattern and the forming a plurality of buried dielectric patterns includes:
   forming a plurality of upper trenches in the substrate;
   forming a plurality of sacrificial spacers on sidewalls inside the upper trenches;
   etching the substrate through the upper trenches using the sacrificial spacers as etch masks such that a plurality of lower trenches are formed; and
   oxidizing the substrate through the lower trenches to form the buried dielectric patterns using the oxidation process.

4. The method of claim 3, wherein:
   the forming a plurality of buried dielectric patterns includes removing the sacrificial spacers after the oxidation process; and
   the forming a gate dielectric layer includes forming the gate dielectric layer after the removing of the sacrificial spacers.

5. The method of claim 3, wherein:
the forming a plurality of buried dielectric patterns includes removing the sacrificial spacers prior to the forming a plurality of buried dielectric patterns; and
the forming a gate dielectric layer and the forming a plurality of buried dielectric patterns include forming the gate dielectric layer and the buried dielectric patterns simultaneously.

6. The method of claim 1, wherein the forming a plurality of buried dielectric patterns includes:
depositing a dielectric layer on the substrate and filling the first trenches; and
etching the dielectric layer to form the buried dielectric patterns.

7. A method of forming an electronic product comprising the method of claim 1.

8. The method of claim 1, further comprising:
forming a plurality of word lines on the substrate over the plurality of first trenches, wherein
a lower surface of the plurality of word lines is at a height greater than an upper surface of the plurality of active pillars.

9. The method of claim 1, wherein
the forming the plurality of buried dielectric patterns includes forming the plurality of buried dielectric patterns directly on bottommost surfaces of the plurality of first trenches, respectively.

10. A method of fabricating a semiconductor device, the method comprising:
forming at least one fin pattern by forming a plurality of first trenches extending in parallel in a substrate;
forming a plurality of buried dielectric patterns filling lower regions of the first trenches;
forming a gate dielectric layer on upper sidewalls inside the first trenches;
forming a gate conductive layer filling the first trenches on the substrate after the forming a gate dielectric layer;
forming a plurality of active pillars by patterning the gate conductive layer, the gate dielectric layer and the fin pattern to form second trenches crossing the first trenches;
forming a plurality of plug dielectric patterns in portions of the substrate exposed by the second trenches;
etching the substrate, the buried dielectric patterns and the plug dielectric patterns through the second trenches to form a plurality of interconnection trenches;
forming a plurality of lower dopant regions such that one of the lower dopant regions is in a lower portion of each of the active pillars; and
forming a plurality of buried interconnections in the interconnection trenches, each of the plurality of lower dopant regions electrically connected to a corresponding one of the buried interconnections.

11. The method of claim 10, further comprising:
forming separation dopant regions in the substrate through the interconnection trenches simultaneously with the forming a plurality of lower dopant regions such that one of the separation dopant regions connects two of the lower dopant regions.

12. The method of claim 10, further comprising:
removing portions of a plurality of preliminary gate patterns from the first trenches to form a plurality of gate patterns separated from each other; and
forming a plurality of word lines extending in parallel in a same direction as the first trenches, each of the word lines electrically connected to each gate pattern in a row of the gate patterns extending in the same direction,
wherein the forming a plurality of active pillars includes forming the plurality of preliminary gate patterns between the second trenches during the formation of the second trenches.

13. The method of claim 12, further comprising:
forming upper dopant regions in upper portions of the active pillars and spaced apart from the lower dopant regions; and
forming data storage elements electrically connected to the upper dopant regions.

14. The method of claim 10, further comprising:
forming a plurality of word lines on the substrate over the plurality of first trenches, wherein
a lower surface of the plurality of word lines is at a height greater than an upper surface of the plurality of active pillars.

15. A method of fabricating a semiconductor device, the method comprising:
forming a semiconductor fin in a substrate layer, the forming the semiconductor fin including forming a plurality of first trenches in the substrate layer that extend in a first direction and are spaced apart from each other in a second direction crossing the first direction;
forming a gate dielectric layer on the semiconductor fin;
forming a gate conductive layer on the gate dielectric layer;
forming a plurality of active pillars by removing a portion of the semiconductor fin, the gate dielectric layer and the gate conductive layer, the forming the plurality of active pillars including forming a plurality of second trenches that are spaced apart in the first direction and extend in the second direction in the portion of the semiconductor fin, the gate dielectric layer and the gate conductive layer removed; and
forming source and drain regions in the active pillars, the forming source and drain regions including doping the active pillars such that one of the source and drain regions that is closest to a bulk of the substrate layer does not extend a width of the active pillars in the first direction.

16. The method of claim 15, further comprising:
forming a buried interconnection on a side of the active pillar and electrically separated from the bulk,
wherein first, second and third portions of the buried interconnection are electrically separated from the bulk by a doped region of the substrate layer, a first insulating layer and a second insulating layer, respectively, and
the doped region includes the one of the source and drain regions that is closest to the substrate layer.

17. The method of claim 15, further comprising:
forming at least one word line on the substrate, wherein
the at least one word line does not extend over the plurality of active pillars in a plan view, and
a lower surface of the at least one word line is at a height greater than an upper surface of the plurality of active pillars.

18. The method of claim 15, further comprising:
forming a plurality of buried dielectric patterns directly on bottommost surfaces of the plurality of first trenches, wherein
the forming the gate conductive layer includes forming the gate conductive layer directly on upper surfaces of the plurality of buried dielectric patterns, respectively.

* * * * *